(12) United States Patent
Kato et al.

(10) Patent No.: US 10,304,523 B2
(45) Date of Patent: May 28, 2019

(54) SEMICONDUCTOR DEVICE COMPRISING MEMORY DEVICES EACH COMPRISING SENSE AMPLIFIER AND MEMORY CELL

(71) Applicant: Semiconductor Energy Laboratory Co., Ltd., Atsugi-shi, Kanagawa-ken (JP)

(72) Inventors: Kiyoshi Kato, Kanagawa (JP); Tatsuya Onuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/705,698

(22) Filed: May 6, 2015

(65) Prior Publication Data

US 2015/0325282 A1    Nov. 12, 2015

(30) Foreign Application Priority Data

May 9, 2014    (JP) .................................. 2014-098130

(51) Int. Cl.
    *G11C 11/4096*    (2006.01)
    *G11C 11/4091*    (2006.01)
    *G11C 11/4097*    (2006.01)

(52) U.S. Cl.
    CPC ...... *G11C 11/4096* (2013.01); *G11C 11/4091* (2013.01); *G11C 11/4097* (2013.01)

(58) Field of Classification Search
    CPC .................................................. G11C 11/4091
    USPC ........................................................ 365/51
    See application file for complete search history.

(56) References Cited

U.S. PATENT DOCUMENTS

| 4,466,081 | A | | 8/1984 | Masuoka | |
|---|---|---|---|---|---|
| 5,111,434 | A | * | 5/1992 | Cho | G11C 11/4097 365/203 |
| 5,274,585 | A | * | 12/1993 | Suyama | G11C 7/22 365/149 |
| 5,534,884 | A | | 7/1996 | Mase et al. | |

(Continued)

FOREIGN PATENT DOCUMENTS

| JP | 02-148763 A | 6/1990 |
|---|---|---|
| JP | 09-045879 A | 2/1997 |

(Continued)

OTHER PUBLICATIONS

PCT/IB2015/053068 (Written Opinion of the International Searching Authority (PCT Rule 43bis.1)), Satoshi Ueta, dated Aug. 18, 2015.*

(Continued)

*Primary Examiner* — Anthan Tran
*Assistant Examiner* — Mushfique Siddique
(74) *Attorney, Agent, or Firm* — Fish & Richardson P.C.

(57) ABSTRACT

A memory device with low power consumption is provided. The memory device includes a sense amplifier, bit lines, memory cells, and first transistors. The bit lines are provided over a layer comprising the sense amplifier. The memory cells are provided over a layer comprising the bit lines. The memory cell includes a second transistor and a capacitor. The sense amplifier and the bit lines are electrically connected to each other through the first transistors. The sense amplifier may include at least one layer of a conductor.

34 Claims, 28 Drawing Sheets

(56) References Cited

U.S. PATENT DOCUMENTS

| | | | |
|---|---|---|---|
| 5,610,868 A * | 3/1997 | Inaba | G11C 7/06 257/E27.086 |
| 5,977,580 A | 11/1999 | Yoon | |
| 5,982,471 A | 11/1999 | Hirakata et al. | |
| 6,154,405 A * | 11/2000 | Takemae | G11C 7/1048 365/185.2 |
| 6,169,532 B1 | 1/2001 | Sumi et al. | |
| 6,266,038 B1 | 7/2001 | Yoshida et al. | |
| 6,466,502 B1 * | 10/2002 | Matsumoto | G11C 7/06 365/208 |
| 6,667,912 B1 * | 12/2003 | Monzel | G11C 7/06 365/189.07 |
| 6,839,260 B2 | 1/2005 | Ishii | B82Y 10/00 257/E21.661 |
| 6,898,109 B2 * | 5/2005 | Hirose | G11C 7/02 257/E21.656 |
| 6,961,042 B2 | 11/2005 | Murai | |
| 7,095,642 B1 * | 8/2006 | Parent | G11C 29/83 365/200 |
| 7,098,880 B2 | 8/2006 | Inoue et al. | |
| 7,102,947 B2 | 9/2006 | Kajitani et al. | |
| 7,177,187 B2 | 2/2007 | Ishii | |
| 7,251,176 B2 | 7/2007 | Kajitani et al. | |
| 7,336,519 B2 | 2/2008 | Ishii | |
| 7,355,913 B2 | 4/2008 | Kang et al. | |
| 7,414,907 B2 | 8/2008 | Kajitani et al. | |
| 7,570,516 B2 | 8/2009 | Ishii | |
| 7,674,650 B2 | 3/2010 | Akimoto et al. | |
| 7,737,517 B2 | 6/2010 | Kawamura et al. | |
| 7,826,266 B2 | 11/2010 | Ishii | |
| 7,842,976 B2 * | 11/2010 | Fujii | H01L 27/10885 257/206 |
| 8,000,126 B2 | 8/2011 | Morikawa et al. | |
| 8,036,010 B2 | 10/2011 | Maejima | |
| 8,067,775 B2 | 11/2011 | Miyairi et al. | |
| 8,202,365 B2 | 6/2012 | Umeda et al. | |
| 8,212,248 B2 | 7/2012 | Itagaki et al. | |
| 8,320,208 B2 | 11/2012 | Kajigaya et al. | |
| 8,378,341 B2 | 2/2013 | Hayashi et al. | |
| 8,378,403 B2 | 2/2013 | Kato | |
| 8,421,081 B2 | 4/2013 | Kato et al. | |
| 8,455,868 B2 | 6/2013 | Yamazaki et al. | |
| 8,638,630 B2 | 1/2014 | Kajigaya et al. | |
| 8,686,486 B2 | 4/2014 | Kato et al. | |
| 8,687,411 B2 | 4/2014 | Saito | |
| 8,709,889 B2 | 4/2014 | Saito | |
| 8,743,590 B2 | 6/2014 | Kurokawa | |
| 8,772,849 B2 | 7/2014 | Noda | |
| 8,780,614 B2 | 7/2014 | Takemura | |
| 8,787,102 B2 | 7/2014 | Ishizu | |
| 8,797,785 B2 | 8/2014 | Saito | |
| 8,809,853 B2 | 8/2014 | Saito et al. | |
| 8,809,927 B2 | 8/2014 | Takemura | |
| 8,854,865 B2 | 10/2014 | Saito | |
| 8,896,046 B2 | 11/2014 | Kato | |
| 8,958,263 B2 | 2/2015 | Takemura | |
| 9,704,562 B2 * | 7/2017 | Onuki | G11C 11/4091 |
| 9,741,426 B2 * | 8/2017 | Park | G11C 11/4091 |
| 2001/0020928 A1 | 9/2001 | Yanagisawa et al. | |
| 2002/0003271 A1 | 1/2002 | Ikeda et al. | |
| 2002/0141228 A1 * | 10/2002 | Fujino | G11C 7/18 365/149 |
| 2002/0181284 A1 * | 12/2002 | Kato | B82Y 10/00 365/185.21 |
| 2002/0196690 A1 * | 12/2002 | Matsumoto | G11C 7/06 365/208 |
| 2003/0052352 A1 | 3/2003 | Soeda | |
| 2004/0240281 A1 * | 12/2004 | Kim | G11C 7/06 365/196 |
| 2005/0141324 A1 * | 6/2005 | Ko | G11C 7/1051 365/230.03 |
| 2005/0219188 A1 | 10/2005 | Kawabe et al. | |
| 2006/0181917 A1 * | 8/2006 | Kang | G11C 7/065 365/149 |
| 2006/0215472 A1 * | 9/2006 | Yoon | G11C 11/4097 365/207 |
| 2006/0221664 A1 * | 10/2006 | Kang | G11C 11/4091 365/149 |
| 2006/0221665 A1 * | 10/2006 | Kang | G11C 11/4096 365/149 |
| 2006/0233038 A1 | 10/2006 | Kang et al. | |
| 2007/0070755 A1 * | 3/2007 | Kim | G11C 7/06 365/208 |
| 2007/0205976 A1 | 9/2007 | Takatori et al. | |
| 2008/0042968 A1 | 2/2008 | Oh | |
| 2008/0055218 A1 | 3/2008 | Tsuda et al. | |
| 2008/0062795 A1 * | 3/2008 | Chung | G11C 7/065 365/208 |
| 2008/0284970 A1 | 11/2008 | Ishitani | |
| 2009/0059644 A1 * | 3/2009 | Kajigaya | G11C 5/025 365/72 |
| 2009/0079684 A1 | 3/2009 | Watanabe | |
| 2009/0103349 A1 * | 4/2009 | Hoya | G11C 11/22 365/145 |
| 2009/0108376 A1 | 4/2009 | Fujii et al. | |
| 2009/0147604 A1 * | 6/2009 | Kang | G11C 7/08 365/205 |
| 2009/0230435 A1 | 9/2009 | Maejima | |
| 2009/0261325 A1 | 10/2009 | Kawamura et al. | |
| 2009/0268519 A1 | 10/2009 | Ishii | |
| 2010/0025678 A1 | 2/2010 | Yamazaki et al. | |
| 2010/0118597 A1 * | 5/2010 | Song | G11C 11/405 365/149 |
| 2010/0157660 A1 * | 6/2010 | Kye | G11C 11/565 365/149 |
| 2010/0195431 A1 | 8/2010 | Ohgami | |
| 2010/0214823 A1 * | 8/2010 | Ogawa | G11C 5/063 365/149 |
| 2010/0244020 A1 | 9/2010 | Sakata et al. | |
| 2011/0122670 A1 * | 5/2011 | Yamazaki | G11C 16/0433 365/72 |
| 2011/0176348 A1 * | 7/2011 | Yamazaki | G11C 11/404 365/72 |
| 2011/0205775 A1 * | 8/2011 | Matsuzaki | G11C 16/0408 365/72 |
| 2011/0205785 A1 * | 8/2011 | Nagatsuka | G11C 11/413 365/149 |
| 2011/0255325 A1 * | 10/2011 | Nagatsuka | G11C 11/405 365/72 |
| 2011/0261631 A1 * | 10/2011 | Yoshida | G11C 7/02 365/189.11 |
| 2011/0317463 A1 | 12/2011 | Maejima | |
| 2012/0033483 A1 * | 2/2012 | Koyama | G11C 11/405 365/149 |
| 2012/0033510 A1 * | 2/2012 | Nagatsuka | G11C 11/403 365/189.15 |
| 2012/0057396 A1 * | 3/2012 | Yamazaki | G11C 5/025 365/149 |
| 2012/0061668 A1 | 3/2012 | Miyairi et al. | |
| 2012/0063208 A1 * | 3/2012 | Koyama | G11C 5/025 365/149 |
| 2012/0112257 A1 | 5/2012 | Kato | |
| 2012/0161220 A1 | 6/2012 | Yamazaki | |
| 2012/0193697 A1 | 8/2012 | Takemura | |
| 2012/0195104 A1 * | 8/2012 | Takemura | G11C 11/404 365/149 |
| 2013/0069132 A1 | 3/2013 | Atsumi et al. | |
| 2013/0070506 A1 * | 3/2013 | Kajigaya | G11C 7/18 365/51 |
| 2013/0100748 A1 * | 4/2013 | Takemura | G11C 7/02 365/189.011 |
| 2013/0134418 A1 | 5/2013 | Hayashi et al. | |
| 2013/0140569 A1 | 6/2013 | Yoneda et al. | |
| 2013/0148411 A1 | 6/2013 | Atsumi et al. | |
| 2013/0155790 A1 | 6/2013 | Atsumi | |
| 2013/0221356 A1 | 8/2013 | Yamazaki et al. | |
| 2013/0258746 A1 | 10/2013 | Kurokawa | |
| 2014/0078805 A1 * | 3/2014 | Kajigaya | G11C 5/025 365/72 |
| 2014/0092680 A1 * | 4/2014 | Lee | G11C 11/404 365/182 |

(56) References Cited

U.S. PATENT DOCUMENTS

| | | | |
|---|---|---|---|
| 2014/0325249 A1 | 10/2014 | Toyotaka | |
| 2014/0374747 A1 | 12/2014 | Kurokawa | |
| 2015/0294693 A1* | 10/2015 | Onuki | G11C 5/025 365/51 |
| 2015/0294710 A1* | 10/2015 | Onuki | G11C 7/1069 365/149 |
| 2015/0325282 A1* | 11/2015 | Kato | G11C 11/4096 365/51 |
| 2016/0336055 A1* | 11/2016 | Kato | G11C 11/24 |
| 2017/0186477 A1* | 6/2017 | Park | G11C 11/4091 |

FOREIGN PATENT DOCUMENTS

| | | |
|---|---|---|
| JP | 10-093048 A | 4/1998 |
| JP | 10-255470 A | 9/1998 |
| JP | 2002-319682 | 10/2002 |
| JP | 2003-078022 A | 3/2003 |
| JP | 2006-013536 A | 1/2006 |
| JP | 2009-111166 A | 5/2009 |
| JP | 2009-135350 A | 6/2009 |
| JP | 2011-151383 | 8/2011 |
| JP | 2012-178554 | 9/2012 |
| JP | 2013-145875 A | 7/2013 |

OTHER PUBLICATIONS

Kamiya.Y et al. "Carrier transport properties and electronic structures of amorphous oxide semiconductors: the present status", Solid State Physics, vol. 44 , No. 9, pp. 621-633.

International Search Report (Application No. PCT/IB2015/053068) dated Aug. 18, 2015.

Written Opinion (Application No. PCT/IB2015/053068) dated Aug. 18, 2015.

\* cited by examiner

500A

500D

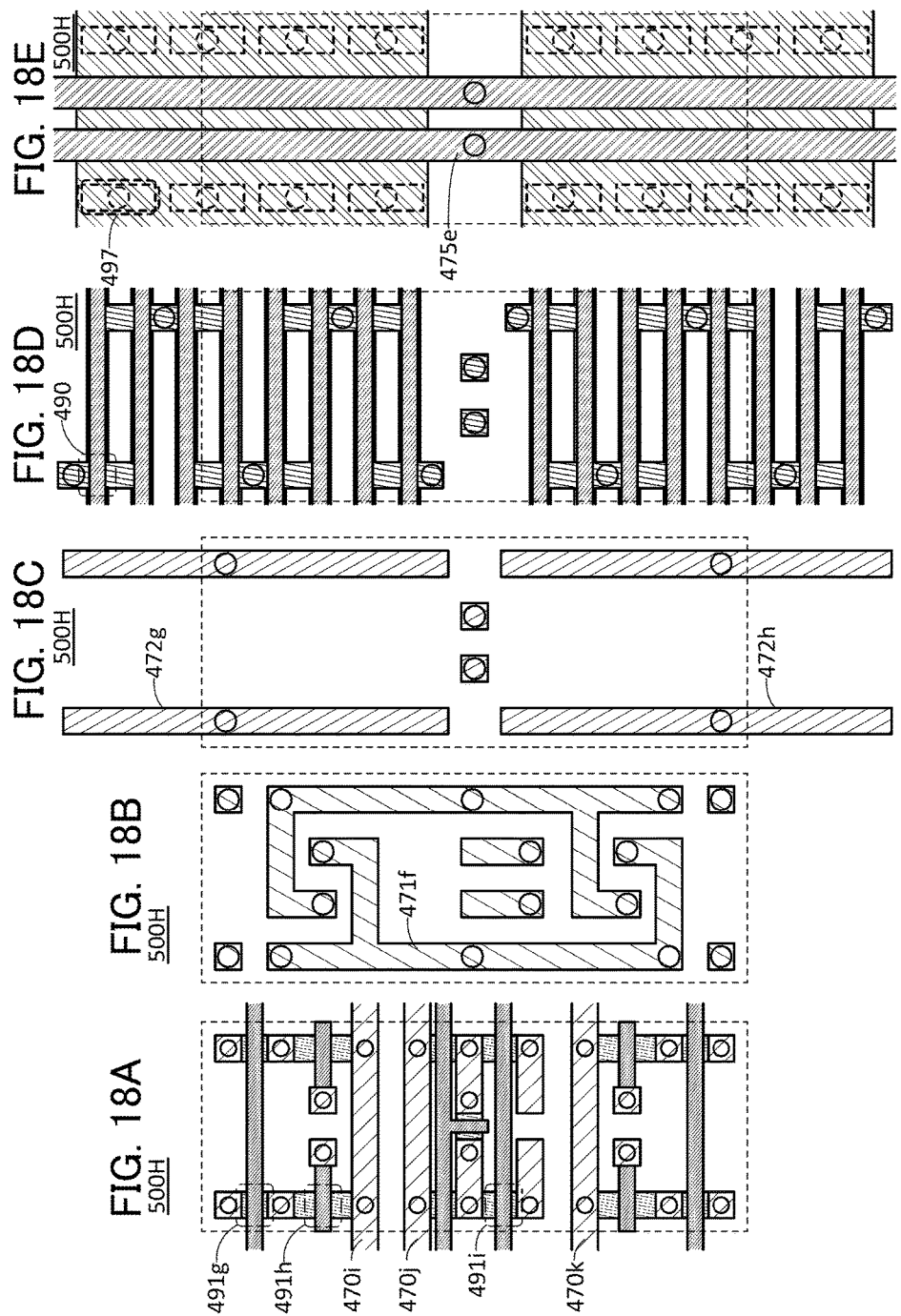

SEMICONDUCTOR DEVICE COMPRISING MEMORY DEVICES EACH COMPRISING SENSE AMPLIFIER AND MEMORY CELL

TECHNICAL FIELD

One embodiment of the present invention relates to a memory device and a semiconductor device including the memory device.

Note that one embodiment of the present invention is not limited to the above technical field. One embodiment of the invention disclosed in this specification and the like relates to an object, a method, or a manufacturing method. In addition, one embodiment of the present invention relates to a machine, a process, manufacture, or a composition of matter. In particular, one embodiment of the present invention relates to, for example, a semiconductor, a semiconductor device, a memory device, a processor, a display device, a light-emitting device, a lighting device, a power storage device, a manufacturing method thereof, or a driving method thereof.

The semiconductor device in this specification indicates all the devices that can operate by utilizing semiconductor characteristics. A semiconductor device means a circuit having a semiconductor element (e.g., a transistor or a diode) and a device having the circuit, and the like. For example, an electronic circuit and a chip including an electronic circuit are all semiconductor devices. A memory device, a display device, a light-emitting device, a lighting device, an electro-optical device, an electronic device, and the like are examples of a semiconductor device in some cases.

BACKGROUND ART

A dynamic random access memory (DRAM) stores data by accumulation of electric charge in a capacitor. Thus, the off-state current of a transistor for controlling the supply of electric charge to the capacitor is preferably small. This is because small off-state current can increase the data holding period, and the frequency of refresh operation can be reduced.

Transistors including an oxide semiconductor (preferably an oxide including In, Ga, and Zn) in their channel formation regions are known. It is known that a transistor including an oxide semiconductor (preferably an oxide including In, Ga, and Zn) in a channel formation region has an extremely small off-state current.

Patent Document 1 describes a semiconductor device which can hold stored content for a long time by using a transistor including a channel formation region in an oxide semiconductor film. Patent Document 1 also describes a semiconductor device in which the chip area can be reduced by stacking a driver circuit and a memory circuit. Patent Document 2 describes a semiconductor device in which capacitance of a capacitor can be reduced by a divided bit line system.

REFERENCE

Patent Document

[Patent Document 1] Japanese Published Patent Application No. 2011-151383
[Patent Document 2] Japanese Published Patent Application No. 2012-178554

DISCLOSURE OF INVENTION

In a memory device such as a DRAM, reductions in power consumption and size and increases in operating speed and memory capacity are required to improve performance and reduce power consumption of computing system.

An object of one embodiment of the present invention is at least one of the following: providing a memory device capable of reducing power consumption, providing a memory device capable of increasing operation speed, providing a downsized memory device, providing a memory device with improved memory capacity, providing a semiconductor device capable of reducing power consumption, providing a semiconductor device capable of improving operation speed, providing a downsized semiconductor device, and providing a novel semiconductor device.

The descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a memory device including a sense amplifier, a bit line, a memory cell, and a first transistor. The bit line is provided over a layer where the sense amplifier is provided. The memory cell is provided over a layer where the bit line is provided and includes a second transistor and a capacitor. The sense amplifier is electrically connected to the bit line through the first transistor. The sense amplifier may include at least one layer of a conductor.

(2) Another embodiment of the present invention is the memory device of (1) including a data line. The data line is provided over a layer where the memory cell is provided and is electrically connected to the sense amplifier through a third transistor.

(3) Another embodiment of the present invention is a memory device including a first transistor, a second transistor, a third transistor, a fourth transistor, a first layer, a second layer, a third layer, and a capacitor. The first layer is stacked over a layer where the third transistor and the fourth transistor are provided and includes a first conductor. The second layer is stacked over the first layer and includes a second conductor and a third conductor. The third layer is stacked over the second layer and includes a fourth conductor. The second transistor and the capacitor are stacked over the third layer. One of a source and a drain of the first transistor is electrically connected to the fourth conductor. The other of the source and the drain of the first transistor is electrically connected to the second conductor. One of a source and a drain of the second transistor is electrically connected to the fourth conductor. The other of the source and the drain of the second transistor is electrically connected to the capacitor. One of a source and a drain of the third transistor is electrically connected to the second conductor. The other of the source and the drain of the third transistor is electrically connected to the first conductor. A gate of the third transistor is electrically connected to the third conductor. One of a source and a drain of the fourth transistor is electrically connected to the third conductor. The other of the source and the drain of the fourth transistor is electrically connected to the first conductor. A gate of the fourth transistor is electrically connected to the second conductor.

(4) Another embodiment of the present invention is a memory device including a sense amplifier, four bit lines, a memory cell, and four first transistors. The four bit lines are provided over a layer where the sense amplifier is provided. The memory cell is provided over a layer where the four bit lines are provided. The memory cell includes a second transistor and a capacitor. The four bit lines are arranged in two columns adjacent to each other in a first direction and two rows adjacent to each other in a second direction. The second direction is a direction perpendicular to the first direction. Each of the four bit lines extends in the second direction and is electrically connected to the sense amplifier through a respective one of the four first transistors. A plurality of sense amplifiers are arranged in the first direction at a pitch of a width of two bit lines or more. A plurality of sense amplifiers are arranged in the second direction at a pitch of a width of one bit line or more. The sense amplifier may include at least one layer of a conductor.

(5) Another embodiment of the present invention is a memory device including a sense amplifier, eight bit lines, a memory cell, and four first transistors. The eight bit lines are provided over a layer where the sense amplifier is provided. The memory cell is provided over a layer where the eight bit lines are provided. The memory cell includes a second transistor and a capacitor. The eight bit lines are arranged in four columns adjacent to each other in a first direction and two rows adjacent to each other in a second direction. The second direction is perpendicular to the first direction. The eight bit lines extend in the second direction. The four bit lines are, of the eight bit lines, two of the four bit lines in the first row and two of the four bit lines in the second row. Each of the four bit lines is electrically connected to the sense amplifier through a respective one of the four first transistors. A plurality of sense amplifiers are arranged in the first direction at a pitch of a width of four bit lines or more. A plurality of sense amplifiers are arranged in the second direction at a pitch of a width of one bit line or more. The sense amplifier may include at least one layer of a conductor.

(6) Another embodiment of the present invention is the memory device of (4) or (5) including two data lines and two third transistors. The two data lines are provided over a layer where the memory cell is provided. Each of the two data lines is electrically connected to the sense amplifier through a respective one of the two third transistors.

(7) Another embodiment of the present invention is a memory device including a plurality of sense amplifiers, a plurality of bit lines, a plurality of memory cells, and a plurality of first transistors. The plurality of bit lines are provided over a layer where the plurality of sense amplifiers are provided. The plurality of memory cells are provided over a layer where the plurality of bit lines are provided. The plurality of memory cells each include a second transistor and a capacitor. A direction in which the plurality of bit lines extend is referred to as a second direction. A direction perpendicular to the second direction is referred to as a first direction. The plurality of bit lines are arranged two-dimensionally at a pitch of a first distance in the first direction and at a pitch of a second distance in the second direction. The plurality of sense amplifiers are each connected to four of the plurality of bit lines through four of the plurality of first transistors. The plurality of sense amplifiers are arranged two-dimensionally at a pitch of twice the first distance in the first direction and at a pitch of twice the second distance in the second direction. The plurality of sense amplifiers may include at least one layer of a conductor.

(8) Another embodiment of the present invention is the memory device of (7) including a plurality of data lines and a plurality of third transistors. The plurality of data lines are provided over a layer where the memory cells are provided. The plurality of sense amplifiers each are electrically connected to two of the plurality of data lines through two of the plurality of third transistors. The plurality of data lines each are electrically connected to sense amplifiers adjacent to each other in the first direction of the plurality of sense amplifiers through two of the plurality of third transistors.

(9) Another embodiment of the present invention is a memory device including a plurality of sense amplifiers, a plurality of bit lines, a plurality of memory cells, and a plurality of first transistors. The plurality of bit lines are provided over a layer where the plurality of sense amplifiers are provided. The plurality of memory cells are provided over a layer where the plurality of bit lines are provided. The plurality of memory cells each include a second transistor and a capacitor. A direction in which the plurality of bit lines extend is referred to as a second direction. A direction perpendicular to the second direction is referred to as a first direction. The plurality of bit lines are arranged two-dimensionally at a pitch of a third distance in the first direction and at a pitch of a fourth distance in the second direction. The plurality of sense amplifiers are each connected to four of the plurality of bit lines through four of the plurality of first transistors. The plurality of sense amplifiers are arranged two-dimensionally at a pitch of four times the third distance in the first direction and at a pitch of one time the fourth distance in the second direction. The plurality of sense amplifiers may include at least one layer of a conductor.

(10) Another embodiment of the present invention is the memory device of (9) in which of the plurality of sense amplifiers, sense amplifiers adjacent to each other in the second direction are shifted from each other by a fifth distance in the first direction and in which the fifth distance is shorter than the third distance.

(11) Another embodiment of the present invention is the memory device of (9) or (10) including a plurality of data lines and a plurality of third transistors. The plurality of data lines are provided over a layer where the memory cell is provided. The plurality of sense amplifiers are each electrically connected to two of the plurality of data lines through two of the plurality of third transistors. The plurality of data lines are each electrically connected to sense amplifiers adjacent to each other in the second direction of the plurality of sense amplifiers through two of the plurality of third transistors.

(12) Another embodiment of the present invention is the memory device of any one of (1) to (11) in which the second transistor is an oxide semiconductor transistor.

(13) Another embodiment of the present invention is the memory device of any one of (1) to (12) in which the first transistor is a silicon transistor.

(14) Another embodiment of the present invention is the memory device of any one of (1) to (13) in which the number of memory cells connected to the bit line is 3 to 32.

(15) Another embodiment of the present invention is the memory device of any one of (1) to (14) in which capacitance of the capacitor is 0.1 fF to 10 fF.

(16) Another embodiment of the present invention is an electronic device including the memory device of any one of (1) to (15) and a printed wiring board.

A memory device capable of reducing power consumption can be provided. A memory device capable of increasing operation speed can be provided. A downsized memory device can be provided. A memory device with improved memory capacity can be provided. A semiconductor device capable of reducing power consumption can be provided. A semiconductor device capable of increasing operation speed can be provided. A downsized semiconductor device can be provided. A novel semiconductor device can be provided.

Note that the description of these effects does not disturb the existence of other effects. One embodiment of the present invention does not necessarily have all the above effects. Other effects will be apparent from and can be derived from the description of the specification, the drawings, the claims, and the like.

BRIEF DESCRIPTION OF DRAWINGS

In the accompanying drawings:

FIGS. 18A to 18E are top views of a memory device of one embodiment of the present invention;

BEST MODE FOR CARRYING OUT THE INVENTION

Figure 1A:
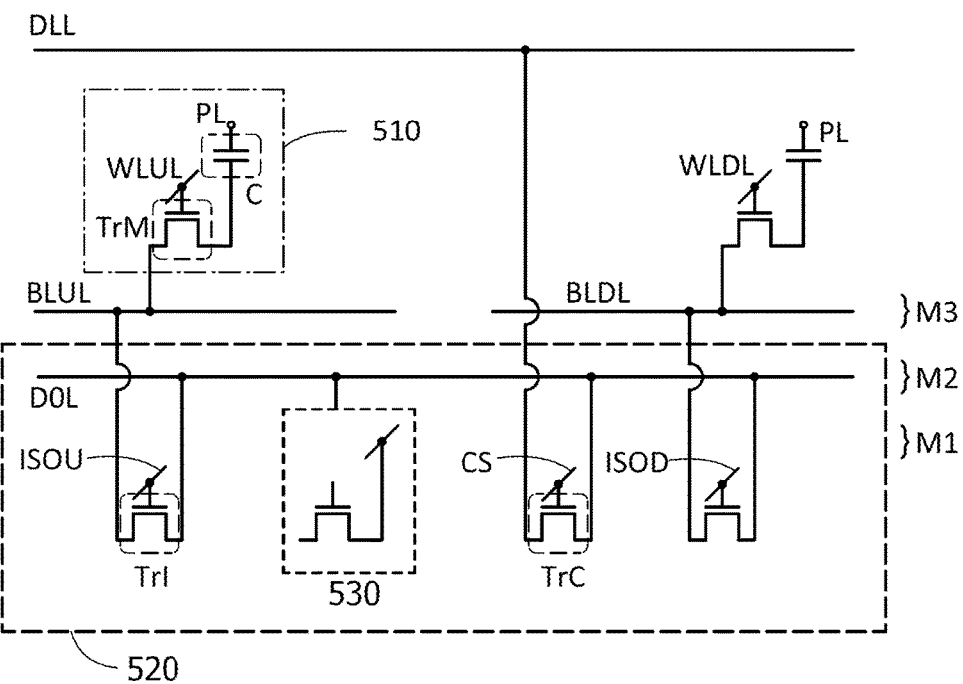
FIGS. 1A and 1B are schematic cross-sectional views of a memory device of one embodiment of the present invention.

Embodiments of the present invention will be described in detail with reference to the drawings. However, the present invention is not limited to the description below, and it is easily understood by those skilled in the art that modes and details disclosed herein can be modified in various ways. Furthermore, the present invention is not construed as being limited to description of the following embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in diagrams is sometimes exaggerated for simplicity.

Note that the ordinal numbers such as "first" and "second" in this specification are used for convenience and do not denote the order of steps or the stacking order of layers. Therefore, for example, description can be made even when "first" is replaced with "second" or "third", as appropriate. In addition, the ordinal numbers in this specification and the like are not necessarily the same as the ordinal numbers used to specify one embodiment of the present invention.

In the description or the drawings of embodiments of the present invention, for example, a word line $WLUL(i)$, a word line $WLUR(i)$ (i is an integer of 1 to kU and kU is an integer of 1 or more), a word line $WLDL(j)$, and a word line $WLDR(j)$ (j is an integer of 1 to kD and kD is an integer of 1 or more) are abbreviated to a word line WLUL, a word line WLUR, a word line WLDL, and a word line WLDR or simply to WLUL, WLUR, WLDL, WLDR, or the like in some cases. For example, when the word line WLUL is used, it means one of $WLUL(i)$ (i is an integer of 1 to kU and kU is an integer of 1 or more) or all of them in some cases. The same applies to other components, for example, wirings, signal lines, power supply lines, or circuits in some cases.

Embodiment 1

In this embodiment, a semiconductor device of one embodiment of the present invention will be described with reference to drawings.

An example of a structure of a memory device of one embodiment of the present invention will be described with reference to FIGS. 1A and 1B and FIG. 2.

FIG. 1A is a diagram schematically showing an example of a structure of a cross section of a memory device 500. In FIG. 1A, positions and connections of elements and wirings are schematically shown using circuit symbols. The up and down direction in the drawing is a direction perpendicular to a surface over which a circuit is formed (or the height direction of the surface). FIG. 2 is a plan view schematically showing an example of a structure of the memory device 500. FIG. 2 schematically illustrates regions, wirings, connection portions, and the like, and the up and down direction and the right and left direction show different horizontal directions (directions parallel to the surface over which the circuit is formed). Note that in FIGS. 1A and 1B and FIG. 2, some components such as a transistor and a wiring are not illustrated for easy understanding.

Figure 2:
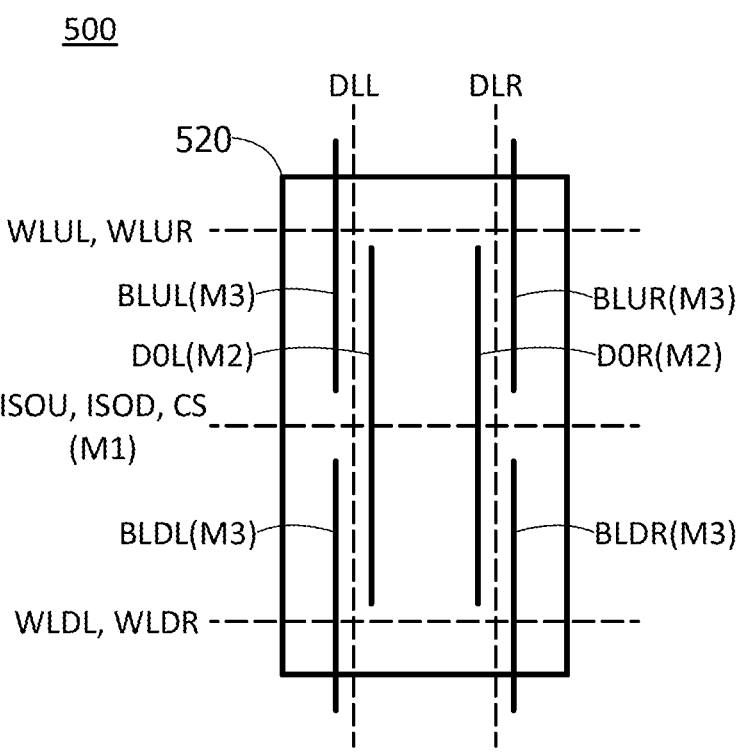
FIG. 2 is a schematic top view of a memory device of one embodiment of the present invention.

The memory device 500 illustrated in FIG. 1A and FIG. 2 includes a sense amplifier block 520, bit lines BLUL, BLUR, BLDL, and BLDR, word lines WLUL, WLUR, WLDL, and WLDR, a memory cell 510, data lines DLL and DLR, and wirings ISOU, ISOD, and CS. The memory cell 510 includes a transistor TrM and a capacitor C. The sense amplifier block 520 includes at least a transistor TrI, a sense amplifier 530, wirings D0L and D0R connected to the sense amplifier 530, and a transistor TrC.

The bit lines BLUL, BLUR, BLDL, and BLDR are positioned above a layer where the sense amplifier block 520 is provided. The memory cell 510 is positioned above a layer where the bit lines BLUL, BLUR, BLDL, and BLDR are provided. The data lines DLL and DLR are positioned above the memory cell 510. A transistor included in the sense amplifier block 520 is connected to at least a conductor in a first layer (denoted by M1 in the drawings) and a conductor in a second layer (denoted by M2 in the drawings). As the bit lines, a conductor in a third layer (denoted by M3 in the drawings) is used. As the wirings D0L and D0R connected to the sense amplifier 530, at least the conductor in the second layer is used. The conductor in the second layer is provided above the conductor in the first layer, and the conductor in the third layer is provided above the conductor in the second layer.

In the memory cell 510, one of a source and a drain of the transistor TrM and the bit line BLUL, BLUR, BLDL, or BLDR are electrically connected to each other, and the other of the source and the drain of the transistor TrM and one of two terminals of the capacitor C are electrically connected to each other. The other of the two terminals of the capacitor C is connected to a terminal PL. The capacitor C has a function of a storage capacitor. The capacitor C is positioned above the transistor TrM. A gate of the transistor TrM is connected to the word line. As the word line, at least four wirings, i.e., WLUL, WLUR, WLDL, and WLDR are included. The memory cell 510 has a function of a memory circuit.

In the sense amplifier block 520, one of a source and a drain of the transistor TrI and the bit line BLUL, BLUR, BLDL, or BLDR are electrically connected to each other, and the other of the source and the drain of the transistor TrI and the wiring D0L or D0R connected to the sense amplifier 530 are electrically connected to each other. A gate of the transistor TrI is connected to the wiring ISOU or ISOD. The wiring ISOU or ISOD is supplied with a signal for controlling continuity between the bit line and the sense amplifier 530. As the wiring ISOU or ISOD, the conductor in the first layer may be used. One of a source and a drain of the transistor TrC and the wiring D0L or D0R connected to the sense amplifier 530 are electrically connected to each other, and the other of the source and the drain of the transistor TrC and the data line DLL or DLR are electrically connected to each other. A gate of the transistor TrC is connected to the wiring CS. The wiring CS is supplied with a signal for controlling continuity between the data line and the sense amplifier 530. As the wiring CS, the conductor in the first layer may be used.

In this specification, a direction perpendicular to a direction in which the bit lines extend is referred to as a first direction. In other words, a direction in which the word lines extend is referred to as the first direction. The direction in which the bit lines extend is referred to as a second direction. In other words, a direction perpendicular to the direction in which the word lines extend is referred to as the second direction.

Therefore, the word lines extend in the first direction. The bit lines BLUL, BLUR, BLDL, and BLDR extend in the second direction. The wiring ISOU, ISOD, and/or CS extends in the first direction. The data lines DLL and DLR extend in the second direction that is perpendicular to the first direction. At least part of each of the wirings D0L and D0R connected to the sense amplifier 530 extends in the second direction. At least part of each of the four bit lines BLUL, BLUR, BLDL, and BLDR overlaps with a region in which the sense amplifier block 520 is placed.

In the memory device 500, the bit lines BLUL, BLUR, BLDL, and BLDR may be provided above the transistor TrM or the capacitor C included in the memory cell 510. The data lines DLL and DLR may be provided below the memory cell 510. The capacitor C may be provided in the same layer as the transistor TrM or below the transistor TrM.

Figure 1B:
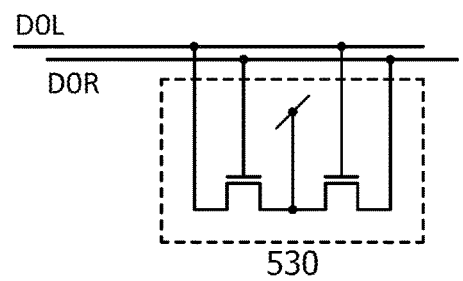

FIG. 1B illustrates an example of a circuit configuration of the sense amplifier 530. The sense amplifier 530 includes two transistors. The two transistors are cross-coupled. That is, sources of the two transistors are connected to the same wiring. The conductor in the first layer may be used as the wiring. One of drains of the two transistors is connected to the wiring D0L, and the other thereof is connected to the wiring D0R. A gate of one of the transistors is electrically connected to the drain of the other of the transistors.

An example of a circuit configuration of a memory device of one embodiment of the present invention is described with reference to FIG. 3.

Figure 3:
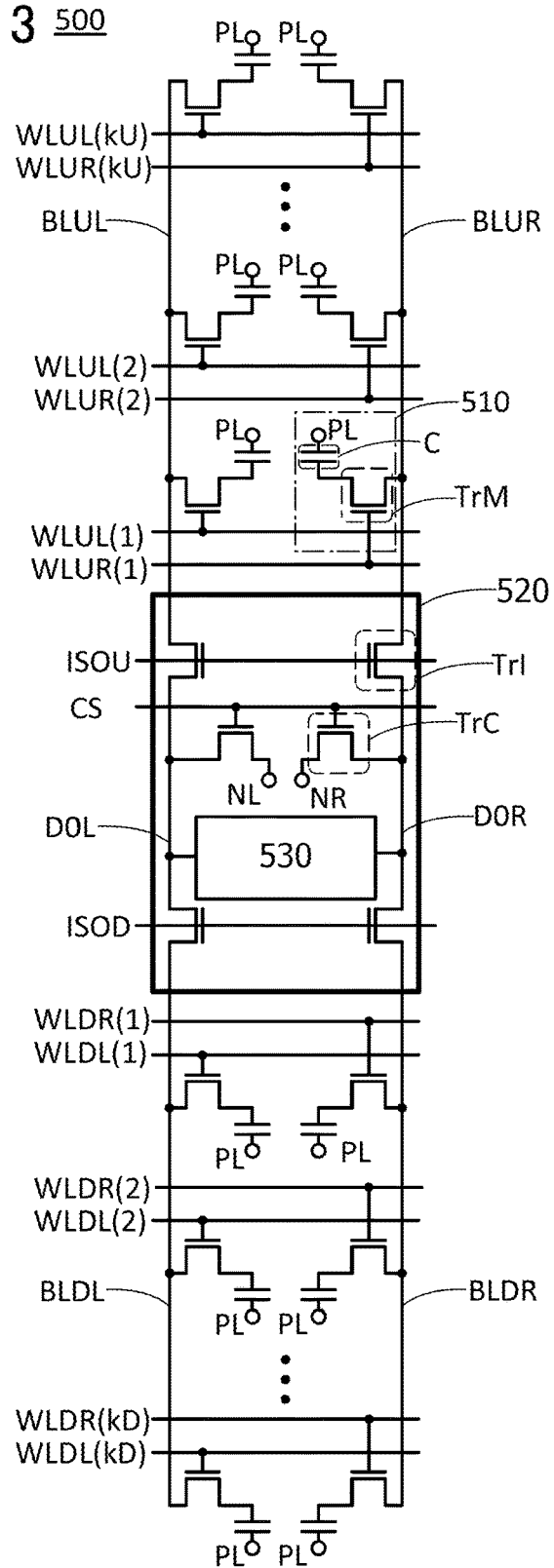
FIG. 3 is a circuit diagram of a memory device of one embodiment of the present invention.

In the memory device 500 illustrated in FIG. 3, the wiring D0L and the wiring D0R are connected to the sense amplifier 530. The wiring D0L and the wiring D0R are connected to the bit lines through the transistors TrI. In other words, the wiring D0L and the wiring D0R are electrically connected to the bit line BLUL and the bit line BLUR, respectively, through the transistors TrI controlled by the wiring ISOU. The wiring D0L and the wiring D0R are electrically connected to the bit line BLDL and the bit line BLDR, respectively, through the transistors TrI controlled by the wiring ISOD. The wiring D0L and the wiring D0R are electrically connected to the terminal NL and the terminal NR, respectively, through the transistors TrC controlled by the wiring CS. The terminal NL and the terminal NR are connected to data lines (not illustrated). The memory cell 510 is connected to the bit line and the word line. The bit line BLUL is connected to kU memory cells (kU is an integer of 1 or more). The kU memory cells are connected to respective kU word lines WLUL(1) to WLUL(kU). The bit line BLUR is connected to the kU memory cells. The kU memory cells are connected to respective kU word lines WLUR(1) to WLUR (kU). The bit line BLDL is connected to kD memory cells (kD is an integer of 1 or more). The kD memory cells are connected to respective kD word lines WLDL(1) to WLDL (kD). The bit line BLDR is connected to the kD memory cells. The kD memory cells are connected to a respective one of kD word lines WLDR(1) to WLDR(kD).

In the memory device 500 illustrated in FIG. 3, memory cells connected to BLUL and BLUR (or BLDL and BLDR) which are adjacent bit lines are connected to different word lines. Such a structure is called a folded structure. The folded structure has high noise immunity in read operation because a potential change in the word lines similarly affects a pair of bit lines whose potentials are compared.

The pair of bit lines mean two bit lines which are compared by a sense amplifier block at the same time. The pair of bit lines are also referred to as a bit line pair. In the memory device 500 illustrated in FIG. 3, the bit line BLUL and the bit line BLUR are a pair of bit lines. The bit line BLUL and the bit line BLUR are also referred to as a pair of bit lines (BLUL and BLUR) or a bit line pair (BLUL and BLUR).

A sense amplifier block is a group of circuits and is provided for every predetermined number of bit lines. For example, the sense amplifier block 520 is provided for every four bit lines, i.e., BLUL, BLUR, BLDL, and BLDR.

In the memory device of one embodiment of the present invention, memory cells are placed above the sense amplifier blocks 520, and the sense amplifier blocks 520 are arranged two-dimensionally. Therefore, the sense amplifier blocks 520 are arranged in the first direction (the direction in which the word lines extend) and the second direction (the direction in which the bit lines extend) at predetermined pitches. The pitch of the sense amplifier blocks 520 in the first direction is two to eight times the width of the memory cell in the first direction, for example. The pitch of the sense amplifier blocks 520 in the second direction is 3 to 32 times the width of the memory cell in the second direction, for example. The pitch needs to be large enough to place transistors or circuits included in the sense amplifier block 520. As the pitch is smaller, the area of the sense amplifier block 520 is decreased, so that the number of memory cells per sense amplifier block is reduced. The number of memory cells per sense amplifier block is preferably smaller because capacitance accompanying the bit lines (also referred to as bit line capacitance) is reduced and thus reading/writing performance is improved.

In this specification, a pitch is defined when the same objects are arranged, and means a distance between predetermined portions of the objects that are arranged. For example, in the case where circuits X are arranged in one direction, when predetermined points P in the circuits X are focused, the points P are arranged at regular intervals (referred to as a distance A). The pitch indicates the distance A between the points P. In that case, it is expressed that the circuits X are arranged at a pitch of the distance A in a direction. For example, in the case where wirings W with a width L are arranged at intervals S, the pitch is (L+S). In that case, it is expressed that wirings W are arranged at a pitch of the distance (L+S). In the case where wirings V are arranged at a pitch of the distance (L+S)×2, it is also expressed that the wirings V are arranged at a pitch that is two times the pitch of the wiring W.

An example of a specific circuit configuration of the sense amplifier block 520 is described with reference to FIGS. 19A and 19B.

Figure 19A:
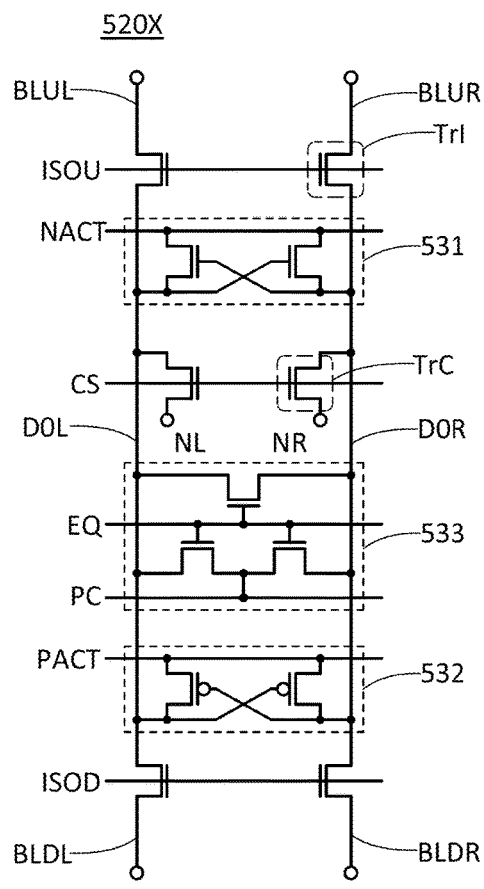
FIGS. 19A and 19B are circuit diagrams each illustrating a sense amplifier.

A sense amplifier block 520X illustrated in FIG. 19A includes the transistors TrI, the transistors TrC, a sense amplifier 531, a sense amplifier 532, and a precharge circuit 533. One of a source and a drain of each of the transistors TrI is connected to the wiring D0L or D0R, and the other thereof is connected to the bit line BLUL, BLUR, BLDL, or BLDR. A gate of each of the transistors TrI is connected to the wiring ISOU or ISOD. One of a source and a drain of each of the transistors TrC is connected to the wiring D0L or D0R, and the other thereof is connected to the terminal NL or NR. The terminal NL and the terminal NR are connected to data lines (not illustrated). Gates of the transistors TrC are connected to the wiring CS.

The sense amplifier 531 includes two n-channel transistors, and is a circuit in which the two n-channel transistors are cross-coupled. Sources of the two n-channel transistors are connected to a wiring NACT. One of drains of the two n-channel transistors is connected to the wiring D0L and the other thereof is connected to the wiring D0R. The sense amplifier 531 operates, for example, with a low-potential power supply VSS supplied to the wiring NACT. The sense amplifier 531 has a function of amplifying a potential difference between the wiring D0L and the wiring D0R.

The sense amplifier 532 includes two p-channel transistors, and is a circuit in which the two p-channel transistors are cross-coupled. Sources of the two p-channel transistors are connected to a wiring PACT. One of drains of the two p-channel transistors is connected to the wiring D0L and the other thereof is connected to the wiring D0R. The sense amplifier 532 operates, for example, with a high-potential power supply VDD supplied to the wiring PACT. The sense amplifier 532 has a function of amplifying a potential difference between the wiring D0L and the wiring D0R.

The precharge circuit 533 includes three transistors. One of the three transistors connects a wiring PC to which a precharge potential is supplied to the wiring D0L, another one thereof connects the wiring PC to the wiring D0R, and the other thereof connects the wiring D0L to the wiring D0R. Gates of the three transistors are connected to a wiring EQ. The precharge circuit 533 has, for example, a function of supplying a predetermined potential (also referred to a precharge potential) to the wiring D0L and the wiring D0R in advance in read operation. The precharge potential is, for example, VDD/2 and is supplied by the wiring PC.

Figure 19B:
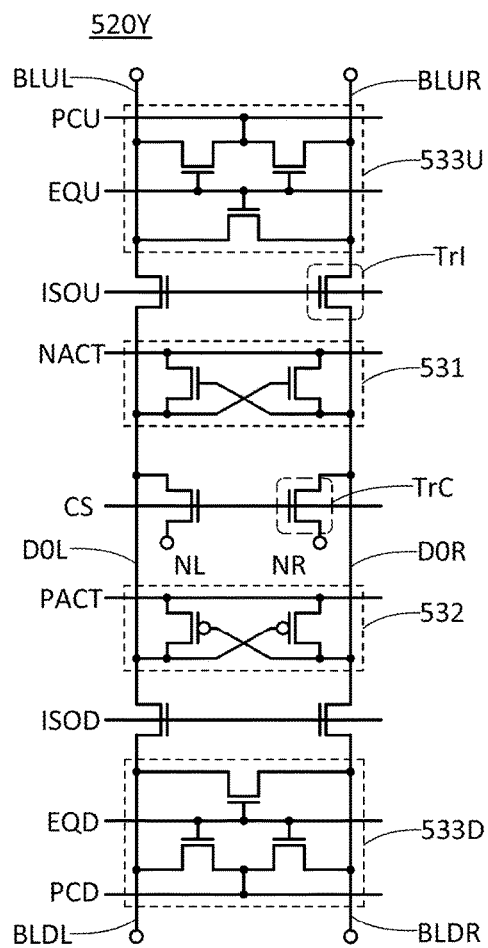

A sense amplifier block 520Y illustrated in FIG. 19B includes the transistors TrI, the transistors TrC, the sense amplifier 531, the sense amplifier 532, and precharge circuits 533U and 533D. The sense amplifier block 520Y illustrated in FIG. 19B has a structure of a precharge circuit different from that of the sense amplifier block 520X illustrated in FIG. 19A. The sense amplifier block 520Y illustrated in FIG. 19B includes two precharge circuits. The precharge circuit 533U precharges the bit line pair (BLUL and BLUR). The precharge circuit 533D precharges the bit line pair (BLDL and BLDR). The precharge circuit 533U includes three transistors. One of the three transistors connects a wiring PCU to which a precharge potential is supplied to the bit line BLUL, another one thereof connects the wiring PCU to the bit line BLUR, and the other thereof connects the bit line BLUL to the bit line BLUR. Gates of the three transistors are connected to a wiring EQU. The precharge circuit 533D includes three transistors. One of the three transistors connects a wiring PCD to which a precharge potential is supplied to the bit line BLDL, another one thereof connects the wiring PCD to the bit line BLDR, and the other thereof connects the bit line BLDL to the bit line BLDR. Gates of the three transistors are connected to a wiring EQD. Such a configuration enables higher-speed precharge operation on the bit lines.

As described above, part of the functions of the sense amplifier block may be provided for each of the bit line pair (BLUL and BLUR) and the bit line pair (BLDL and BLDR). For example, the precharge circuit and part of the sense amplifier may be provided for each of the bit line pair (BLUL and BLUR) and the bit line pair (BLDL and BLDR).

The circuit configuration of the sense amplifier block 520Y illustrated in FIG. 19B is only partly different from the circuit configuration of the sense amplifier block 520X illustrated in FIG. 19A. Thus, the description of the circuit configuration of the sense amplifier block 520X illustrated in FIG. 19A can be referred to for the other circuit configuration of the sense amplifier block 520Y as appropriate.

An operation method of the memory device 500 illustrated in FIG. 3 is described. The memory device 500 selects the memory cell 510 and writes or reads data to or from the selected memory cell 510.

The memory cell 510 is selected by a word line WLUL(i), WLUR(i) (i is an integer of 1 to kU and kU is an integer of 1 or more), WLDL(j), WLDR(j) (j is an integer of 1 to kD and kD is an integer of 1 or more), or the like. The memory cell 510 is selected by controlling the potential of the word line connected thereto. By controlling the potential of a wiring CS, the memory cells 510 connected to the sense amplifier block 520 connected to the wiring CS may be selected among the memory cells 510 which are selected by the word lines.

Data is written by supplying a potential corresponding to the data to a bit line connected to the selected memory cell 510 and supplying a potential by which the transistor TrM is turned on to a word line connected to the selected memory cell 510. When the transistor TrM is in an on state for a certain period, charge corresponding to the bit line potential is accumulated in the capacitor C of the memory cell 510. When the transistor TrM is turned off, data is held. A potential is supplied from the wiring D0L or the wiring D0R of the sense amplifier block 520 to the bit line through the transistor TrI. A potential is supplied from the data line to the wiring D0L or the wiring D0R through the transistor TrC. The potentials corresponding to data may be, for example, a high power supply potential VDD and a low power supply potential VSS.

Data is read in such a manner that a predetermined potential is supplied to a bit line (BLUL is used below) connected to the selected memory cell 510 and a bit line BLUR that is paired with the bit line in advance (referred to as precharge operation), the bit lines are set in a floating state, and then, a potential by which the transistor TrM is turned on is supplied to a word line which is connected to the selected memory cell 510.

In reading operation, the transistors TrI connected to the pair of bit lines (BLUL and BLUR) are turned on by controlling the potential of the wiring ISOU. The precharge operation is performed by a precharge circuit included in the sense amplifier block 520. By supplying a predetermined potential to the wiring EQ (see FIG. 19A), the transistors included in the precharge circuit are turned on. The precharge potential is supplied by the wiring PC. After that, the pair of bit lines (BLUL and BLUR) are set in the floating state. When the transistor TrM is turned on in such a state, the bit line BLUL connected to the transistor TrM and a terminal of the capacitor C are brought into electrical conduction, so that charge is distributed so that the bit line BLUL and the terminal of the capacitor C have the same potential. For example, the precharge potential is set to an intermediate value between the high power supply potential VDD and the low power supply potential VSS ((VDD+VSS)/2), capacitance (bit line capacitance) accompanying the bit line is referred to as $C_{bit}$, a potential $V_{store}$ is held at a terminal connected to the capacitor C and the transistor TrM, and the capacitance of the capacitor C is referred to as $C_{store}$. In that case, when the transistor TrM is turned on, the potential of the bit line BLUL is set to $(C_{bit}\cdot(VDD+VSS)/2 \pm C_{store}\cdot V_{store})/(C_{bit}+C_{store})$.

In contrast, the bit line BLUR pairing with the bit line BLUL holds the precharge potential (VDD+VSS)/2. Thus, a potential difference occurs in the pair of bit lines (BLUL and BLUR). For example, in the case where the high power supply potential VDD is held in the memory cell, the potentials of the bit line BLUL and the wiring D0L are higher than the potentials of the bit line BLUR and the wiring D0R. For example, in the case where the low power supply potential VSS is held in the memory cell, the potentials of the bit line BLUL and the wiring D0L are lower than the potentials of the bit line BLUR and the wiring D0R. The sense amplifier 530 compares the potentials of the pair of wirings (D0L and D0R) connected to the pair of bit lines (BLUL and BLUR) and amplifies a potential difference therebetween. After the potential difference between the pair of bit lines (BLUL and BLUR) is generated, the sense amplifier 530 operates. Consequently, in the case where the high power supply potential VDD is held in the memory cell, VDD and VSS are supplied to the wirings D0L and D0R, respectively. In the case where the low power supply potential VSS is held in the memory cell, VSS and VDD are supplied to the wirings D0L and D0R, respectively. In the above-described manner, data is read to the pair of wirings (D0L and D0R). The read data is output to the pair of data lines (DLL and DLR) by controlling the potential of the wiring CS to turn on the transistors TrC.

By supplying a potential by which the transistors TrI are turned on to the wiring ISOU and supplying a potential by which the transistors TrI are turned off to the wiring ISOD, the sense amplifier block 520 can select the pair of bit lines BLUL and BLUR. By supplying a potential by which the transistors TrI are turned off to the wiring ISOU and supplying a potential by which the transistors TrI are turned on to the wiring ISOD, the sense amplifier block 520 can select the pair of bit lines BLDL and BLDR. As described above, by providing the transistors TrI in the sense amplifier block 520, reading and writing of the memory cell connected to the four bit lines BLUL, BLUR, BLDL, and BLDR can be performed.

In the memory device 500 illustrated in FIGS. 1A and 1B, FIG. 2, and FIG. 3, by providing the memory cell 510 above a layer included in the sense amplifier block 520, the sense amplifier block 520 and the memory cell 510 can be placed in the same region. Thus, the chip area can be reduced as compared to a conventional DRAM which uses a silicon transistor and in which a sense amplifier and a memory cell are placed in different regions.

If the capacitance of the capacitor C can be reduced in a conventional DRAM which uses a silicon transistor, preferable operation speed, power consumption, manufacturing yield, and the like can be obtained. The same applies to a memory device of one embodiment of the present invention. However, when the capacitance of the capacitor C is small, reading operation or data retention might be difficult in some cases. In the case where a memory device of one embodiment of the present invention and a conventional DRAM which uses a silicon transistor at the same capacitance of the capacitor C are compared, the memory device of one embodiment of the present invention has excellent reading performance and data retention characteristics. Therefore, the capacitance of the capacitor C can be further reduced, which is preferable. Such a case is described below.

As an index of influence on reading performance, a ratio between the bit line capacitance $C_{bit}$ and the capacitance Gore of the capacitor C can be used. The potential difference between a pair of bit lines obtained in the reading operation becomes larger as $C_{store}/C_{bit}$ is larger. Therefore, as $C_{store}/C_{bit}$ is larger, higher-speed or more stable reading operation can be realized. On the assumption that reading performance is the same, by reducing the bit line capacitance $C_{bit}$, the capacitance of the capacitor C can be reduced.

One of methods for reducing the bit line capacitance $C_{bit}$ is reducing the number of memory cells connected to the bit lines. The number of memory cells connected to the bit lines in a conventional DRAM using a silicon transistor is, for example, 64 to 256. Since the memory cells and sense amplifier blocks are arranged in different regions, when the number of memory cells connected to the bit lines is reduced to half on the assumption that the memory capacitance is the same, the necessary number of sense amplifier blocks is twice as much as that in the conventional DRAM; thus, the circuit area is increased. In the memory device of one embodiment of the present invention, the memory cells and the sense amplifier blocks can overlap with each other to be arranged in the same region. If the necessary number of sense amplifier blocks is twice as much as that in the conventional DRAM when the number of memory cells connected to the bit lines is reduced to half, the chip area is not changed as long as a region where the sense amplifier blocks are arranged is included in a region where the memory cells are arranged. Therefore, the number of memory cells connected to the bit lines can be reduced without an increase in the circuit area in some cases. Consequently, the bit line capacitance $C_{bit}$ can be reduced.

In the memory device of one embodiment of the present invention, the number of memory cells connected to the bit lines is further reduced by providing the transistors TrI. By providing the transistors TrI, each sense amplifier block is connected to the four bit lines BLUL, BLUR, BLDL, and BLDR in the memory device 500. Such a configuration is proposed for a conventional DRAM which uses a silicon transistor and in which memory cells and sense amplifier blocks are arranged in different regions. However, in the case where memory cells and sense amplifier blocks overlap with each other or the case where memory cells and sense amplifier blocks overlap with each other and the sense amplifier blocks are arranged two-dimensionally, an arrangement method, the number of wiring layers, wiring directions, and the like of a configuration in which four bit lines are connected to one sense amplifier block have not been proposed so far. The memory device of one embodiment of the present invention shows an example where an arrangement method, the number of wiring layers, wiring directions, and the like for connecting four bit lines to one sense amplifier block are used in the case where memory cells and sense amplifier blocks overlap with each other. For example, the configuration in which the four bit lines BLUL, BLUR, BLDL, and BLDR are connected to the sense amplifier 530 through the transistors TrI is realized in the memory device 500 illustrated in FIGS. 1A and 1B in such a manner that wirings using at least two layers of conductors are placed in the sense amplifier block 520 and a conductor functioning as a bit line is provided in a layer different from the two layers. Thus, in the memory device of one embodiment of the present invention, the number of memory cells connected to the bit lines can be reduced by connecting the four bit lines BLUL, BLUR, BLDL, and BLDR to each sense amplifier block 520. In the case where the areas of the sense amplifier blocks are the same, the number of memory cells connected to the bit lines can be reduced to approximately half as compared to a usual case where two bit lines are connected to each sense amplifier block. Consequently, the bit line capacitance $C_{bit}$ can be reduced.

Note that an object of using the transistors TrI in a conventional DRAM using a silicon transistor is to reduce the area of sense amplifier blocks. Since sense amplifier blocks and memory cells can overlap with each other in the same region in the memory device of one embodiment of the present invention, the chip area is not changed in some cases even when the area of the sense amplifier blocks is reduced.

An object of the memory device of one embodiment of the present invention is to closely arrange sense amplifier blocks in a region where memory cells are arranged and further reduce the bit line capacitance $C_{bit}$. In other words, effects and objects of the configuration using the transistors TrI are different between the memory device of one embodiment of the present invention and a conventional DRAM using a silicon transistor.

The memory device of one embodiment of the present invention is preferable because the bit line capacitance $C_{bit}$ can be reduced by arranging memory cells above the bit lines. In a conventional DRAM using a silicon transistor, the cross-over capacitance of bit lines and word lines and parasitic capacitance between the bit lines and the capacitor C largely contribute to bit line capacitance $C_{bit}$. When the bit lines are provided below the memory cells, the distance between the bit lines and the word lines or the capacitor is increased. Therefore, the cross-over capacitance of the bit lines and the word lines and parasitic capacitance between the bit lines and the capacitor C are reduced, which enables a reduction in the bit line capacitance $C_{bit}$. In the case where a silicon transistor is used as the transistor TrM included in a memory cell, it is difficult to form a wiring below the transistor in some cases. As the transistor TrM, a transistor which can be formed over an insulating surface is preferable because forming a wiring below the transistor is easily as compared to the case of using a silicon transistor. As the transistor TrM, a transistor including an oxide semiconductor (preferably an oxide including In, Ga, and Zn) in its channel formation region (also referred to as an oxide semiconductor transistor) can be used, for example.

In the memory device of one embodiment of the present invention, the bit lines may be provided above the transistor TrM included in the memory cell. The bit lines may be provided above the capacitor C. In the case where the bit lines are provided above the transistor TrM, the number of layers of conductors provided below the transistor TrM can be reduced. When the number of layers of conductors provided below the transistor TrM is reduced, an insulating surface over which the transistor TrM is formed can be further planalized in some cases, and thus, the transistor TrM can be formed more minutely.

As an index of influence on data retention characteristics, a drain current (also referred to as leakage current) of the transistor TrM in a non-conducting state is used. As the leakage current of the transistor TrM is smaller, charge accumulated in the capacitor C is held for a longer period; thus, the data retention period can be lengthened. As a result, the frequency of refresh operation can be reduced, and power consumed in the refresh operation can be reduced. In the memory device of one embodiment of the present invention, leakage current of the transistor TrM is preferably small. For example, the drain current of the transistor TrM in a non-conducting state is $1\times10^{-18}$ A or lower, preferably $1\times10^{-21}$ A or lower, further preferably $1\times10^{-24}$ A or lower at room temperature (approximately 25° C.), or $1\times10^{-15}$ A or lower, preferably $1\times10^{-18}$ A or lower, further preferably $1\times10^{-21}$ A or lower at 85° C. As an example of such a transistor, an oxide semiconductor transistor can be used.

As described above, in the memory device of one embodiment of the present invention, a reduction in bit line capacitance $C_{bit}$ and/or a reduction in leakage current of the transistor TrM can be achieved. Consequently, the capacitance of the capacitor C can be reduced. The capacitance of the capacitor C is, for example, lower than or equal to 10 fF, preferably lower than or equal to 5 fF, more preferably lower than or equal to 1 fF. In addition, the capacitance of the capacitor is preferably higher than parasitic capacitance of elements other than the capacitor. For example, the capacitance of the capacitor is higher than or equal to 0.1 fF. Thus, time required for charging the capacitor is shortened, which enables high-speed operation. Power consumption is reduced because energy stored in the capacitor is small. It is considered that each memory cell in a DRAM using a silicon transistor requires a capacitance of approximately 25 fF. However, miniaturization makes it difficult to such capacitors. This is because a stacked capacitor with a height of several micrometers or a trench capacitor with a depth of several micrometers needs to be formed. The memory device of one embodiment of the present invention can reduce the capacitance of the capacitor C; thus, the degree of difficulty in manufacturing storage capacitors is decreased and the yield is improved.

As the transistor TrM included in the memory cell, a transistor having high switching speed is preferably used. For example, the time required to switch a transistor is less than 10 ns, preferably less than 1 ns, more preferably less than 0.1 ns. Here, as an example of such a transistor, an oxide semiconductor transistor can be used in some cases.

Note that "a transistor has high switching speed" means that the time required to switch the transistor is short. The time required to switch the transistor means the time taken for the transistor to shift from a non-conducting state to a conducting state without load. The time can be regarded as time taken for an increase of a drain current of the transistor to compensate for an increase of charge accumulated in gate capacitance in response to a voltage applied to the gate. Alternatively, the time required to switch a transistor is expressed by $1/(2 \times f_T)$ in some cases, where $f_T$ is the maximum frequency (also called cutoff frequency) at which current gain becomes 1 or more when the transistor is used as an amplifier. Further alternatively, the time required to switch a transistor is expressed by $1/(2 \times f_{max})$ in some cases, where $f_{max}$ is the maximum frequency (also called the maximum oscillation frequency) at which power gain becomes 1 or more. As the power gain, unilateral power gain or maximum available power gain can be used.

Another example of a structure of a memory device of one embodiment of the present invention is described with reference to FIG. 4 and FIG. 5.

Figure 4:
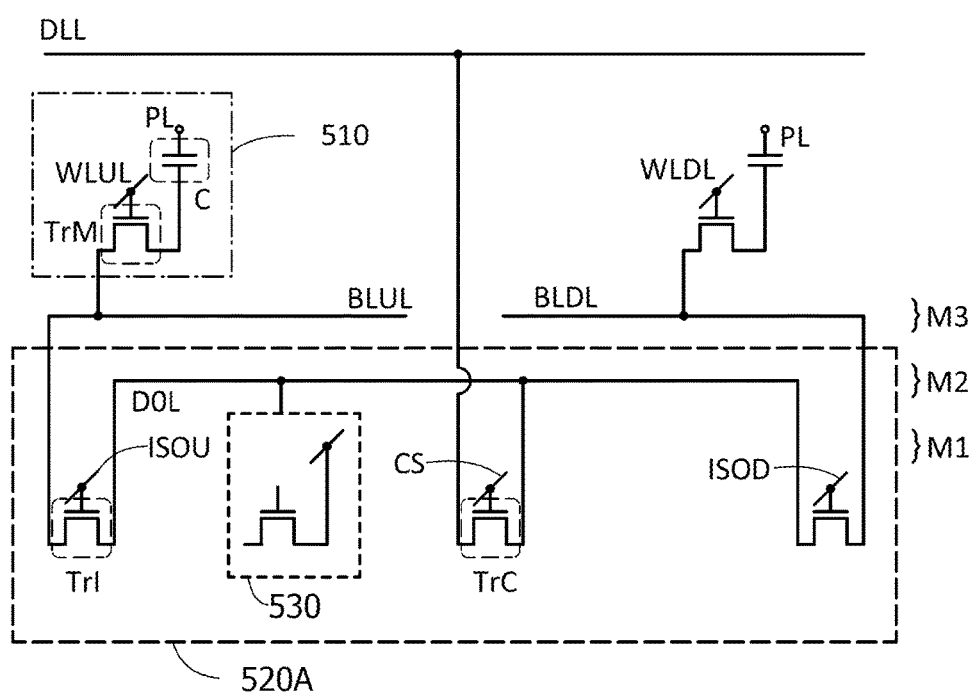
FIG. 4 is a schematic cross-sectional view of a memory device of one embodiment of the present invention.

FIG. 4 is a diagram schematically showing an example of a structure of a cross section of a memory device 500A. In FIG. 4, positions and connections of elements and wirings are schematically shown using circuit symbols. The up and down direction in the drawing is a direction perpendicular to a surface over which a circuit is formed (or the height direction of the surface). FIG. 5 is a plan view schematically showing an example of a structure of the memory device 500A. FIG. 5 schematically illustrates regions, wirings, connection portions, and the like, and the up and down direction and the right and left direction show different horizontal directions (directions parallel to the surface over which the circuit is formed). Note that in FIG. 4 and FIG. 5, some components such as a transistor and a wiring are not illustrated for easy understanding.

Figure 5:
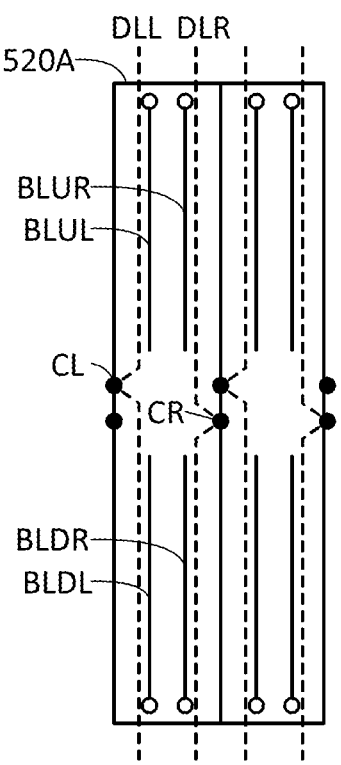
FIG. 5 is a schematic top view of a memory device of one embodiment of the present invention.

The memory device 500A illustrated in FIG. 4 and FIG. 5 includes a sense amplifier block 520A, the bit lines BLUL, BLUR, BLDL, and BLDR, the word lines WLUL and WLDL, the memory cell 510, the data lines DLL and DLR, and the wirings ISOU, ISOD, and CS. The memory device 500A illustrated in FIG. 4 has a structure similar to that of the memory device 500 illustrated in FIGS. 1A and 1B, and is different from the memory device 500 in a structure of a connection portion where a conductor in a third layer used for the bit lines BLUL, BLUR, BLDL, and BLDR is connected to the conductor in a lower layer (hereinafter, also referred to as a connection portion of the bit line) and a structure of a connection portion where a conductor used for a data line is connected to a conductor in a lower layer (hereinafter, also referred to as a connection portion of the data line). These structures are schematically illustrated.

In this specification, a connection portion between a conductor A and a conductor B means a portion where the conductor A and the conductor B are connected to each other. For example, in the case where the conductor A and the conductor B are directly connected to each other, a region where the conductor A and the conductor B are connected to each other is a connection portion. For example, in the case where the conductor A and the conductor B are connected to each other through a conductor C and a conductor D, the conductor C and/or the conductor D is a connection portion. In the case where a portion to which the conductor A is connected is clear, a portion which connects the conductor A and the portion to which the conductor A is connected is simply referred to as a connection portion of the conductor A.

In the memory device of one embodiment of the present invention, the conductor in the second layer having a function of the wiring D0L (or D0R) extends in the second direction (direction in which the bit lines extend). Two connection portions of the bit lines and one connection portion of the data line are provided across the conductor in the second layer because the connection portions are each connected to a source or a drain of the transistor TrI or TrC. Therefore, these connection portions need to be provided so as to avoid the conductor in the second layer extending in the second direction. At this time, when a region of the sense amplifier block is freely spread and these connection portions are provided, the chip area is increased in some cases. It is important how these connection portions are provided so as to avoid the conductor in the second layer.

In the memory device 500A illustrated in FIG. 4, the connection portions of the bit lines BLUL and BLDL are provided in a region where the wiring D0L is not provided in the second direction. The connection portion of the data line DLL is provided in a region where the bit lines BLUL and BLDL are not provided and a region where the wiring D0L is provided in the second direction. The connection portion of the data line DLL is provided so as to avoid the wiring D0L in the first direction (direction in which the word lines extend).

The memory device 500A illustrated in FIG. 4 is only partly different from the memory device 500 illustrated in FIGS. 1A and 1B. Therefore, the description of the memory device 500 illustrated in FIGS. 1A and 1B can be referred to for the cross-sectional structure as appropriate.

FIG. 5 is a plan view schematically showing an example of a structure of the memory device 500A illustrated in FIG. 4. FIG. 5 schematically illustrates positions of the sense amplifier block 520A, the four bit lines BLUL, BLUR, BLDL, and BLDR, the data lines DLL and DLR, the connection portions of the bit lines (denoted by white circles (○)), the connection portions CL and CR of the data lines (denoted by black circles (●)), and the like. In the memory device 500A illustrated in FIG. 5, two sense amplifier blocks 520A are adjacent in the first direction.

In the memory device 500A illustrated in FIG. 5, the four bit lines BLUL, BLUR, BLDL, and BLDR are arranged in two rows and two columns so that the bit lines BLUL and BLUR are adjacent to each other and the two bit lines BLDL and BLDR are adjacent to each other. In other words, the bit lines BLUL and BLUR are adjacent to each other in the first direction, the two bit lines BLDL and BLDR are adjacent to each other in the first direction, the bit lines BLUL and BLDL are adjacent to each other in the second direction, and the two bit lines BLUR and BLDR are adjacent to each other in the second direction. In the memory device 500A illustrated in FIG. 5, the sense amplifier block 520A is provided in a region including with a width or two bit lines in the first direction and a length of two bit lines in the second direction.

In the memory device 500A, the sense amplifier blocks 520A and the bit lines BLUL, BLUR, BLDL, and BLDR can be arranged two-dimensionally and regularly as described above. In other words, the sense amplifier blocks 520A and the four bit lines BLUL, BLUR, BLDL, and BLDR can be arranged in array at a pitch of a first distance in the first direction and at a pitch of a second distance in the second direction. For example, the first distance is longer than or equal to a width which is double to the width of the bit line and shorter than or equal to twice the width. For example, the second distance is longer than or equal to twice the length of the bit line and shorter than or equal to four times the length of the bit line.

The bit lines are arranged two-dimensionally at an average pitch of the first distance in the first direction and at an average pitch of the second distance in the second direction. In that case, the sense amplifier blocks 520A can be arranged two-dimensionally at a pitch that is two times a third distance in the first direction and at a pitch that is one time the second distance in the second direction, for example. In other words, when bit lines are arranged two-dimensionally, a width of k bit lines means a width that is k times the average width occupied by one bit line (k is an integer of 1 or more). The sense amplifier blocks 520A can be arranged two-dimensionally and regularly at a pitch that is two times the pitch of the bit line in the first direction and at a pitch that is two times the pitch of the bit line in the second direction, for example.

In the schematic top view illustrated in FIG. 5, the connection portions of the bit lines are provided on the extension of the bit lines BLUL, BLUR, BLDL, and BLDR. Accordingly, the connection portions of the bit lines can be provided without an increase in the width of the sense amplifier block 520A in the first direction. The connection portions of the data lines are provided between the bit line pairs (BLUL and BLUR) and (BLDL and BLDR) which are adjacent to each other in the second direction. The two connection portions CL and CR of the data lines are provided at both end portions of the sense amplifier block 520A in the first direction and are provided at positions shifted from each other in the second direction. Thus, the connection portions of the data lines included in the adjacent sense amplifier blocks 520A can be provided side by side in the second direction. Thus, an increase in the width of the sense amplifier block 520A in the first direction can be suppressed. Note that in the schematic top view of FIG. 5, the connection portions of the data lines are not provided on the extension of the bit lines BLUL, BLUR, BLDL, and BLDR because the conductor in the second layer having functions of the wirings D0L and D0R extend below the bit lines BLUL, BLUR, BLDL, and BLDR. The connection portions of the data lines or a portion across the conductor in the second layer of the connection portions of the data lines are provided at end portions in the first direction of the sense amplifier block 520A so as to avoid the wirings D0L and D0R.

The width in the first direction is described. In the memory device 500A illustrated in FIG. 4 and FIG. 5, the connection portions of the data lines are provided so as to avoid the conductor in the second layer functioning as the wirings D0L and D0R in the first direction. For example, the connection portions can be formed by providing plugs in the conductor in the second layer. In that case, the width is increased in the first direction by the widths and intervals of the conductors in the second layer. For example, the conductor in the first layer and the conductor in the third layer can be directly connected through via holes without providing plugs in the conductor in the second layer. In that case, an increase due to the conductor in the second layer is small. In addition, by not providing the conductor in the third layer functioning as the bit lines in the connection portions, plugs using the conductor in the third layer can be provided without an increase in the width in the first direction. Thus, the width in the first direction can be small as compared to the case where plugs using the conductor in the second layer are provided, which is preferable.

The width in the second direction is described. As described above, bit lines are not provided in a region in which a connection portion which needs to avoid the conductor in the second layer, in some cases. When there are many such connection portions, an increase in the width in the second direction (a direction in which the bit lines extend) is required. In the memory device 500A illustrated in FIG. 4 and FIG. 5, the connection portions of the bit lines do not need to be provided so as to avoid the conductor in the second layer functioning as the wirings D0L and D0R in the first direction and only the connection portions of the data lines are provided so as to avoid the conductor in the second layer in the first direction. Thus, the width in the second direction of the sense amplifier block 520A can be small and the area can also be small, which is preferable.

In the memory device 500A illustrated in FIG. 4 and FIG. 5, the connection portions of the bit lines are provided at the end portions of the sense amplifier block 520A. For example, when the sense amplifier block 520A has a structure in which circuits other than the transistor TrI are not directly connected to the bit lines BLUL, BLUR, BLDL, and BLDR as illustrated in FIG. 19A, the connection portions of the bit lines are preferably provided at the end portions of the conductor in the third layer functioning as the bit lines BLUL, BLUR, BLDL, and BLDR, and are preferably provided at the end portions of the sense amplifier block 520A.

The connection portions of the bit lines are not necessarily provided at the end portions of the sense amplifier block 520A. For example, when the sense amplifier block 520A has a structure in which circuits other than the transistor TrI (e.g., a precharge circuit) are directly connected to the bit lines BLUL, BLUR, BLDL, and BLDR as illustrated in FIG. 19B, the circuits are preferably arranged at the end portions of the sense amplifier block 520A. The connection portions of the bit lines are preferably arranged on the inner side than the circuits.

In the memory device 500A illustrated in FIG. 4 and FIG. 5, the connection portions of the data lines are provided in the vicinity of the center portion in the second direction of the sense amplifier block 520A. Thus, the lengths of the four bit lines BLUL, BLUR, BLDL, and BLDR can be made the same. This is preferable because the bit line capacitance can be the same and thus, stable reading operation is carried out.

Although the sense amplifier block is rectangular in the schematic top view of the memory device illustrated in FIG. 5, this is a schematic view and does not show that the sense amplifier block is placed in a rectangular region. The sense amplifier block may be provided in a region which includes an element included in the sense amplifier and which does not overlap with adjacent sense amplifier blocks.

With the above structure, the sense amplifier blocks, the bit lines, the connection portions of the bit lines, and the connection portions of the data lines can be provided in the memory device 500A efficiently and two-dimensionally.

Another example of a structure of a memory device of one embodiment of the present invention is described with reference to FIG. 6 and FIG. 7.

Figure 6:
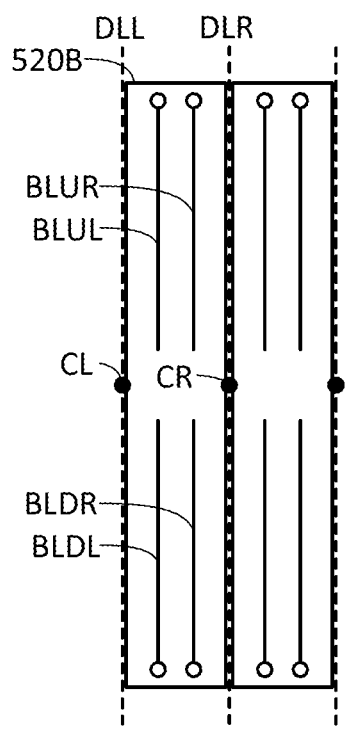
FIG. 6 is a schematic top view of a memory device of one embodiment of the present invention.

FIG. 6 is a diagram schematically illustrating an example of a structure of a memory device 500B seen from the above. The memory device 500B illustrated in FIG. 6 is different from the memory device 500A illustrated in FIG. 5 in the data lines and the structure of the connection portions of the data lines. In the memory device 500B illustrated in FIG. 6, the sense amplifier blocks 520B which are adjacent to each other in the first direction share the connection portions of the data lines. Accordingly, the number of connection portions of the data lines is reduced to half that of the memory device 500A illustrated in FIG. 5. With such a structure, the interval between the bit line pairs (BLUL and BLUR) and (BLDL and BLDR) which are adjacent to each other in the second direction can be shorter than that of the memory device 500A illustrated in FIG. 5. Accordingly, the width of the sense amplifier block 520B in the second direction can be small and the area can also be small in some cases.

The number of data lines can be reduced to half that of the memory device 500A illustrated in FIG. 5. By reducing the number of data lines, the width of or the interval between the data lines can be increased. For example, the data lines are arranged at a pitch that is two times the pitch of the bit line in the first direction. The data lines cannot be formed in some cases unless the data lines are positioned above the memory cells and have a larger width or interval than the bit lines. In such a case, an increase in the width of the memory device 500B in the first direction due to limitation on the width of or the interval between the data lines is not necessary, which is preferable. The number of data lines which operate at the same time is reduced; thus, power consumption due to charge/discharge of the data lines can be reduced.

The memory device 500B illustrated in FIG. 6 is only partly different from the memory device 500A illustrated in FIG. 5. Therefore, the description of the memory device illustrated in FIG. 5 can be referred to for the other components of the memory device 500B seen from the above as appropriate.

Figure 7:
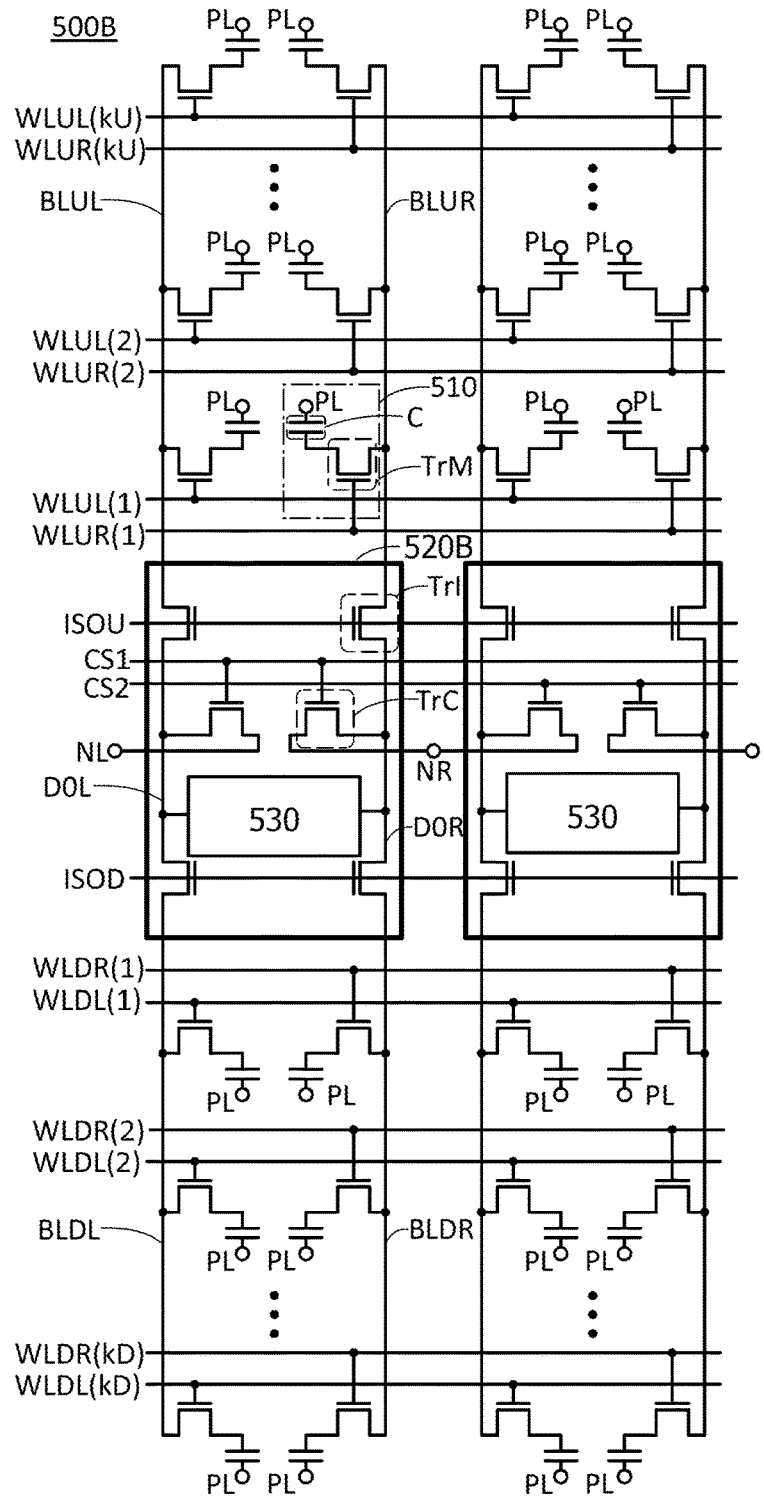
FIG. 7 is a circuit diagram of a memory device of one embodiment of the present invention.

FIG. 7 illustrates an example of a circuit configuration of the memory device 500B illustrated in FIG. 6. In the memory device 500B illustrated in FIG. 7, two adjacent sense amplifier blocks 520B share the terminal NL or NR. The terminal NL or NR and the wiring D0L or D0R are connected to each other through the transistor TrC. A gate of the transistor TrC is connected to the wiring CS1 or CS2. One of gates of two transistors TrC connected to the same terminal NL is connected to the wiring CS1 and the other thereof is connected to the wiring CS2. In the case where the transistors TrC included in one of the adjacent sense amplifier blocks 520B are connected to the wiring CS1, the transistors TrC included in the other thereof are connected to the wiring CS2. Such a configuration can reduce the number of data lines and the number of connection portions of data lines.

The circuit configuration of the memory device 500B illustrated in FIG. 7 is only partly different from the circuit configuration of the memory device 500 illustrated in FIG. 3. Therefore, the description of the circuit configuration of the memory device 500 illustrated in FIG. 3 can be referred to for memory cells, bit lines, and other wirings as appropriate.

Next, a detailed structure example of a memory device 500C of one embodiment of the present invention is described with reference to FIGS. 8A to 8E, FIG. 9, and FIG. 10.

Note that in FIGS. 8A to 8E, FIG. 9, and FIG. 10, some components such as an insulator are omitted for easy understanding, and a conductor and the like formed in the same layer are shown with the same hatching pattern.

Figure 8:
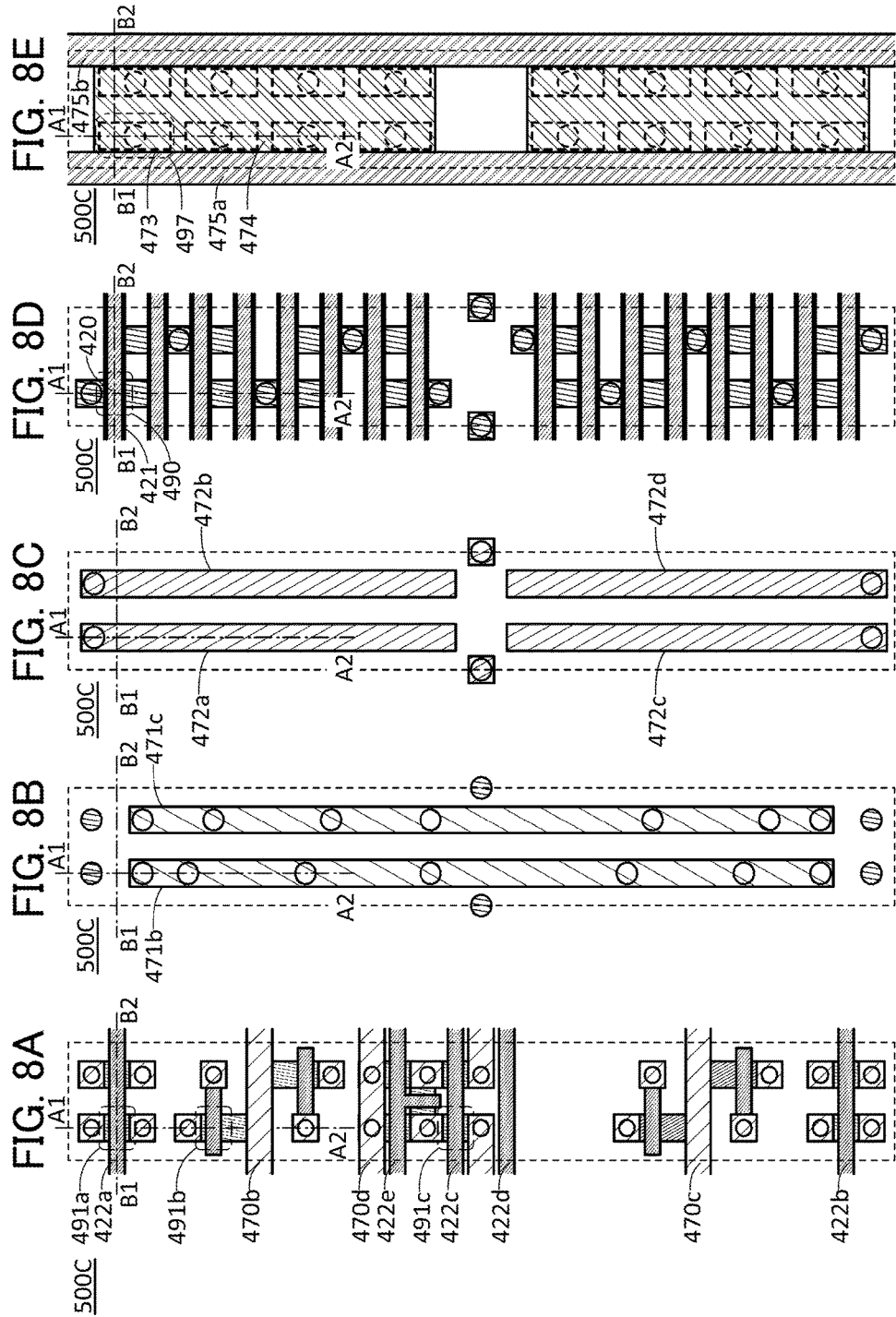
FIGS. 8A to 8E are top views of a memory device of one embodiment of the present invention.

FIGS. 8A to 8E are top views illustrating an example of the structure of the memory device 500C. The memory device 500C is a specific example of the memory device 500B illustrated in FIG. 6. The memory device 500C has the circuit configurations illustrated in FIG. 7 and FIG. 19A. FIG. 8A is a top view of a region including the transistor TrC and a conductor in a first layer; FIG. 8B is a top view of a region including a conductor in a second layer functioning as the wirings D0L and D0R; FIG. 8C is a top view of a region including a conductor in a third layer functioning as bit lines; FIG. 8D is a top view of a region including the transistor TrM; and FIG. 8E is a top view of a region including the capacitor C and data lines.

Figure 9:
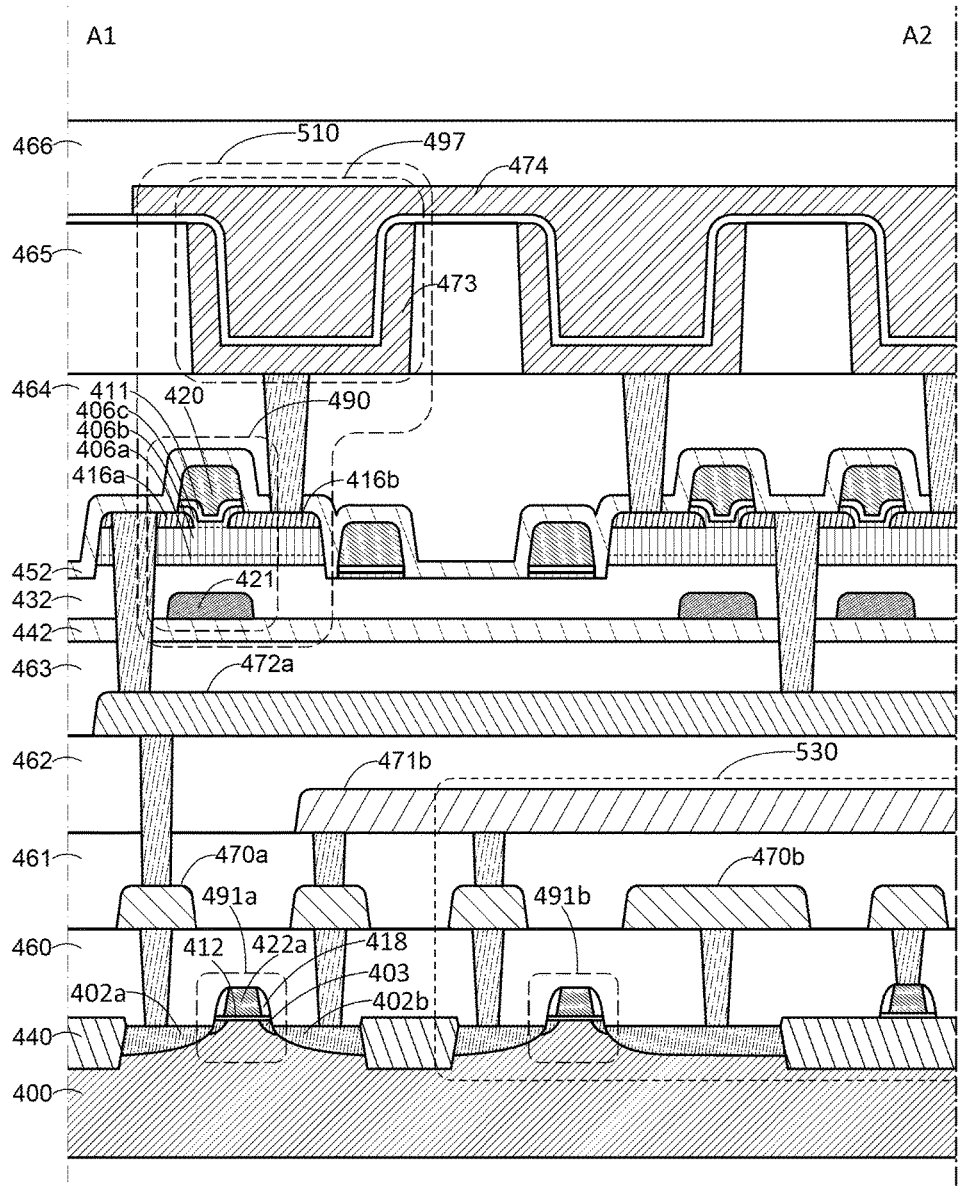
FIG. 9 is a cross-sectional view of a memory device of one embodiment of the present invention.
Figure 10:
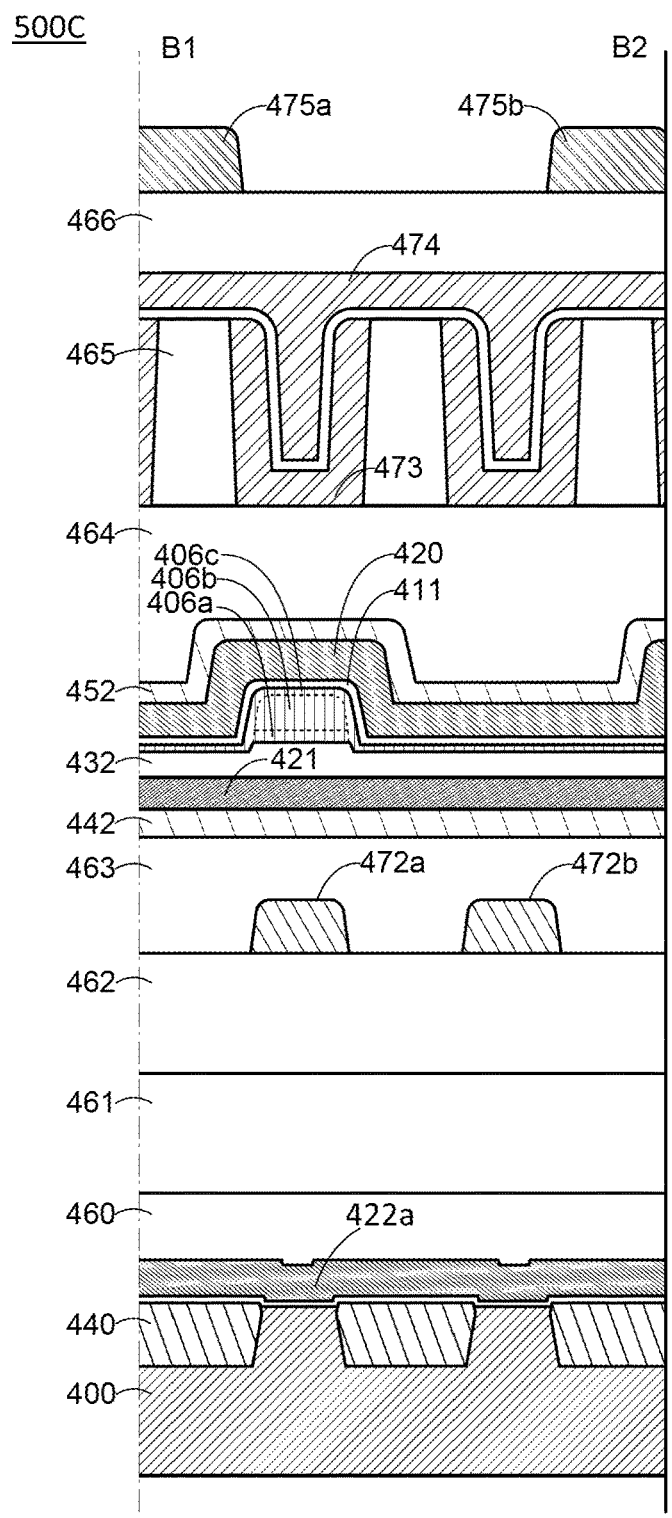
FIG. 10 is a cross-sectional view of a memory device of one embodiment of the present invention.

FIG. 9 and FIG. 10 are cross-sectional views illustrating an example of the structure of the memory device 500C illustrated in FIGS. 8A to 8E. FIG. 9 illustrates a cross section taken along dashed-dotted line A1-A2 in FIGS. 8A to 8E, and FIG. 10 illustrates a cross section taken along line B1-B2 in FIGS. 8A to 8E.

The memory device 500C illustrated in FIGS. 8A to 8E, FIG. 9, and FIG. 10 includes a transistor 490, a transistor 491a, a transistor 491b, a transistor 491c, and a capacitor 497. The transistors and the capacitor are connected to each other through a plurality of conductors as appropriate to form part of the circuit illustrated in FIG. 7 and FIG. 19A. In this example, an oxide semiconductor transistor is used as the transistor 490 and silicon transistors are used as the transistors 491a to 491c.

The structure of the memory device 500C illustrated in FIGS. 8A to 8E is compared to the structure of the memory device illustrated in FIG. 7 and FIG. 19A. In the top view of FIG. 8A, the transistor 491a corresponds to the transistor TrI; the transistor 491b is an n-channel transistor included in a sense amplifier; the transistor 491c corresponds to the transistor TrC; a conductor 422a corresponds to the wiring ISOU; a conductor 422b corresponds to the wiring ISOD; a conductor 470b corresponds to the wiring NACT; a conductor 470c corresponds to the wiring PACT; a conductor 422e corresponds to the wiring EQ; a conductor 470d corresponds to the wiring PC; a conductor 422c corresponds to the wiring CS1; and a conductor 422d corresponds to the wiring CS2. In the top view of FIG. 8B, a conductor 471b corresponds to the wiring D0L; and a conductor 471c corresponds to the wiring D0R. In the top view of FIG. 8C, a conductor 472a corresponds to the bit line BLUL; a conductor 472b corresponds to the bit line BLUR; a conductor 472c corresponds to the bit line BLDL; and a conductor 472d corresponds to the bit line BLDR. In the top view of FIG. 8D, the transistor 490 corresponds to the transistor TrM; and the conductor 420 or the conductor 421 corresponds to the word line WLUL(1). In the top view of FIG. 8E, the capacitor 497 corresponds to the capacitor C; conductors 473 and 474 function as electrodes of the capacitor C; the conductor 474 functions as a wiring connected to the terminal PL; a conductor 475a corresponds to the data line DLL; and a conductor 475b corresponds to the data line DLR.

The structure of the memory device 500C is described using the cross-sectional views of FIG. 9 and FIG. 10. The memory device 500C includes a substrate 400, the transistors 491a and 491b, an insulator 460 on the transistors 491a and 491b, a conductor 470a and the conductor 470b on the insulator 460, an insulator 461 on the insulator 460 and the conductors 470a and 470b, the conductor 471b on the insulator 461, an insulator 462 on the insulator 461 and the conductor 471b, the conductors 472a and 472b on the insulator 462, an insulator 463 on the insulator 462 and the conductors 472a and 472b, an insulator 442 on the insulator 463, the transistor 490 over the insulator 442, an insulator 452 on the transistor 490, an insulator 464 on the insulator 452, the capacitor 497 on the insulator 464, an insulator 466 on the capacitor 497, and the conductors 475a and 475b on the insulator 466. Another one or more of layers of insulators or conductors may be provided over the insulator 466 and the conductors 475a and 475b. Openings are provided in the insulators 460, 461, 462, 463, 442, 452, 464, and 465 as appropriate, and the conductors are provided in the openings. The conductors 470a and 470b are conductors in the first layer. The conductor 471b is a conductor in the second layer. The conductors 472a and 472b are conductors in the third layer.

In the memory device 500C illustrated in FIGS. 8A to 8E, FIG. 9, and FIG. 10, the wiring D0L (conductor 471b) and the bit line BLUL (conductor 472a) are formed in different layers and thus can be connected to each other through only the transistor 491a. Accordingly, the bit lines can be chosen as appropriate and the four bit lines BLUL, BLUR, BLDL, and BLDR can be connected to the sense amplifier block.

In the memory device 500C illustrated in FIGS. 8A to 8E, FIG. 9, and FIG. 10, the number of memory cells connected to each bit line BLUL, BLUR, BLDL, or BLDR is 4. The number of memory cells connected to the bit line can be 3 to 32. Accordingly, bit line capacitance can be reduced and the capacitance of the capacitor C can also be reduced. The memory device 500C is preferable in terms of operation speed, power consumption, manufacturing yield, and the like.

In the memory device 500C illustrated in FIGS. 8A to 8E, FIG. 9, and FIG. 10, in the connection portions of the data lines, the conductor in the first layer and the conductor in the third layer are directly connected to each other through via holes. Connection portions between the conductor in the third layer and the conductors in the lower layers are the connection portions of the bit lines and the connection portions of the data lines, and both connection portions are formed using via holes. Such a structure can suppress an increase in the width of the memory device 500C in the first direction. In addition, a step for connecting the conductor in the second layer and the conductor in the third layer is not necessary.

In the memory device 500C illustrated in FIGS. 8A to 8E, FIG. 9, and FIG. 10, the number of connection portions of the data lines and the number of data lines can be reduced because adjacent sense amplifier blocks share the connection portions of the data lines. Thus, the width of the memory device 500C in the second direction can be reduced, the width of and interval between the data lines can be larger than those of the bit lines, and power consumption due to charging and discharging the data lines can be reduced.

In the memory device 500C illustrated in FIGS. 8A to 8E, FIG. 9, and FIG. 10, the pitch of the sense amplifier block in the first direction can be twice to four times, preferably twice to three times the width of the memory cell in the first direction. The pitch of the sense amplifier block in the second direction can be, for example, 6 to 64 times, preferably 8 to 32 times the width of the memory cell in the second direction.

The transistor 491a, the transistor 490, the substrate 400, and the insulators included in the memory device 500C illustrated in FIGS. 8A to 8E, FIG. 9, and FIG. 10 are described.

The structure of the transistor 491a illustrated in FIG. 9 is described.

The transistor 491a includes an insulator 412 over the substrate 400; the conductor 422a over the insulator 412; an insulator 418 in contact with a side surface of the conductor 422a; regions 402a and 402b in the substrate 400 which do not overlap with the conductor 422a and the insulator 418; and a region 403 which overlaps with the insulator 418.

The insulator 412 serves as a gate insulator of the transistor 491a. The conductor 422a serves as a gate of the transistor 491a. The insulator 418 serves as a sidewall insulator (also referred to as a sidewall) of the conductor 422a. The regions 402a and 402b serve as a source and a drain of the transistor 491a. The region 403 serves as a lightly doped drain (LDD) region of the transistor 491a.

The region 403 can be formed by adding an impurity using the conductor 422a as a mask. After that, the insulator 418 is formed and an impurity is added using the conductor 422a and the insulator 418 as masks, so that the regions 402a and 402b can be formed. Therefore, in the case where the regions 403, 402a, and 402b are formed by adding the same kind of impurities, the region 403 has a lower impurity concentration than the regions 402a and 402b.

When the transistor 491a includes the region 403, a short-channel effect can be suppressed. Therefore, the structure of the transistor 491a is suitable for miniaturization.

The transistor 491a is kept away from another transistor provided in the substrate 400 by an insulator 440 or the like. Although an example where the insulator 440 is formed by a shallow trench isolation (STI) method is shown, one embodiment of the present invention is not limited thereto. For example, instead of the insulator 440, an insulator formed by a local oxidation of silicon (LOCOS) method may be used so that transistors are separated from each other.

The structure of the transistor 490 in FIG. 9 will be described.

As illustrated in FIG. 9, the transistor 490 includes the conductor 421, an insulator 432 over the conductor 421, a semiconductor 406a over the insulator 432, a semiconductor 406b over the semiconductor 406a, conductors 416a and 416b in contact with a top surface of the semiconductor 406b, a semiconductor 406c in contact with a side surface of the semiconductor 406a, top and side surfaces of the semiconductor 406b, top and side surfaces of the conductor 416a, and top and side surfaces of the conductor 416b, an insulator 411 over the semiconductor 406c, and the conductor 420 over the insulator 411.

The conductor 420 serves as a first gate of the transistor 490. The insulator 411 serves as a gate insulator of the transistor 490. The conductor 421 serves as a second gate of the transistor 490. The insulator 432 serves as a gate insulator of the transistor 490. The conductor 416a and the conductor 416b serve as a source and a drain of the transistor 490. The semiconductor 406b serves as a channel formation region.

The conductor 420 and the conductor 421 serve as gate electrodes of the transistor 490, and may be supplied with different potentials. For example, by applying a negative or positive gate voltage to the conductor 421, the threshold voltage of the transistor 490 may be controlled. The conductor 421 is not necessarily provided.

The conductor 420 electrically surrounds the semiconductor 406b in the channel width direction, that is, surrounds not only the top surface but also the side surfaces of the semiconductor 406b. Such a structure of a transistor is referred to as a surrounded channel (s-channel) structure.

When the transistor 490 has an s-channel structure, the channel formation region can be easily controlled by a gate electric field applied to the side surface side of the semiconductor 406b. The structure where the conductor 420 reaches below the semiconductor 406b is preferable because higher controllability can be achieved. Consequently, the subthreshold swing (also referred to as S value) of the transistor 490 can be decreased, so that a short-channel effect of the transistor 490 can be suppressed. Therefore, the structure of the transistor 490 is suitable for miniaturization.

Accordingly, favorable electrical characteristics can be obtained even when the transistor 490 is miniaturized. For example, the channel length of the transistor 490 is preferably less than or equal to 40 nm, further preferably less than or equal to 30 nm, still further preferably less than or equal to 20 nm and the channel width of the transistor 490 is preferably less than or equal to 40 nm, further preferably less than or equal to 30 nm, still further preferably less than or equal to 20 nm. With miniaturization of the transistor, the area of the memory device can be reduced.

When the transistor 490 has an s-channel structure, a channel might be formed in the entire semiconductor 406b (bulk). Therefore, as the semiconductor 406b has a larger thickness, a channel formation region becomes larger. For example, the semiconductor 406b has a region with a thickness of greater than or equal to 20 nm, preferably greater than or equal to 40 nm, more preferably greater than or equal to 60 nm, still more preferably greater than or equal to 100 nm. Note that the semiconductor 406b has a region with a thickness of, for example, less than or equal to 300 nm, preferably less than or equal to 200 nm, more preferably less than or equal to 150 nm because the productivity of the semiconductor device might be decreased. With this structure in the s-channel structure, a large amount of current can flow between the source and the drain of the transistor, so that a high current in an on state (on-state current) can be achieved.

As a result, the switching speed of the transistor can be increased in some cases. For example, the time required to switch the transistor is shorter than 10 ns, preferably shorter than 1 ns, and more preferably shorter than 0.1 ns.

When the transistor 490 is an accumulation-type transistor whose majority carriers are electrons, an electric field extending from the source and the drain to the channel formation region is easily shielded within a short distance; thus, carriers can be easily controlled with a gate electric field even when the channel is short. Accordingly, favorable electrical characteristics can be obtained even when the transistor is miniaturized.

Unlike in the case of using a semiconductor substrate as a channel formation region, when the transistor 490 is formed over an insulating surface, parasitic capacitance is not formed between the gate and the body or the semiconductor substrate and thus, carriers can be easily controlled with a gate electric field. Accordingly, favorable electrical characteristics can be obtained even when the transistor is miniaturized.

In the transistor 490, the conductors 416a and 416b are not in contact with the side surfaces of the semiconductor 406b. Thus, an electric field applied from the conductor 420 functioning as a gate to the side surfaces of the semiconductor 406b is less likely to be blocked by the conductor 416a and the conductor 416b. Moreover, the conductors 416a and 416b are not in contact with a top surface of the insulator 432. Thus, excess oxygen (oxygen) released from the insulator 432 is not consumed to oxidize the conductors 416a and 416b. Accordingly, excess oxygen (oxygen) released from the insulator 432 can be efficiently used to reduce oxygen vacancies in the semiconductor 406b.

In the transistor 490, at least part (or all) of the conductor 416a (and/or the conductor 416b) is in contact with at least part (or all) of a surface, a top surface, and/or a bottom surface of a semiconductor layer, e.g., the semiconductor 406b. The contact portion of the semiconductor 406b, in which donor levels are formed by entry of hydrogen into oxygen vacancy sites in some cases, includes an n-channel conductive region. A state in which hydrogen enters sites of oxygen vacancies are denoted by VoH in some cases. Because of current flow in the n-channel conductive region, a high on-state current can be achieved.

In the transistor 490, it is effective to reduce the concentration of impurities in the semiconductor 406b to make the oxide semiconductor intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$. In the oxide semiconductor, hydrogen, nitrogen, carbon, silicon, and metal elements that are not main components are impurities. For example, hydrogen and nitrogen form donor levels to increase the carrier density.

A transistor including a substantially intrinsic oxide semiconductor has a low carrier density and thus rarely has negative threshold voltage. In addition, because of few carrier traps in the oxide semiconductor, the transistor including the oxide semiconductor has small variation in electrical characteristics and high reliability. Moreover, a transistor including the oxide semiconductor enables an extremely low off-state current.

For example, the drain current at the time when the transistor including the oxide semiconductor is off can be less than or equal to $1\times10^{-18}$ A, preferably less than or equal to $1\times10^{-21}$ A, further preferably less than or equal to $1\times10^{-24}$ A at room temperature (approximately 25° C.); or less than or equal to $1\times10^{-15}$ A, preferably less than or equal to $1\times10^{-18}$ A, further preferably less than or equal to $1\times10^{-21}$ A at 85° C. The off state of a transistor refers to a state where the gate voltage is lower than the threshold voltage in an n-channel transistor.

The three-layer structure of the semiconductor in the transistor 490 illustrated in FIG. 9 is an example. For example, a two-layer structure without the semiconductor 406a or the semiconductor 406c may be employed. A four-layer structure in which any one of the semiconductors described as examples of the semiconductor 406a, the semiconductor 406b, and the semiconductor 406c is provided under or over the semiconductor 406a or under or over the semiconductor 406c may be employed. An n-layer structure (n is an integer of 5 or more) in which any one of the semiconductors described as examples of the semiconductor 406a, the semiconductor 406b, and the semiconductor 406c is provided at two or more of the following positions: over the semiconductor 406a, under the semiconductor 406a, over the semiconductor 406c, and under the semiconductor 406c.

One of a source and a drain of the transistor 490 (conductor 416a) and one of a source and a drain of the transistor 491a (region 402a) are connected to each other through the conductor 470a and the conductor 472a.

The substrate 400 and the insulators illustrated in FIG. 9 and FIG. 10 are described.

The substrate 400 is a single crystal silicon substrate. The substrate 400 may be a semiconductor substrate including a single-material semiconductor of silicon, germanium, or the like or a compound semiconductor of silicon carbide, silicon germanium, gallium arsenide, gallium nitride, indium phosphide, zinc oxide, gallium oxide, or the like, for example. For the semiconductor substrate, an amorphous semiconductor or a crystalline semiconductor may be used, and examples of the crystalline semiconductor include a single crystal semiconductor, a polycrystalline semiconductor, and a microcrystalline semiconductor. Alternatively, the substrate 400 may be a glass substrate. Further alternatively, the substrate 400 may be an element substrate in which a semiconductor element is formed on a semiconductor substrate or a glass substrate.

The insulator 432 is preferably an insulator containing excess oxygen.

The insulator containing excess oxygen means an insulator from which oxygen is released by heat treatment, for example. Silicon oxide containing excess oxygen means silicon oxide from which oxygen can be released by heat treatment or the like, for example. Therefore, the insulator 432 is an insulator in which oxygen can be moved. In other words, the insulator 432 may be an insulator having an oxygen-transmitting property. For example, the insulator 432 may be an insulator having a higher oxygen-transmitting property than the semiconductor positioned over the insulator 432.

The insulator containing excess oxygen has a function of reducing oxygen vacancies in the semiconductor positioned over the insulator, in some cases. Such oxygen vacancies form the density of state (DOS) in the semiconductor and serve as hole traps or the like. In addition, hydrogen comes into the site of such an oxygen vacancy and forms an electron serving as a carrier. Thus, by a reduction in oxygen vacancies in the semiconductor, the transistor can have stable electrical characteristics.

The insulator 442 is provided between the transistors 491a and 491b and the transistor 490. As the insulator 442, an oxide containing aluminum, e.g., aluminum oxide, is used. The insulator 442 blocks oxygen and hydrogen, and aluminum oxide whose density is lower than 3.2 g/cm$^3$ is preferable because it has a particularly high function of blocking hydrogen. Alternatively, aluminum oxide with low crystallinity is preferable because its function of blocking hydrogen is particularly high.

For example, in the case where the transistor 491a and the transistor 491b are silicon transistors, electrical characteristics of the transistor may be improved because dangling bonds of silicon can be reduced by supplying hydrogen from the outside. The supply of hydrogen is performed by, for example, providing an insulator containing hydrogen in the vicinity of the silicon transistor and performing heat treatment to diffuse and supply the hydrogen to the silicon transistor.

An insulator containing hydrogen may release hydrogen, the amount of which is larger than or equal to $1\times10^{18}$ atoms/cm$^3$, larger than or equal to $1\times10^{19}$ atoms/cm$^3$, or larger than or equal to $1\times10^{20}$ atoms/cm$^3$ in thermal desorption spectroscopy (TDS) analysis (converted into the number of hydrogen atoms) in the range of a surface temperature of 100° C. to 700° C. or 100° C. to 500° C.

Out of hydrogen diffused from the insulator containing hydrogen, a small amount of hydrogen reaches the transistor 490 because the insulator 442 has a function of blocking hydrogen. Hydrogen serves as a carrier trap or a carrier generation source in an oxide semiconductor and causes deterioration of electrical characteristics of the transistor 490 in some cases. Therefore, blocking hydrogen by the insulator 442 is important to improve performance and reliability of the semiconductor device.

On the other hand, for example, by supplying oxygen to the transistor 490 from the outside, oxygen vacancies in the oxide semiconductor can be reduced; thus, electrical characteristics of the transistor are improved in some cases. The supply of oxygen may be performed by heat treatment under an atmosphere containing oxygen, for example. Alternatively, for example, an insulator containing excess oxygen (oxygen) is provided in the vicinity of the transistor 490 and heat treatment is performed, so that the oxygen may be diffused and supplied to the transistor 490. Here, an insulator containing excess oxygen is used as the insulator 432.

The diffused oxygen might reach the silicon transistor through layers; however, since the insulator 442 has a function of blocking oxygen, the amount of oxygen which reaches the silicon transistor is small. The entry of oxygen into silicon might be a factor of decreasing the crystallinity of silicon or inhibiting carrier movement. Therefore, blocking oxygen by the insulator 442 is important to improve performance and reliability of the semiconductor device.

The insulator 452 is preferably provided over the transistor 490. The insulator 452 has a function of blocking oxygen and hydrogen. For the insulator 452, the description of the insulator 442 is referred to, for example. Furthermore, for example, the insulator 452 has a higher function of blocking oxygen and hydrogen than the semiconductor 406a and/or the semiconductor 406c.

When the semiconductor device includes the insulator 452, outward diffusion of oxygen from the transistor 490 can be suppressed. Consequently, excess oxygen (oxygen) contained in the insulator 432 and the like can be effectively supplied to the transistor 490. Since the insulator 452 blocks entry of impurities including hydrogen from layers above the insulator 452 or the outside of the semiconductor device, deterioration of electrical characteristics of the transistor 490 due to entry of impurities can be suppressed.

Although in the above description, the insulator 442 and/or the insulator 452 is described separately from the transistor 490 for convenience, the insulator 442 and/or the insulator 452 may be part of the transistor 490.

Next, an example of another structure of the memory device of one embodiment of the present invention is described with reference to FIG. 11 and FIG. 12.

Figure 11:
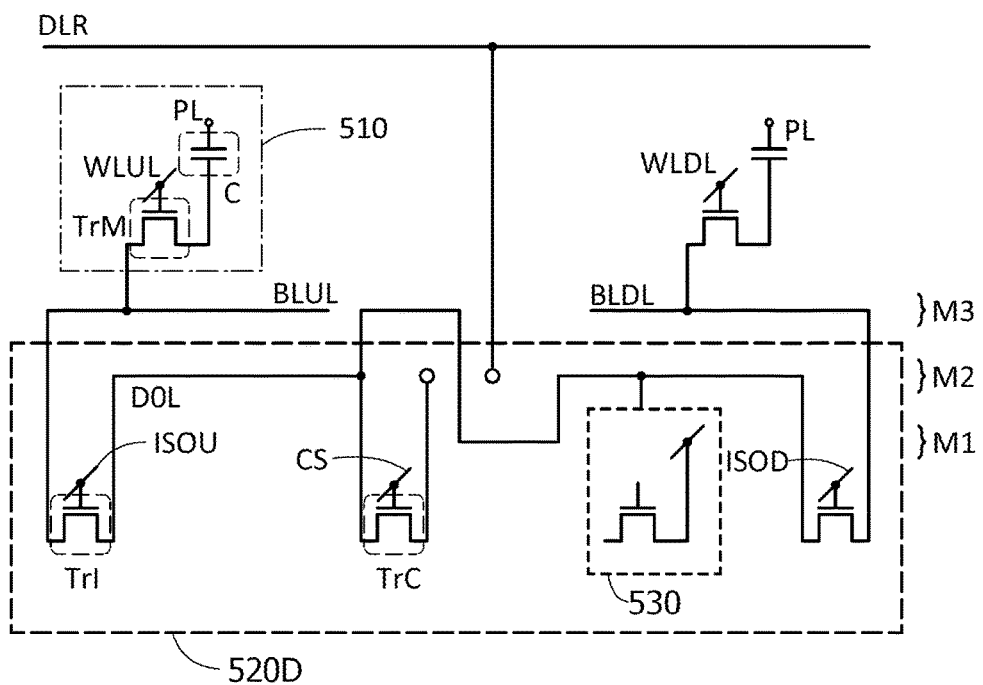
FIG. 11 is a schematic cross-sectional view of a memory device of one embodiment of the present invention.

FIG. 11 is a schematic cross-sectional view of a structure example of a memory device 500D. In FIG. 11, positions and connections of elements and wirings are schematically shown using circuit symbols. The up and down direction in the drawing is a direction perpendicular to a surface over which a circuit is formed (or the height direction of the surface). FIG. 12 schematically shows a structure example of the memory device 500D seen from the above. FIG. 12 schematically illustrates regions, wirings, connection portions, and the like, and the up and down direction and the right and left direction show different horizontal directions (direction parallel to the surface over which the circuit is formed). Note that in FIG. 11 and FIG. 12, some components such as a transistor and a wiring are not illustrated for easy understanding.

In the memory devices 500A and 500B illustrated in FIG. 4, FIG. 5, and FIG. 6, the connection portions of the data lines are provided to have a large width in the first direction (direction in which the word lines extend) for the purpose of avoiding the second conductor functioning as the wiring D0L. FIG. 11 and FIG. 12 illustrate a structure example of providing the connection portions of the bit lines and the connection portions of the data lines without an increase in the first direction.

Figure 12:
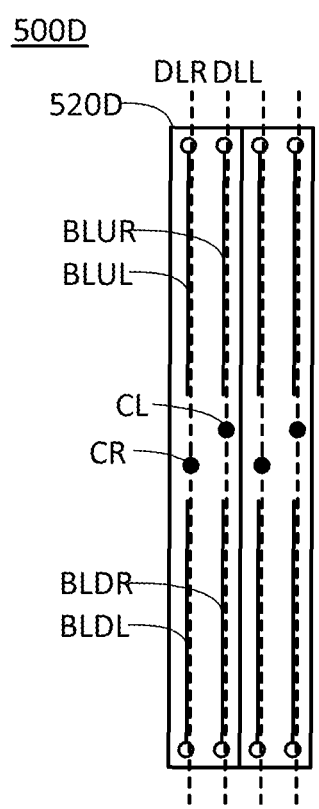
FIG. 12 is a schematic top view of a memory device of one embodiment of the present invention.

The memory device 500D illustrated in FIG. 11 and FIG. 12 includes a sense amplifier block 520D, the bit lines BLUL, BLUR, BLDL, and BLDR, the word lines WLUL and WLDL, the memory cell 510, the data lines DLL and DLR, and the wirings ISOU, ISOD, and CS. In the memory device 500D illustrated in FIG. 11, for the wiring D0L (and D0R), not only the conductor in the second layer but also the conductor in the first layer and the conductor in the third layer are used. With three layers of conductors, the connection portions of the data lines can be provided in a region other than the wiring D0L without an increase in the width in the first direction. In that case, the positions of the data lines DLL and DLR may be switched compared to the memory device 500A illustrated in FIG. 5.

The memory device 500D illustrated in FIG. 11 is different from the memory device 500A illustrated in FIG. 4 only in the structures of the data lines and the vicinity of the connection portions of the data lines. Therefore, the description of the memory device 500A illustrated in FIG. 4 can be referred to for the other components of the memory device 500D as appropriate.

FIG. 12 is a schematic plan view illustrating a structure example of the memory device 500D. In the schematic top view of FIG. 12, the connection portions of the bit lines and the connection portions of the data lines are provided on the extension of the bit lines BLUL, BLUR, BLDL, and BLDR. The connection portions of the bit lines and the connection portions of the data lines are provided without an increase in the width of the sense amplifier block 520D in the first direction. The connection portions of the data lines are provided between the bit line pairs (BLUL and BLUR) and (BLDL and BLDR) which are adjacent to each other in the second direction. The two connection portions of the data lines are shifted from each other in the second direction. Thus, the connection portions of the data lines can be provided so as to avoid the wiring D0L without an increase in the width in the first direction.

The memory device 500D illustrated in FIG. 12 is different from the memory device 500A illustrated in FIG. 5 only in the structures of the data lines and the vicinity of the connection portions of the data lines. Therefore, the description of the memory device 500A illustrated in FIG. 5 can be referred to for the other components of the memory device 500D as appropriate.

With the above structure, the sense amplifier blocks, the bit lines, the connection portions of the bit lines, and the connection portions of the data lines can be arranged efficiently and two-dimensionally in the memory device 500D.

Next, a detailed structure example of the memory device 500D of one embodiment of the present invention is described with reference to FIGS. 13A to 13E and FIG. 14.

Note that in FIGS. 13A to 13E and FIG. 14, some components such as an insulator are omitted for easy understanding, and a conductor and the like formed in the same layer are shown with the same hatching pattern.

Figure 13:
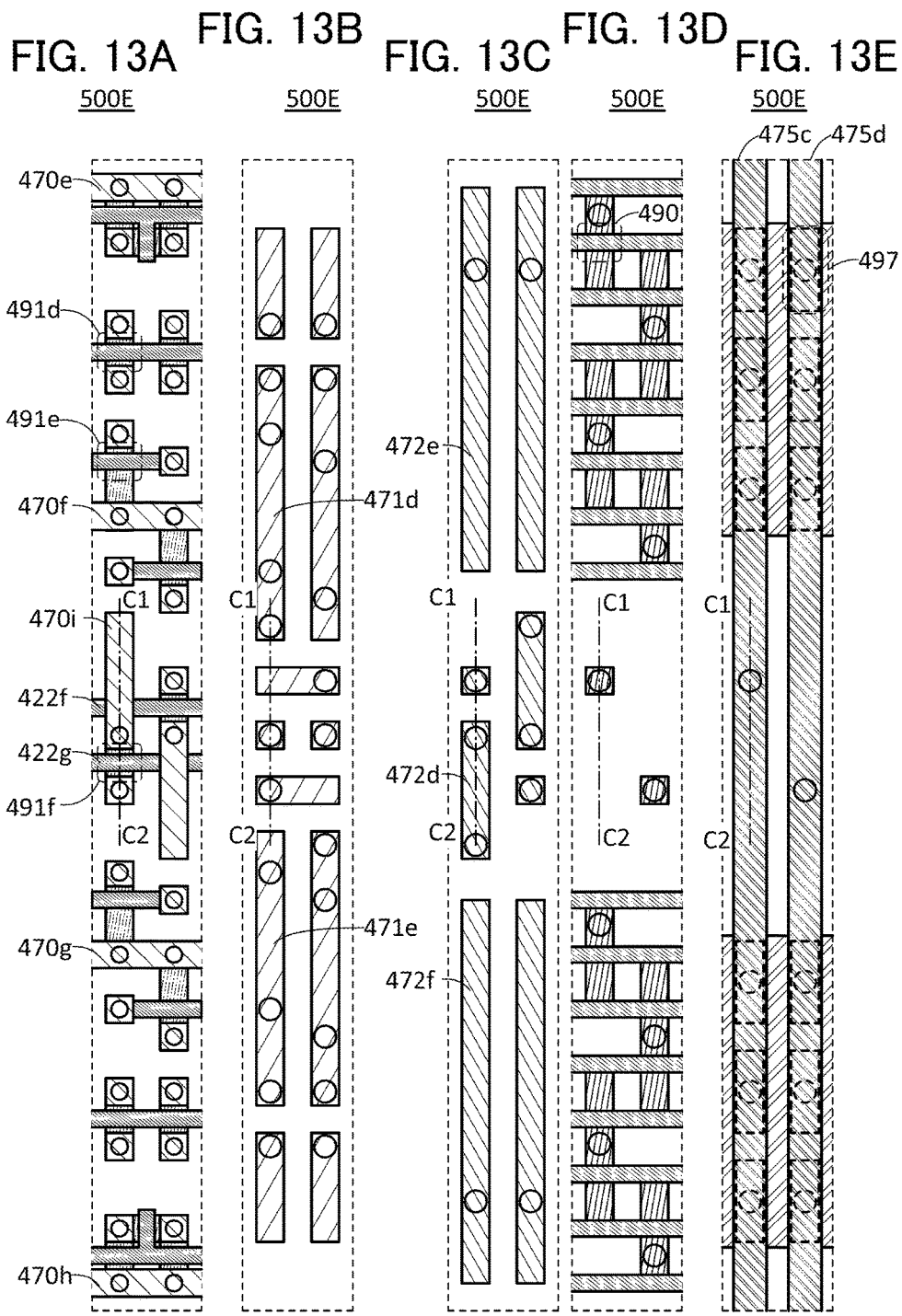
FIGS. 13A to 13E are top views of a memory device of one embodiment of the present invention.

FIGS. 13A to 13E are top views illustrating an example of the structure of the memory device 500E. The memory device 500E is a specific example of the memory device 500D illustrated in FIG. 12. The memory device 500E has the circuit configurations illustrated in FIG. 3 and FIG. 19B. FIG. 13A is a top view of a region including the transistor TrC and a conductor in a first layer; FIG. 13B is a top view of a region including a conductor in a second layer functioning as the wirings D0L and D0R; FIG. 13C is a top view of a region including a conductor in a third layer functioning as the bit lines; FIG. 13D is a top view of a region including the transistor TrM; and FIG. 13E is a top view of a region including the capacitor C and the data lines.

Figure 14:
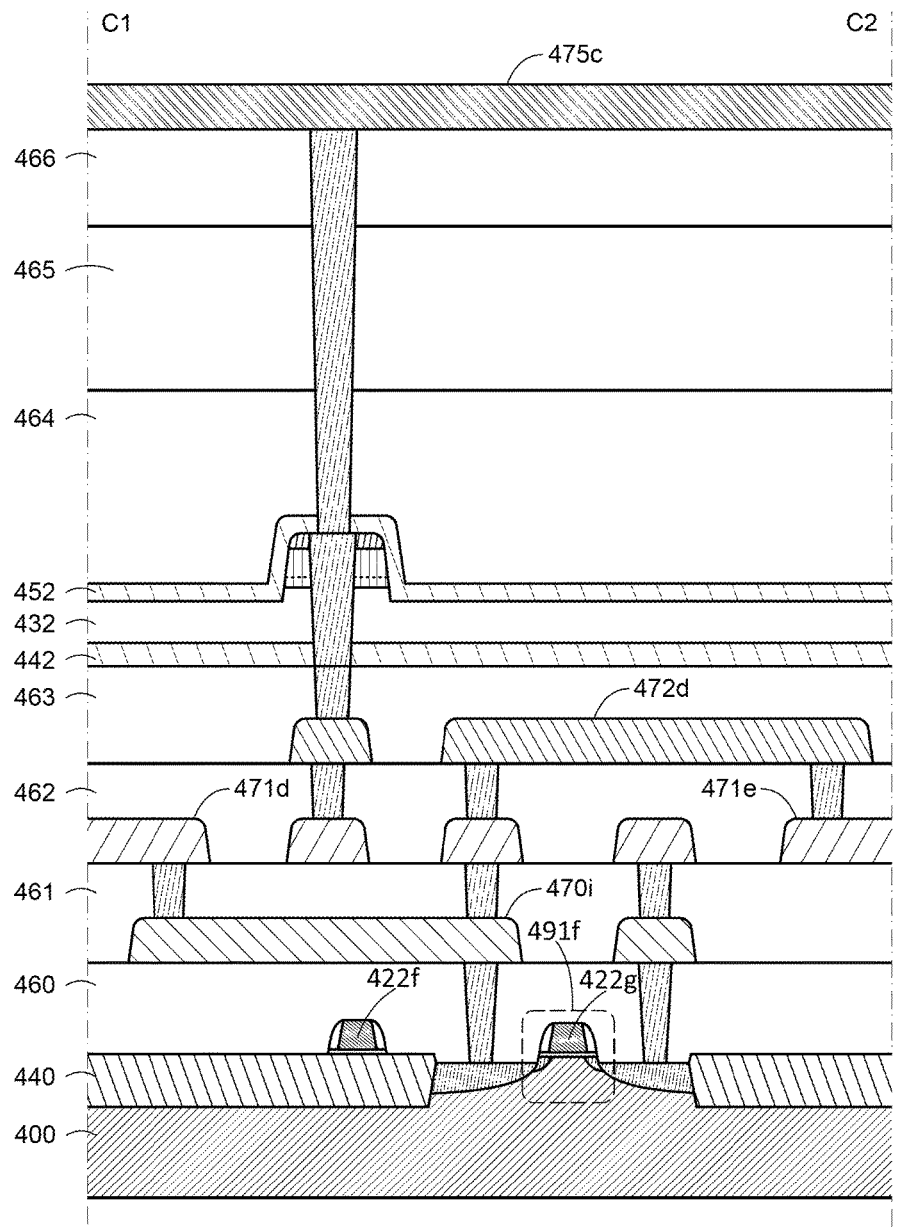
FIG. 14 is a cross-sectional view of a memory device of one embodiment of the present invention.

FIG. 14 is a cross-sectional view illustrating an example of the structure of the memory device 500E illustrated in FIGS. 13A to 13E. FIG. 14 illustrates a cross section taken along dashed-dotted line C1-C2 in FIGS. 13A to 13E.

The memory device 500E illustrated in FIGS. 13A to 13E and FIG. 14 includes the transistor 490, a transistor 491d, a transistor 491e, a transistor 491f, and the capacitor 497. The transistors and the capacitor are connected to each other through a plurality of conductors as appropriate to form part of the circuit illustrated in FIG. 3 and FIG. 19B. In this example, an oxide semiconductor transistor is used as the transistor 490 and silicon transistors are used as the transistors 491d to 491f.

The structure of the memory device 500E illustrated in FIGS. 13A to 13E is compared to the structure of the memory device in FIG. 3 and FIG. 19B. In the top view of FIG. 13A, the transistor 491d corresponds to the transistor TrI; the transistor 491e is an n-channel transistor included in a sense amplifier; the transistor 491f corresponds to the transistor TrC; a conductor 470f corresponds to the wiring NACT; a conductor 470g corresponds to the wiring PACT; a conductor 470e corresponds to the wiring PCU; a conductor 470h corresponds to the wiring PCD; and conductors 422f and 422g correspond to the wirings CS. In the top view of FIG. 13B, conductors 471d and 471e correspond to the wirings D0L. In the top view of FIG. 13C, a conductor 472e corresponds to the bit line BLUL; and a conductor 472f corresponds to the bit line BLDL. In the top view of FIG. 13D, the transistor 490 corresponds to the transistor TrM. In the top view of FIG. 13E, the capacitor 497 corresponds to the capacitor C; a conductor 475c corresponds to the data line DLR; and a conductor 475d corresponds to the data line DLL.

A layer structure in the cross-sectional view showing an example of the structure of the memory device 500E illustrated in FIG. 14 is similar to that in the cross-sectional views illustrated in FIG. 9 and FIG. 10. Thus, the description of the layer structure illustrated in FIG. 9 and FIG. 10 can be referred as appropriate.

The memory device 500E illustrated in FIGS. 13A to 13E and FIG. 14 is different from the memory device 500C illustrated in FIGS. 8A to 8E, FIG. 9, and FIG. 10 in the structures of the data lines and the vicinity of the connection portions of the data lines, and the like. In the memory device 500C illustrated in FIGS. 8A to 8E, FIG. 9, and FIG. 10, the conductors 471b and 471c functioning as the wirings D0L and D0R extend in the second direction to end portions of the sense amplifier block. Thus, the connection portions of the data lines (conductors 475a and 475b) are provided in a region other than the conductors 471b and 471c with an increase in the width of the sense amplifier block in the first direction. In the memory device 500E illustrated in FIGS. 13A to 13E and FIG. 14, three layers of conductors functioning as the wirings D0L is provided. The conductors functioning as the wirings D0L are the conductors 471d, 470i, 472d, and 471e. The conductors 471d and 471e are provided over a layer where the conductor 470i is provided, and the conductor 472d is provided over a layer where the conductors 471d and 471e are provided. With such a structure, the connection portions of the data lines can be provided without an increase in the width of the sense amplifier block in the first direction. As illustrated in FIGS. 13A to 13E, the conductor connected to the conductors 471d, 470i, 472d, and 471e through the transistor 491f is the conductor 475d that is in a row adjacent to the conductors in the first direction, not the conductor 475c that is directly over the conductors. In other words, with conductors in three layers in two columns, the connection portions of the data lines can be provided without an increase in the width in the first direction.

In the memory device 500E illustrated in FIGS. 13A to 13E and FIG. 14, a main part of the wiring D0L (conductors 471d and 471e) and the bit line BLUL (conductor 472e) are formed in different layers; thus, the wiring D0L and the bit line BLUL can be connected to each other only through the transistor 491d. Accordingly, the bit lines can be chosen as appropriate and the four bit lines BLUL, BLUR, BLDL, and BLDR can be connected to the sense amplifier block.

In the memory device 500E illustrated in FIGS. 13A to 13E and FIG. 14, three layers of conductors are used as the wirings D0L; thus, an increase in the width of the memory device 500E in the first direction can be suppressed.

In the memory device 500E illustrated in FIGS. 13A to 13E and FIG. 14, the number of memory cells connected to each bit line BLUL, BLUR, BLDL, or BLDR is 3. For example, the number of memory cells connected to the bit line can be 3 to 32. Accordingly, bit line capacitance can be reduced and the capacitance of the capacitor C can also be reduced. Thus, the memory device 500E is preferable in terms of operation speed, power consumption, manufacturing yield, and the like.

In the memory device 500E illustrated in FIGS. 13A to 13E and FIG. 14, the pitch of the sense amplifier block in the first direction can be twice to four times, preferably twice to three times the width of the memory cell in the first direction. The pitch of the sense amplifier block in the second direction can be, for example, 6 to 64 times, preferably 6 to 32 times the width of the memory cell in the second direction.

Next, an example of another structure of the memory device of one embodiment of the present invention is described with reference to FIGS. 15A and 15B.

In the memory devices 500A and 500B illustrated in FIG. 4, FIG. 5, and FIG. 6, the connection portions of the data lines are provided to have a large width in the first direction (direction in which the word lines extend) for the purpose of avoiding the second conductor functioning as the wiring D0L. The memory device 500F illustrated in FIGS. 15A and 15B is a structure example where the width of the sense amplifier block is increased in the first direction at a pitch of a width of four bit lines or more so that the sense amplifier blocks each including the connection portions of the bit lines and the connection portions of the data lines can be arranged efficiently and two-dimensionally.

Figure 15A:
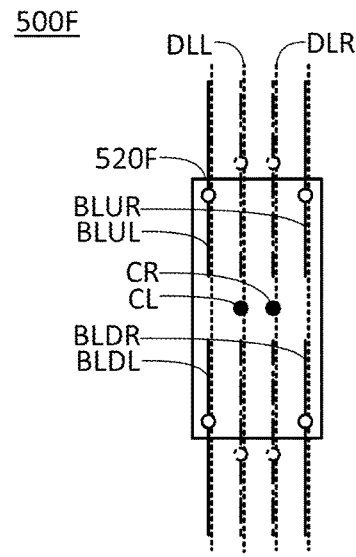
FIGS. 15A and 15B are schematic top views of a memory device of one embodiment of the present invention.

FIG. 15A is a plan view schematically showing an example of a structure of the memory device 500F. FIG. 15A schematically illustrates positions of the sense amplifier block 520F, the four bit lines BLUL, BLUR, BLDL, and BLDR, the data lines DLL and DLR, the connection portions of the bit lines (denoted by white circles (○)), the connection portions of the data lines (denoted by black circles (●)), and the like.

In the schematic top view of FIG. 15A, eight bit lines are arranged in two rows and four columns. Of the eight bit lines, two of the four bit lines in the first row and two of the four bit lines in the second row are electrically connected to the sense amplifier block 520F through the connection portions of the bit lines. In the drawing, the bit lines connected to the sense amplifier block 520F are shown by solid lines, and the bit lines connected to other sense amplifier blocks are shown by dashed-dotted lines. The two bit lines BLUL and BLUR are arranged in the first direction at an interval where two bit lines can be arranged. The two bit lines BLDL and BLDR are arranged in the first direction at an interval where two bit lines are arranged. The bit line pair (BLUL and BLUR) and the bit line pair (BLDL and BLDR) are arranged to be adjacent to each other in the second direction. In the memory device 500F in FIG. 15A, the sense amplifier block 520F is placed in a region with a width of four bit lines or more in the first direction and a length of one bit line or more in the second direction.

In the memory device 500F, the sense amplifier blocks 520F and the bit lines BLUL, BLUR, BLDL, and BLDR can be arranged two-dimensionally and regularly as described above. In other words, the sense amplifier blocks 520F and the four bit lines BLUL, BLUR, BLDL, and BLDR can be arranged in array at a pitch of a third distance in the first direction and at a pitch of a fourth distance in the second direction. Note that two sense amplifier blocks 520F which are adjacent to each other in the second direction are shifted by a fifth distance in the first direction. This is for the purpose of avoiding an overlap of the bit lines. The fifth distance is shorter than the third distance. The third distance is longer than or equal to a width of four bit lines and shorter than or equal to twice the width, for example. The fourth distance is longer than or equal to a length of one bit line and shorter than or equal to twice the length, for example.

The bit lines are arranged two-dimensionally at an average pitch of the third distance in the first direction and at an average pitch of the fourth distance in the second direction. In that case, the sense amplifier blocks 520F can be arranged two-dimensionally at a pitch that is four times the third distance in the first direction and at a pitch that is one time the fourth distance in the second direction, for example. In other words, when the bit lines are arranged two-dimensionally, a width of k bit lines means a width that is k times the average width occupied by one bit line (k is an integer of 1 or more). The sense amplifier blocks 520F can be arranged two-dimensionally and regularly at a pitch that is four times the pitch of the bit line in the first direction and at a pitch that is one time the pitch of the bit line in the second direction. The two sense amplifier blocks 520F which are adjacent to each other in the second direction are shifted from each other by a width of approximately two bit lines in the first direction.

Figure 15B:
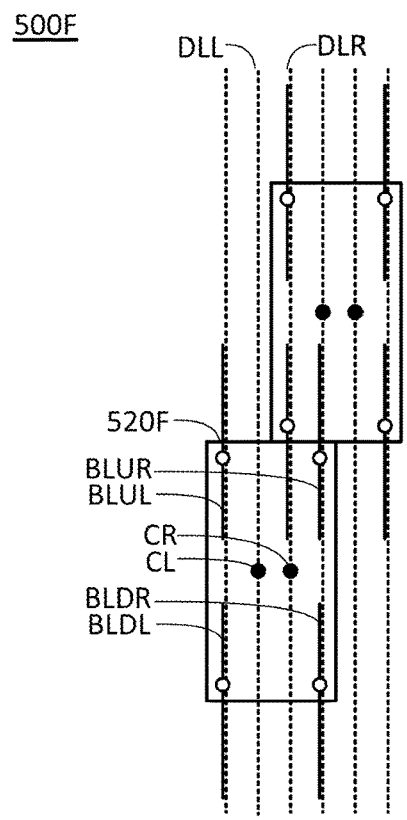

FIG. 15B is a top view of two sense amplifier blocks which are adjacent to each other in the second direction. In FIG. 15B, the sense amplifier blocks which are adjacent to each other in the second direction are shifted from each other in the first direction. Accordingly, an overlap of the bit lines is avoided.

The four bit lines BLUL, BLUR, BLDL, and BLDR are arranged to at least partly overlap with the sense amplifier block 520F. The four bit lines BLUL, BLUR, BLDL, and BLDR may be arranged to partly overlap with the sense amplifier block 520F and a sense amplifier block adjacent to the sense amplifier block 520F.

Although the sense amplifier block is rectangular in the schematic top view of the memory device illustrated in FIGS. 15A and 15B, this is a schematic view and does not show that the sense amplifier block is placed in a rectangular region. The sense amplifier block may be provided in a region including an element included in the sense amplifier and which does not overlap with adjacent sense amplifier blocks.

Figure 17:
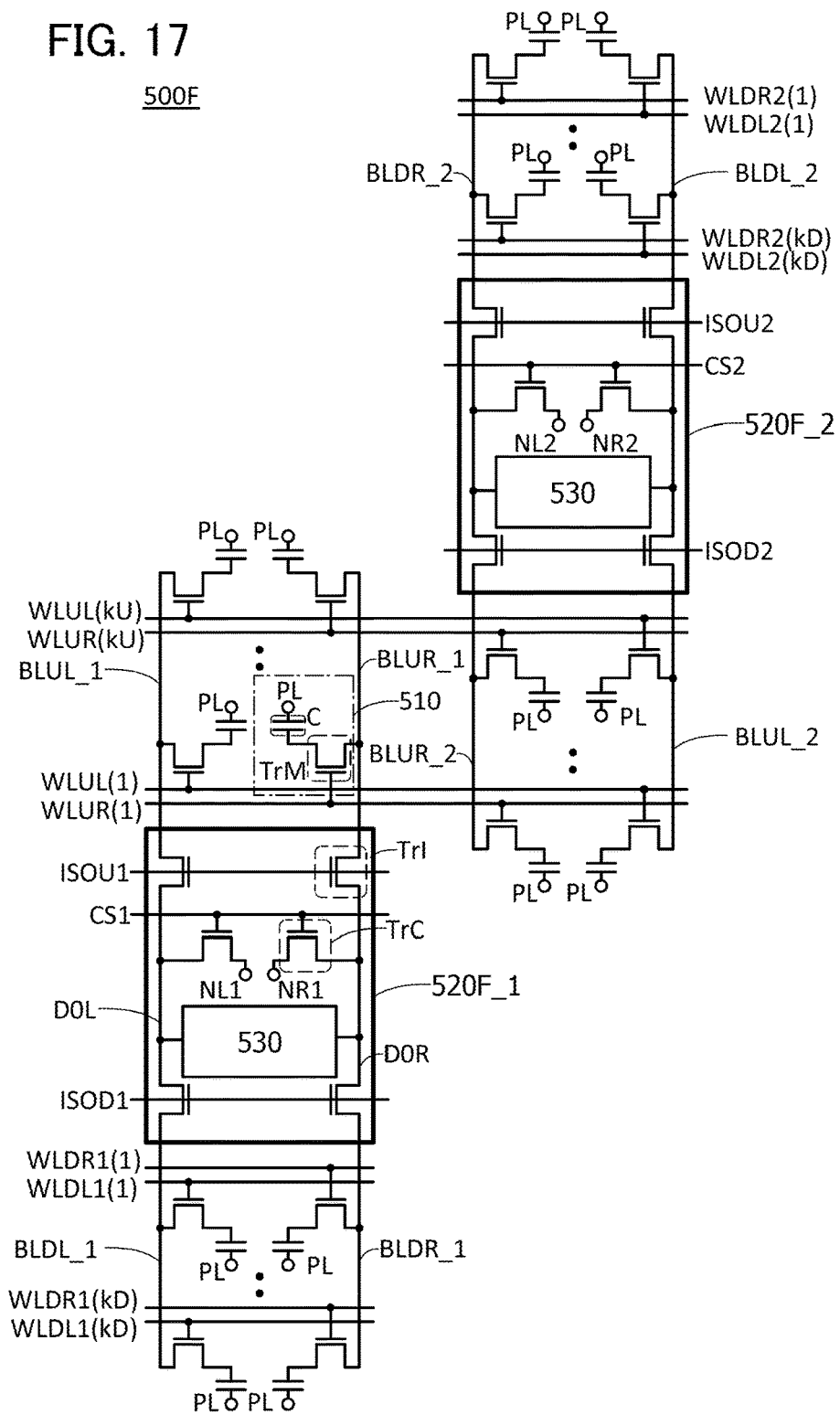
FIG. 17 is a circuit diagram of a memory device of one embodiment of the present invention.

FIG. 17 illustrates an example of a circuit configuration of the memory device 500F illustrated in FIG. 15B. The memory device 500F illustrated in FIG. 17 includes two sense amplifier blocks 520F_1 and 520F_2 which are adjacent to each other in the second direction. Word lines are partly shared by memory cells connected to the two sense amplifier blocks 520F_1 and 520F_2. In other words, a memory cell connected to one of the bit line pairs (BLUL_1 and BLUR_1) connected to the sense amplifier block 520F_1 and a memory cell connected to one of the bit line pairs (BLUL_2 and BLUR_2) connected to the sense amplifier block 520F_2 share word lines.

The circuit configuration of the memory device 500F illustrated in FIG. 17 is only partly different from the circuit configuration of the memory device 500 illustrated in FIG. 3. Therefore, the description of the circuit configuration of the memory device 500 illustrated in FIG. 3 can be referred to for memory cells, bit lines, and other wirings as appropriate.

Next, a detailed structure example of the memory device 500F of one embodiment of the present invention is described with reference to FIGS. 18A to 18E.

Note that in FIGS. 18A to 18E, some components such as an insulator are omitted for easy understanding, and a conductor and the like formed in the same layer are shown with the same hatching pattern.

FIGS. 18A to 18E are top views illustrating an example of the structure of a memory device 500H. The memory device 500H is a specific example of the memory device 500F illustrated in FIGS. 15A and 15B. The memory device 500H has the circuit configurations illustrated in FIG. 17 and FIG. 19A. FIG. 18A is a top view of a region including the transistor TrC and a conductor in a first layer; FIG. 18B is a top view of a region including a conductor in a second layer functioning as the wirings D0L and D0R; FIG. 18C is a top view of a region including a conductor in a third layer functioning as bit lines; FIG. 18D is a top view of a region including the transistor TrM; and FIG. 18E is a top view of a region including the capacitor C and data lines. In the top views of FIGS. 18A to 18E, some wirings and some elements which are connected to a sense amplifier block adjacent to the described sense amplifier block are omitted.

The memory device 500H illustrated in FIGS. 18A to 18E includes the transistor 490, a transistor 491g, a transistor 491h, a transistor 491i, and the capacitor 497. The transistors and the capacitor are connected to each other through a plurality of conductors as appropriate to form part of the circuit illustrated in FIG. 17 and FIG. 19A. In this example, an oxide semiconductor transistor is used as the transistor 490 and silicon transistors are used as the transistors 491g to 491i.

The structure of the memory device 500H illustrated in FIGS. 18A to 18E is compared to the structure of the memory device illustrated in FIG. 17 and FIG. 19A. In the top view of FIG. 18A, the transistor 491g corresponds to the transistor TrI; the transistor 491h is an n-channel transistor included in a sense amplifier; the transistor 491i corresponds to the transistor TrC; the conductor 470i corresponds to the wiring NACT; a conductor 470k corresponds to the wiring PACT; and a conductor 470j corresponds to the wiring PC. In the top view of FIG. 18B, a conductor 471f corresponds to the wiring D0L. In the top view of FIG. 18C, a conductor 472g corresponds to the bit line BLUL; and a conductor 472h corresponds to the bit line BLDL. In the top view of FIG. 18D, the transistor 490 corresponds to the transistor TrM. In the top view of FIG. 18E, the capacitor 497 corresponds to the capacitor C; and a conductor 475e corresponds to the data line DLL.

As described above, the memory device 500F illustrated in FIGS. 15A and 15B and the memory device 500H illustrated in FIGS. 18A to 18E are each wider in the first direction than the memory device 500B illustrated in FIG. 6. For example, the sense amplifier blocks are arranged at a pitch that is four times the pitch of the bit line or more. The width of the memory device 500F is increased in the first direction so that circuits included in the sense amplifier block can be arranged in a region with a narrower width in the second direction. By increasing the width in the first direction, the connection portions of the data lines and the connection portions of the bit lines can be provided so as to avoid the wirings D0L and D0R. The bit lines can be arranged to overlap with two adjacent sense amplifier blocks. This can be achieved by using a conductor in a third layer as the bit lines and mainly using a conductor in a first layer and a conductor in a second layer for the sense amplifier blocks. In other words, this can be achieved by separately providing a layer where the bit lines are provided and a layer where the sense amplifier blocks are provided. Thus, in the memory device 500F illustrated in FIGS. 15A and 15B and the memory device 500H illustrated in FIGS. 18A to 18E, sense amplifier blocks, bit lines, connection portions of the bit lines, and connection portions of data lines can be arranged efficiently and two-dimensionally.

In the memory device 500H illustrated in FIGS. 18A to 18E, the wiring D0L (conductor 471f) and the bit line BLUL (conductor 472g) are formed in different layers; thus, the wiring D0L and the bit line BLUL can be connected to each other only through the transistor 491g. Accordingly, the bit lines can be chosen as appropriate and the four bit lines BLUL, BLUR, BLDL, and BLDR can be connected to the sense amplifier block.

In the memory device 500H illustrated in FIGS. 18A to 18E, the number of memory cells connected to each bit line BLUL, BLUR, BLDL, or BLDR is 4. For example, the number of memory cells connected to the one bit line can be 3 to 32. Accordingly, bit line capacitance can be reduced and the capacitance of the capacitor C can also be reduced. The memory device 500H is preferable in terms of operation speed, power consumption, manufacturing yield, and the like.

In the memory device 500H illustrated in FIGS. 18A to 18E, the pitch of the sense amplifier block in the first direction can be four to eight times, preferably four to six times the width of the memory cell in the first direction. The pitch of the sense amplifier block in the second direction can be, for example, 3 to 32 times, preferably 3 to 16 times the width of the memory cell in the second direction.

An example of another structure of the memory device of one embodiment of the present invention is described with reference to FIG. 16.

Figure 16:
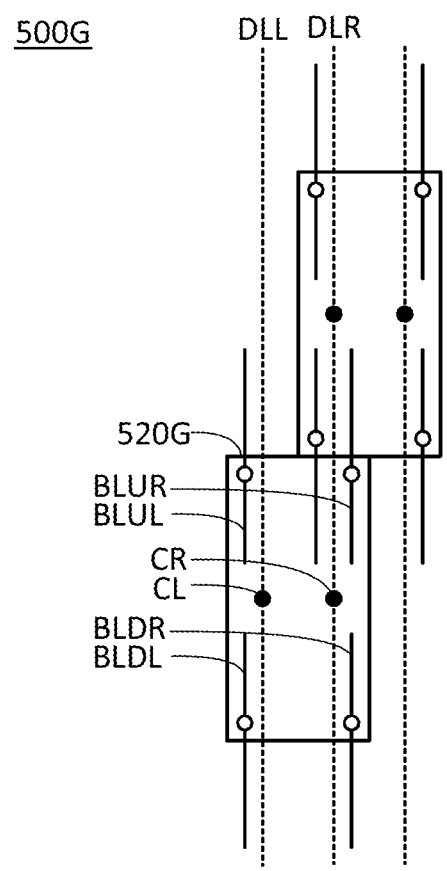
FIG. 16 is a schematic top view of a memory device of one embodiment of the present invention.

FIG. 16 is a plan view schematically illustrating an example of a structure of a memory device 500G. The memory device 500G illustrated in FIG. 16 is different from the memory device 500F illustrated in FIG. 15B in the data lines and the structure of the connection portions of the data lines. In other words, sense amplifier blocks 520G which are adjacent to each other in the second direction partly share the data lines. Accordingly, the number of data lines is half of that in the memory device 500F illustrated in FIGS. 15A and 15B. By reducing the number of data lines, the width or interval of the data lines can be increased. For example, the data lines are arranged at a pitch that is two times the pitch of the bit line in the first direction. For example, the data lines are provided above memory cells and thus cannot be manufactured as long as the widths or intervals of the data lines are wider than those of the bit lines in some cases. Even in such a case, an increase in the width of the memory device 500G in the first direction due to limitation of the width or interval of the data lines is not necessary, which is preferable. Since the number of data lines which operate at the same time is reduced, power consumption due to charging and discharging the data lines can be reduced.

The memory device 500G illustrated in FIG. 16 is different from the memory device 500F illustrated in FIGS. 15A and 15B only in the structures of the data lines and the connection portions of the data lines. Therefore, the description of the memory device 500F illustrated in FIGS. 15A and 15B can be referred to for the other components of the memory device 500G as appropriate.

Next, an example of another structure of the memory device of one embodiment of the present invention is described with reference to FIGS. 20A to 20D and FIGS. 28A to 28D. As well as the memory device 500F illustrated in FIGS. 15A and 15B, the memory devices illustrated in FIGS. 20A to 20D and FIGS. 28A to 28D each are a structure example where the width of the sense amplifier block in the first direction is set to a pitch of a width of four bit lines or more so that the sense amplifier blocks each including the connection portions of the bit lines and the connection portions of the data lines are provided efficiently and two-dimensionally. For the circuit configuration, the circuit configuration illustrated in FIG. 17 can be referred to.

Figure 20A:
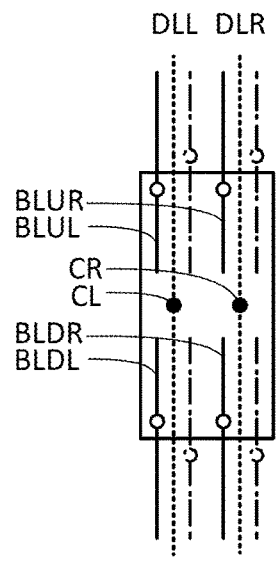
FIGS. 20A to 20D are schematic top views of memory devices of one embodiment of the present invention.

In the schematic top view of FIG. 20A, eight bit lines are arranged in two rows and four columns. Of the eight bit lines, two of the four bit lines in the first row and two of the four bit lines in the second row are electrically connected to the sense amplifier block through the connection portions of the bit lines. In the drawing, the bit lines connected to the sense amplifier block are shown by solid lines, and the bit lines connected to other sense amplifier blocks are shown by dashed-dotted lines. The two bit lines BLUL and BLUR are arranged in the first direction at an interval where one bit line can be placed. The two bit lines BLDL and BLDR are arranged in the first direction at an interval where one bit line can be placed. The pair of bit lines (BLUL and BLUR) and the pair of bit lines (BLDL and BLDR) are adjacent to each other in the second direction. In the memory device illustrated in FIG. 20A, the sense amplifier block is placed in a region with a width of four bit lines or more in the first direction and a length of one bit line or more in the second direction.

In the memory device illustrated in FIG. 20A, the sense amplifier blocks and the bit lines BLUL, BLUR, BLDL, and BLDR can be arranged two-dimensionally and regularly as described above. In other words, the sense amplifier blocks and the four bit lines BLUL, BLUR, BLDL, and BLDR can be arranged at a pitch of the third distance in the first direction and at a pitch of the fourth distance in the second direction. Note that sense amplifier blocks which are adjacent to each other in the second direction are shifted by the fifth distance in the first direction. The fifth distance is shorter than the third distance. The sense amplifiers which are adjacent to each other in the second direction are shifted to avoid an overlap of the bit lines. Such a structure is illustrated in FIG. 20C. The third distance is longer than or equal to a width of four bit lines and shorter than or equal to twice the width. The fourth distance is longer than or equal to a length of one bit line and shorter than or equal to twice the length.

Figure 20B:
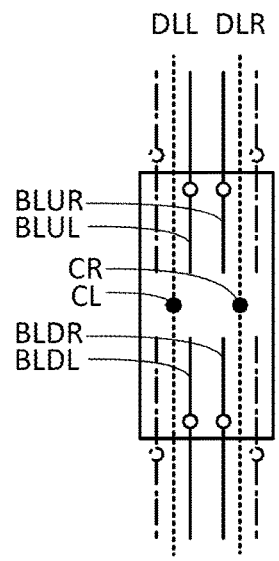
Figure 20C:
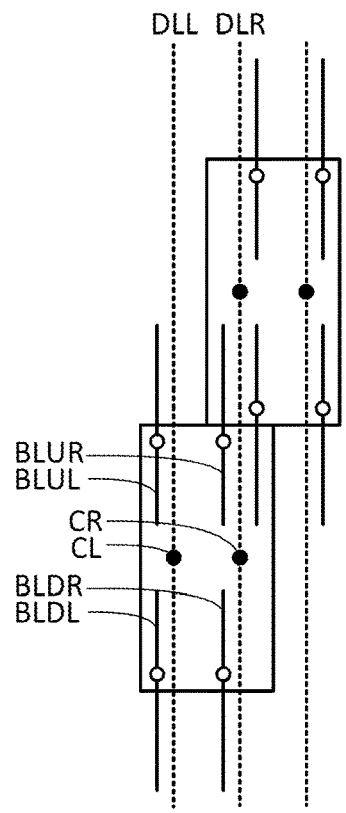

In the schematic top view of FIG. 20B, eight bit lines are arranged in two rows and four columns. Of the eight bit lines, two of the four bit lines in the first row and two of the four bit lines in the second row are electrically connected to the sense amplifier block through the connection portions of the bit lines. In the drawing, the bit lines connected to the sense amplifier block are shown by solid lines, and the bit lines connected to other sense amplifier blocks are shown by dashed-dotted lines. The two bit lines BLUL and BLUR are adjacent to each other in the first direction. The two bit lines BLDL and BLDR are adjacent to each other in the first direction. The pair of bit lines (BLUL and BLUR) and the pair of bit lines (BLDL and BLDR) are adjacent to each other in the second direction. In the memory device illustrated in FIG. 20B, the sense amplifier block is placed in a region with a width of four bit lines or more in the first direction and a length of one bit line or more in the second direction.

Figure 20D:
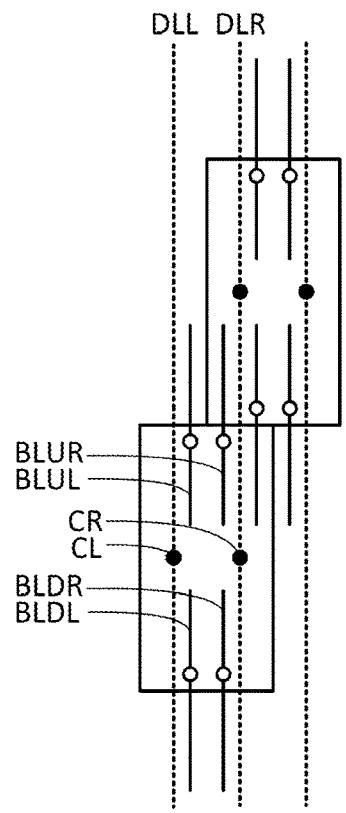

In the memory device illustrated in FIG. 20B, the sense amplifier blocks and the bit lines BLUL, BLUR, BLDL, and BLDR can be arranged two-dimensionally and regularly as described above. In other words, the sense amplifier blocks and the four bit lines BLUL, BLUR, BLDL, and BLDR can be arranged at a pitch of the third distance in the first direction and at a pitch of the fourth distance in the second direction. Note that sense amplifier blocks which are adjacent to each other in the second direction are shifted by the fifth distance in the first direction. The fifth distance is shorter than the third distance. The sense amplifier blocks which are adjacent to each other in the second direction are shifted to avoid an overlap of the bit lines. Such a structure is illustrated in FIG. 20D. The third distance is longer than or equal to a width of four bit lines and shorter than or equal to twice the width. The fourth distance is longer than or equal to a length of one bit line and shorter than or equal to twice the length.

Figure 28A:
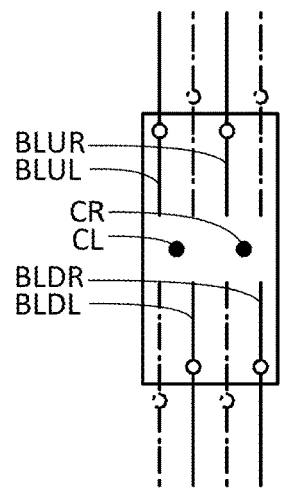
FIGS. 28A to 28D are each a schematic top view of a memory device of one embodiment of the present invention.

In the schematic top view of FIG. 28A, eight bit lines are arranged in two rows and four columns. Of the eight bit lines, two of the four bit lines in the first row and two of the four bit lines in the second row are electrically connected to the sense amplifier block through the connection portions of the bit lines. In the drawing, the bit lines connected to the sense amplifier block are shown by solid lines, and the bit lines connected to other sense amplifier blocks are shown by dashed-dotted lines. The two bit lines BLUL and BLUR are arranged in the first direction at an interval where one bit line can be placed. The two bit lines BLDL and BLDR are arranged in the first direction at an interval where one bit line can be placed. The pair of bit lines (BLUL and BLUR) and the pair of bit lines (BLDL and BLDR) are adjacent to each other in the second direction at a position where they do not overlap with each other if they extend in the second direction. In the memory device in FIG. 28A, the sense amplifier block is placed in a region with a width of four bit lines or more in the first direction and a length of one bit line or more in the second direction.

In the memory device illustrated in FIG. 28A, the sense amplifier blocks and the bit lines BLUL, BLUR, BLDL, and BLDR can be arranged two-dimensionally and regularly as described above. In other words, the sense amplifier blocks and the four bit lines BLUL, BLUR, BLDL, and BLDR can be arranged at a pitch of the third distance in the first direction and at a pitch of the fourth distance in the second direction. FIG. 28C illustrates two sense amplifier blocks which are adjacent to each other in the second direction. The third distance is longer than or equal to a width of four bit lines and shorter than or equal to twice the width. The fourth distance is longer than or equal to a length of one bit line and shorter than or equal to twice the length.

Figure 28B:
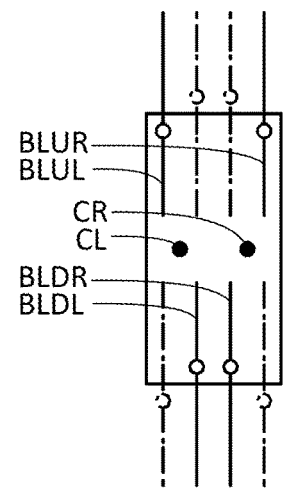
Figure 28C:
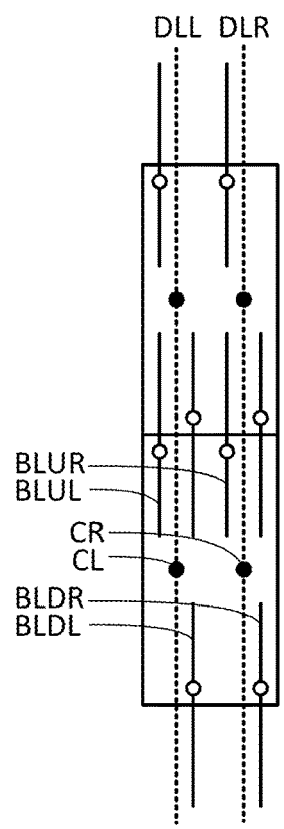

In the schematic top view of FIG. 28B, eight bit lines are arranged in two rows and four columns. Of the eight bit lines, two of the four bit lines in the first row and two of the four bit lines in the second row are electrically connected to the sense amplifier block through the connection portions of the bit lines. In the drawing, the bit lines connected to the sense amplifier block are shown by solid lines, and the bit lines connected to other sense amplifier blocks are shown by dashed-dotted lines. The two bit lines BLUL and BLUR are arranged in the first direction at an interval where two bit lines can be arranged. The two bit lines BLUL and BLUR are adjacent to each other in the first direction. The pair of bit lines (BLUL and BLUR) and the pair of bit lines (BLDL and BLDR) are adjacent to each other in the second direction. In the memory device illustrated in FIG. 28B, the sense amplifier block is placed in a region with a width of four bit lines or more in the first direction and a width of one bit line or more in the second direction.

Figure 28D:
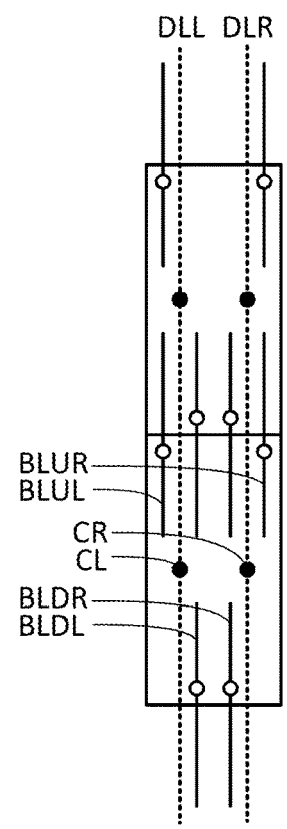

In the memory device illustrated in FIG. 28B, the sense amplifier blocks and the bit lines BLUL, BLUR, BLDL, and BLDR can be arranged two-dimensionally and regularly as described above. In other words, the sense amplifier blocks and the four bit lines BLUL, BLUR, BLDL, and BLDR can be arranged at a pitch of the third distance in the first direction and at a pitch of the fourth distance in the second direction. FIG. 28D illustrates two sense amplifier blocks which are adjacent to each other in the second direction. The third distance is longer than or equal to a width of four bit lines and shorter than or equal to twice the width. The fourth distance is longer than or equal to a length of one bit line and shorter than or equal to twice the length.

In each of the memory devices illustrated in FIGS. 20A to 20D and FIGS. 28A to 28D, the bit lines are arranged two-dimensionally at an average pitch of the third distance in the first direction and at an average pitch of the fourth distance in the second direction. In each of the memory devices illustrated in FIGS. 20A to 20D and FIGS. 28A to 28D, the sense amplifier blocks can be arranged two-dimensionally at a pitch of four times the third distance in the first direction and at a pitch of one time the fourth distance in the second direction, for example. In other words, in each of the memory devices illustrated in FIGS. 20A to 20D and FIGS. 28A to 28D, when the bit lines are arranged two-dimensionally, a width of k bit lines means a width of k times the average width occupied by one bit line (k is an integer of 1 or more). In each of the memory devices illustrated in FIGS. 20A to 20D and FIGS. 28A to 28D, the sense amplifier blocks can be arranged two-dimensionally and regularly at a pitch of four bit lines in the first direction and at a pitch of one bit line in the second direction, for example. Note that in the memory devices illustrated in FIGS. 20C and 20D, the sense amplifier blocks which are adjacent to each other in the second direction are shifted from each other by approximately two bit lines in the first direction.

In each of the memory devices illustrated in FIGS. 20A to 20D and FIGS. 28A to 28D, the four bit lines BLUL, BLUR, BLDL, and BLDR are arranged to at least partly overlap with the sense amplifier block electrically connected to the four bit lines BLUL, BLUR, BLDL, and BLDR. The four bit lines BLUL, BLUR, BLDL, and BLDR may be arranged to partly overlap with a sense amplifier block adjacent to the sense amplifier block electrically connected to the four bit lines BLUL, BLUR, BLDL, and BLDR.

As described above, each of the memory devices illustrated in FIGS. 20A to 20D and FIGS. 28A to 28D is wider in the first direction than the memory device 500B illustrated in FIG. 6. For example, the sense amplifier blocks are arranged at a pitch that is four times the pitch of the bit line or more. The width of each of the memory devices is increased in the first direction so that circuits included in the sense amplifier block can be arranged in a region with a narrower width in the second direction by increasing. By increasing the width in the first direction, the connection portions of the data lines and the connection portions of the bit lines can be provided so as to avoid the wirings D0L and D0R. The bit lines can be arranged to overlap with two adjacent sense amplifier blocks. This can be achieved by using a conductor in a third layer as the bit lines and mainly using a conductor in a first layer and a conductor in a second layer for the sense amplifier block. In other words, this can be achieved by separately providing a layer where the bit lines are provided and a layer where the sense amplifier blocks are provided. Thus, in each of the memory devices illustrated in FIGS. 20A to 20D and FIGS. 28A to 28D, sense amplifier blocks, bit lines, connection portions of the bit lines, and connection portions of data lines can be arranged efficiently and two-dimensionally.

In each of the memory devices illustrated in FIGS. 20A to 20D and FIGS. 28A to 28D, two sense amplifier blocks which are adjacent to each other in the second direction partly share data lines. Accordingly, the number of data lines is half of that in the memory device 500F illustrated in FIGS. 15A and 15B. Thus, the width or interval of the data lines can be increased. Power consumption due to charging and discharging the data lines can be reduced.

In the memory devices illustrated in FIGS. 20A and 20B, when two bit lines (BLUL and BLUR) and two bit lines (BLDL and BLDR) extend in the second direction, both of them are overlapped with each other. In such a case, sense amplifier blocks which are adjacent to each other in the second direction are shifted from each other by the fifth distance in the first direction; thus, the sense amplifier blocks and the bit lines can be arranged two-dimensionally so that the bit lines are not overlapped with each other. In the memory devices illustrated in FIGS. 28A and 28B, two bit lines (BLUL and BLUR) and two bit lines (BLDL and BLDR) are not overlapped with each other even when they extend in the second direction. In such a case, without a shift in the first direction, sense amplifier blocks which are adjacent to each other in the second direction can be arranged two-dimensionally so that the bit lines are not overlapped with each other.

Although the sense amplifier block is rectangular in the schematic top view of each of the memory devices illustrated in FIGS. 20A to 20D and FIGS. 28A to 28D, this is a schematic view and does not show that the sense amplifier block is placed in a rectangular region. The sense amplifier block may be provided in a region which includes an element included in the sense amplifier and which does not overlap with adjacent sense amplifier blocks.

In this specification, the phrase "A has a region with a concentration B" means, for example, "the concentration of the entire region of A in the depth direction is B", "the average concentration in a region of A in the depth direction is B", "the median value of the concentration in a region of A in the depth direction is B", "the maximum value of the concentration in a region of A in the depth direction is B", "the minimum value of the concentration in a region of A in the depth direction is B", "a convergence value of the concentration in a region of A in the depth direction is B", and "the concentration in a region in which a probable value of A can be obtained in measurement is B".

In this specification, the phrase "A has a region with a size B, a length B, a thickness B, a width B, or a distance B" means, for example, "the size, the length, the thickness, the width, or the distance of the entire region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region in which a probable value of A can be obtained in measurement is B".

A transistor includes three nodes (terminals) called a gate, a source, and a drain. A gate is a node that controls the conducting state of a transistor. Depending on the channel type of the transistor or levels of potentials applied to the nodes (terminals), one of nodes (an input node and an output node) functions as a source and the other functions as a drain. In general, in an n-channel transistor, a node to which a low potential is applied is referred to as a source, and a node to which a high potential is applied is referred to as a drain. In contrast, in a p-channel transistor, a node to which a low potential is applied is referred to as a drain, and a node to which a high potential is applied is referred to as a source.

In this specification and the like, to clarify a circuit configuration and circuit operation, one of two nodes (an input node and an output node) of a transistor is fixed as a source and the other is fixed as a drain in some cases. It is needless to say that, depending on a driving method, the magnitude relationship between potentials applied to three terminals of the transistor might be changed, and the source and the drain might be interchanged. Thus, in one embodiment of the present invention, the distinction between the source and drain of the transistor is not limited to that described in this specification and the drawings.

A conductor functioning as a gate of the transistor is referred to as a gate electrode. A conductor functioning as a source of the transistor is referred to as a source electrode. A conductor functioning as a drain of the transistor is referred to as a drain electrode. A region functioning as a source of the transistor is referred to as a source region. A region functioning as a drain of the transistor is referred to as a drain region. In this specification, a gate electrode is referred to as a gate, a drain electrode or a drain region is referred to as a drain, and a source electrode or a source region is referred to as a source in some cases.

The channel length refers to, for example, a distance between a source and a drain in a region where a semiconductor (or a portion where a current flows in a semiconductor when a transistor is on) and a gate overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In this specification, in the case where the term "channel width" is simply used, it may denote an apparent channel width. Alternatively, in this specification, in the case where the term "channel width" is simply used, it may denote an effective channel width. Note that the values of a channel length, a channel width, an effective channel width, an apparent channel width, a surrounded channel width, and the like can be determined by obtaining and analyzing a cross-sectional TEM image and the like.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, even when different components are connected to each other in a circuit diagram, there is actually a case where one conductor has functions of a plurality of components such as a case where part of a wiring functions also as an electrode. The term "connection" in this specification also means such a case where one conductor has functions of a plurality of components.

A voltage usually refers to a potential difference between a given potential and a reference potential (e.g., a source potential or a ground potential (GND)). A voltage can be referred to as a potential and vice versa.

The layout of circuit blocks in a drawing is the one for specifying the positional relationship in description. Thus, even when a drawing shows that different functions are achieved in different circuit blocks, an actual circuit or region may be configured so that the different functions are achieved in the same circuit block. Furthermore, the function of each circuit block in a drawing is specified for description. Thus, even when one circuit block is illustrated, an actual circuit or region may be configured so that processing which is illustrated as being performed in the one circuit block is performed in a plurality of circuit blocks.

Note that in this embodiment, in a channel formation region and the like of the transistor 490, an oxide semiconductor can be used, for example; however, one embodiment of the present invention is not limited to this example. For example, depending on cases or conditions, a channel formation region, the vicinity of the channel formation region, a source region, a drain region, or the like of the transistor 490 may be formed using a material containing silicon (Si), germanium (Ge), silicon germanium (SiGe), gallium arsenide (GaAs), or the like.

In this specification and the like, a transistor such as the transistor 490 can be formed using any of a variety of substrates, for example. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, or a base material film can be used, for example. As an example of the glass substrate, a barium borosilicate glass substrate, an aluminoborosilicate glass substrate, or a soda lime glass substrate can be given. Examples of the flexible substrate, the attachment film, and the base material film as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above substrate over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. The use of such a substrate enables formation of a transistor with excellent properties, a transistor with low power consumption, or a device with high durability, high heat resistance, or a reduction in weight or thickness.

This embodiment can be combined with any of the other embodiments in this specification as appropriate.

Embodiment 2

An example of a structure of a memory device of one embodiment of the present invention is described with reference to FIG. 21.

Figure 21:
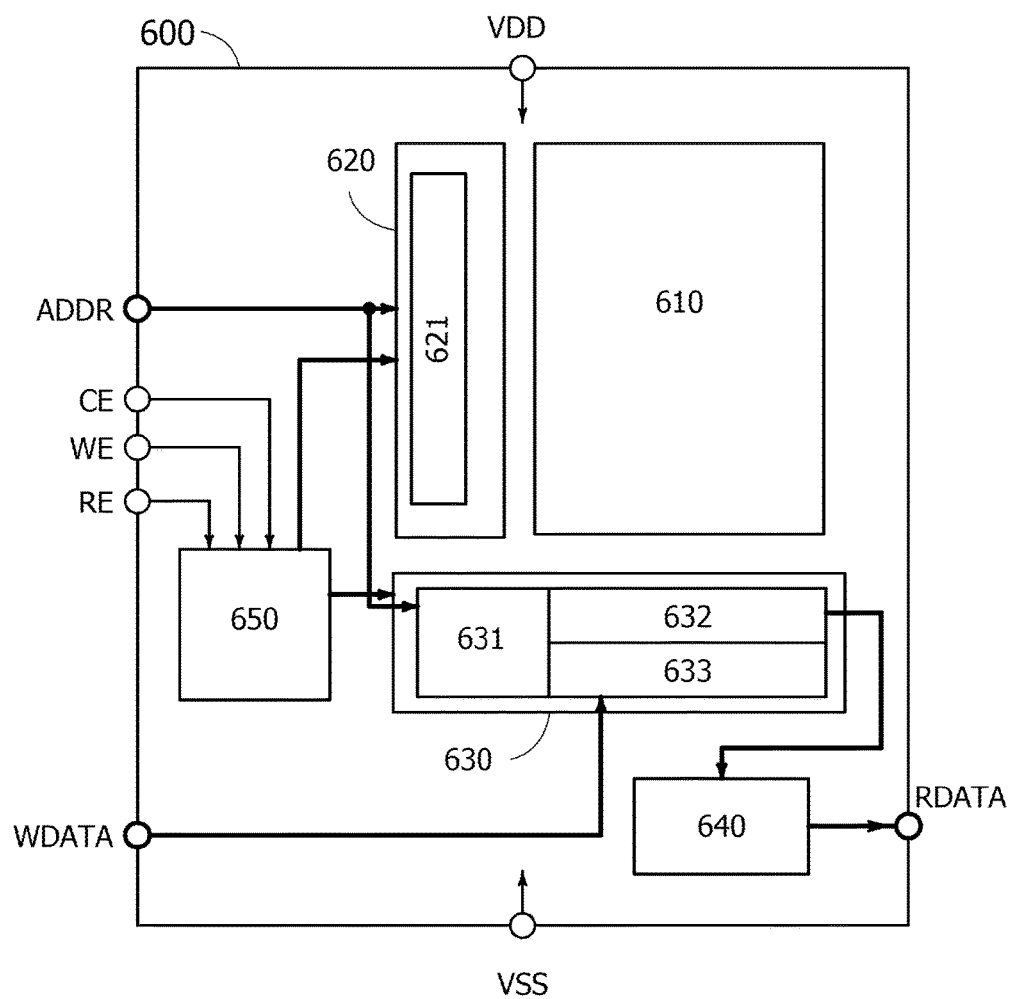
FIG. 21 is a block diagram of a memory device of one embodiment of the present invention.

A memory device 600 illustrated in FIG. 21 includes a memory cell array and sense amplifier array 610, a row driver 620, a column driver 630, an output circuit 640, and a control logic circuit 650.

Control signals (CE, WE, and RE), an address signal ADDR, a data signal WDATA, and the like are input to the memory device 600 from the outside. The address signal ADDR is input to a row decoder 621 and a column decoder 631, and the data signal WDATA is input to a write circuit 633. The control signals are input to the control logic circuit 650.

To the memory device 600, a low power supply voltage VSS, a high power supply voltage VDD, and the like are supplied from the outside as power supply voltages.

In the memory cell array and sense amplifier array 610, memory cells and sense amplifier blocks are arranged two-dimensionally. For the memory cells and the sense amplifier blocks, the other embodiments in this specification can be used as appropriate. The memory device 500 illustrated in FIGS. 1A and 1B and FIG. 2 is arranged two-dimensionally. The row driver 620 and the memory cell array and sense amplifier array 610 are connected to each other with word lines WLUL(i) and WLUR(i) (i is an integer of 1 to kU and kU is an integer of 1 or more), word lines WLDL(j) and WLDR(j) (j is an integer of 1 to kD and kD is an integer of 1 or more), wirings ISOU, ISOD, CS, EQ, NACT, and PACT, and the like. These wirings are driven by the row driver 620. The column driver 630 and the memory cell array and sense amplifier array 610 are connected to each other with the data lines DLL and DLR and the like. The data lines are driven by the sense amplifier blocks or the column driver 630.

The wiring CS may be driven by the column driver 630 so that one of a plurality of rows of sense amplifier blocks is driven.

The row driver 620 includes the row decoder 621. The address signal ADDR and output of the control logic circuit 650 are input to the row driver 620. The row driver 620 outputs signals to the word lines connected to the memory cell array and sense amplifier array 610, the wirings ISOU, ISOD, and CS for controlling the sense amplifier, and the like. The row decoder 621 selects a row of memory cells on which reading or writing is performed, in accordance with the address signal ADDR.

The column driver 630 includes the column decoder 631, a reading circuit 632, and a writing circuit 633. The address signal ADDR, the data signal WDATA, and output of the control logic circuit 650 is input to the column driver 630. The column decoder 631 selects a column on which reading or writing is performed, in accordance with the address signal ADDR. The reading circuit 632 includes a sense amplifier (also referred to as a main amplifier), and detects and amplifies potentials of the data lines DLL and DLR, and outputs data to the output circuit 640. The reading circuit 632 may have a function of storing data. The writing circuit 633 outputs data for writing to the data lines DLL and DLR in accordance with the input data WDATA. A precharge circuit having a function of precharging the data lines may be included.

The output circuit 640 outputs data output from the reading circuit 632 to the outside of the memory device 600 as a digital data signal RDATA.

The control logic circuit 650 generates signals and the like for controlling the row decoder 621 and the column decoder 631 using the input signals (CE, WE, and RE) input from the outside. CE, WE, and RE are a chip enable signal, a write enable signal, and a read enable signal, respectively. Signals processed by the control logic circuit 650 are not limited to those listed above, and other control signals may be input as necessary.

Note that the decision whether the circuits and signals described above are used or not can be made as appropriate as needed.

By using any of the other embodiments in this specification, for example, the memory device 500 illustrated in FIGS. 1A and 1B and FIG. 2 as the memory device of one embodiment of the present invention, the capacitance of the capacitor C can be lowered, and the memory cell array and sense amplifier arrays 610 can be arranged efficiently and two-dimensionally. Thus, a memory device including a circuit capable of reducing power consumption, a memory device including a circuit capable of improving the operation speed, or a downsized memory device can be provided.

This embodiment can be combined with any of the other embodiments in this specification as appropriate.

Embodiment 3

The transistor 490 can have a variety of structures. In this embodiment, only the transistor 490 and the region in the vicinity thereof are illustrated in FIGS. 22A and 22B, FIGS. 23A and 23B, and FIGS. 24A and 24B for easy understanding.

Figure 22A:
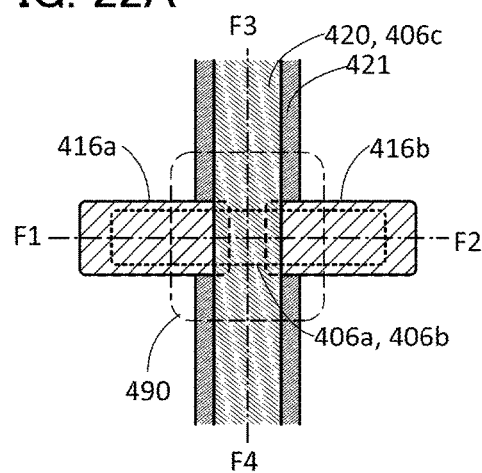
FIGS. 22A and 22B are a top view and a cross-sectional view of a transistor.
Figure 22B:
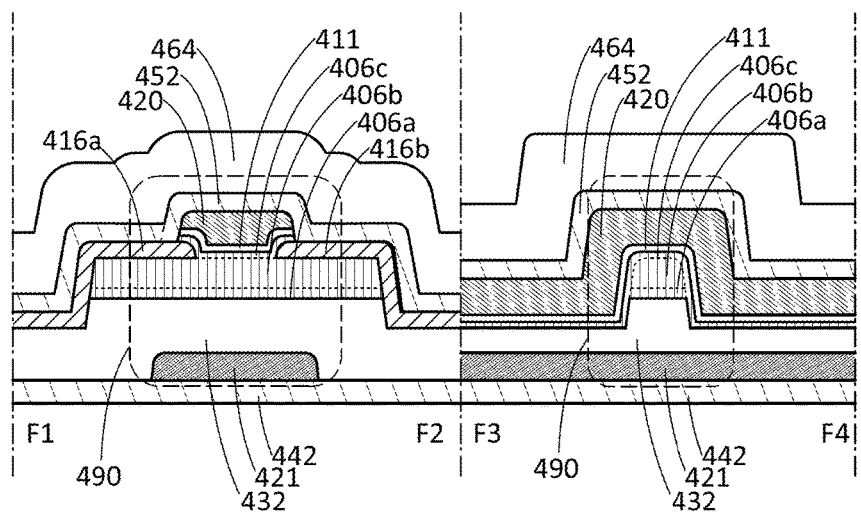

FIG. 22A is a top view illustrating a structure example of the transistor 490. FIG. 22B is an example of a cross-sectional view taken along dashed-dotted line F1-F2 and dashed-dotted line F3-F4 in FIG. 22A. Note that some components such as an insulator are omitted in FIG. 22A for easy understanding.

Although in the transistor 490 illustrated in FIG. 9, the structure example where the conductor 416a and the conductor 416b which function as a source and a drain are in contact with only a top surface of the semiconductor 406b is shown, the structure of the transistor 490 is not limited thereto. For example, as illustrated in FIGS. 22A and 22B, the conductor 416a and the conductor 416b may be in contact with the top surface and the side surfaces of the semiconductor 406b, the top surface of the insulator 432, and the like.

Like the transistor 490 illustrated in FIG. 9, the transistor having the structure illustrated in FIGS. 22A and 22B has the structure in which the conductor 420 electrically surrounds the semiconductor 406b in the channel width direction and the side surfaces as well as the top surface of the semiconductor 406b are surrounded. This is the s-channel structure. For the s-channel structure, the description of the above embodiments can be referred to. With the s-channel structure, even a miniaturized transistor can have excellent electrical characteristics such as a high on-state current, a low subthreshold swing, and a low off-state current.

In the transistor having the structure illustrated in FIGS. 22A and 22B, the conductors 416a and 416b are in contact with side surfaces of the semiconductor 406a and the top surface and side surfaces of the semiconductor 406b. In addition, the semiconductor 406c is in contact with the side surfaces of the semiconductor 406a, the top and side surfaces of the semiconductor 406b, a top surface and side surfaces of the conductor 416a, and a top surface and side surfaces of the conductor 416b.

The semiconductor 406b in contact with the conductors 416a and 416b, in which donor levels are formed by entry of hydrogen into oxygen vacancy sites in some cases, includes an n-channel conductive region. A state in which hydrogen enters sites of oxygen vacancies are denoted by VoH in some cases. Because of current flow in the n-channel conductive region, high on-state current can be obtained.

Figure 23A:
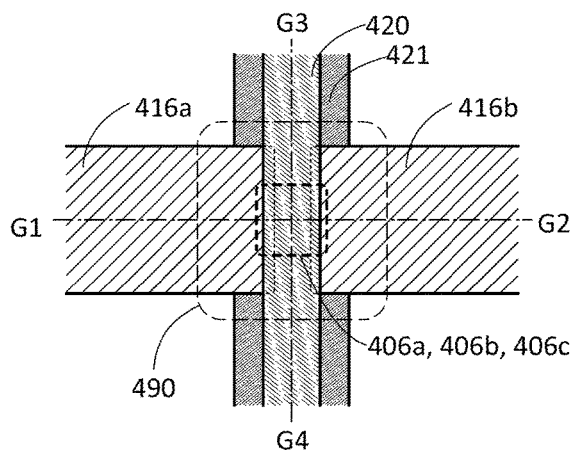
FIGS. 23A and 23B are a top view and a cross-sectional view of a transistor.
Figure 23B:
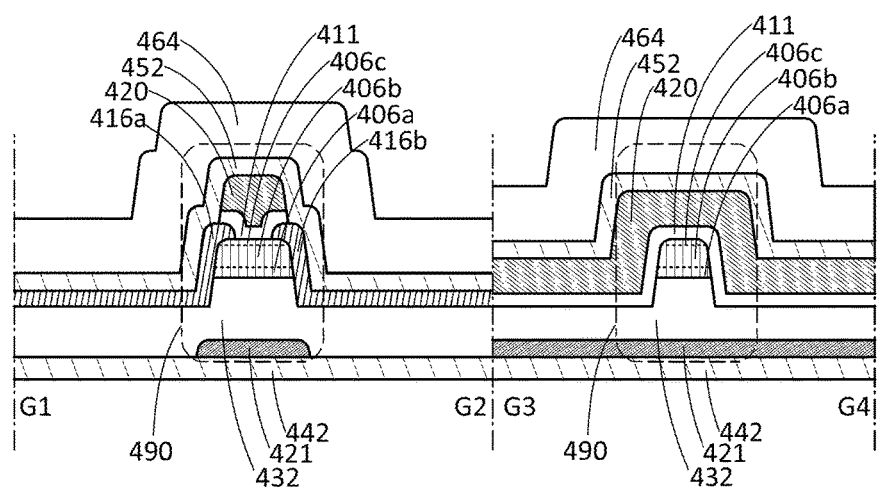

FIG. 23A is a top view illustrating a structure example of the transistor 490. FIG. 23B illustrates an example of a cross-sectional view taken along dashed-dotted line G1-G2 and dashed-dotted line G3-G4 in FIG. 23A. Note that some components such as an insulator are omitted in FIG. 23A for easy understanding.

The transistor 490 in FIGS. 23A and 23B includes the conductor 421 over the insulator 442; the insulator 432 having a projection over the insulator 442 and the conductor 421; the semiconductor 406a over the projection of the insulator 432; the semiconductor 406b over the semiconductor 406a; the semiconductor 406c over the semiconductor 406b; the conductor 416a and the conductor 416b which are in contact with the semiconductor 406a, the semiconductor 406b, and the semiconductor 406c and which are arranged to be separated from each other; the insulator 411 over the semiconductor 406c, the conductor 416a, and the conductor 416b; the conductor 420 over the insulator 411; the insulator 452 over the conductor 416a, the conductor 416b, the insulator 411, and the conductor 420; and the insulator 464 over the insulator 452.

The insulator 411 is in contact with at least side surfaces of the semiconductor 406b in the cross section taken along line G3-G4. The conductor 420 faces a top surface and the side surfaces of the semiconductor 406b with at least the insulator 411 provided therebetween in the cross section taken along line G3-G4. The conductor 421 faces a bottom surface of the semiconductor 406b with the insulator 432 provided therebetween. In the transistor 490, the insulator 432 does not necessarily include a projection. The semiconductor 406c is not necessarily provided. The insulator 452 is not necessarily provided. The insulator 464 is not necessarily provided.

The structure of the transistor 490 illustrated in FIGS. 23A and 23B is partly different from that of the transistor 490 in FIGS. 22A and 22B. Specifically, the structures of the semiconductors 406a to 406c of the transistor 490 illustrated in FIGS. 23A and 23B are different from the structures of the semiconductors 406a to 406c of the transistor 490 in FIGS. 22A and 22B. Thus, for the transistor in FIGS. 23A and 23B, the description of the transistor in FIGS. 22A and 22B can be referred to as appropriate.

Figure 24A:
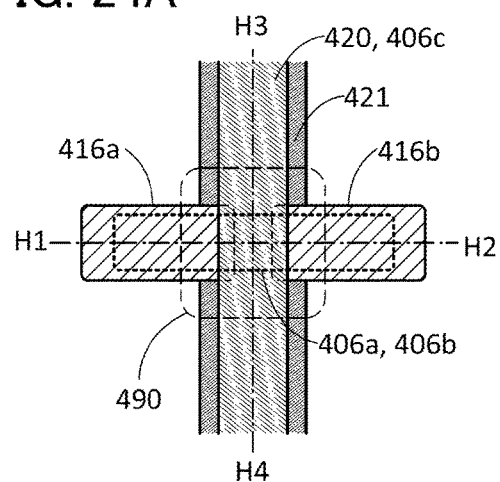
FIGS. 24A and 24B are a top view and a cross-sectional view of a transistor.
Figure 24B:
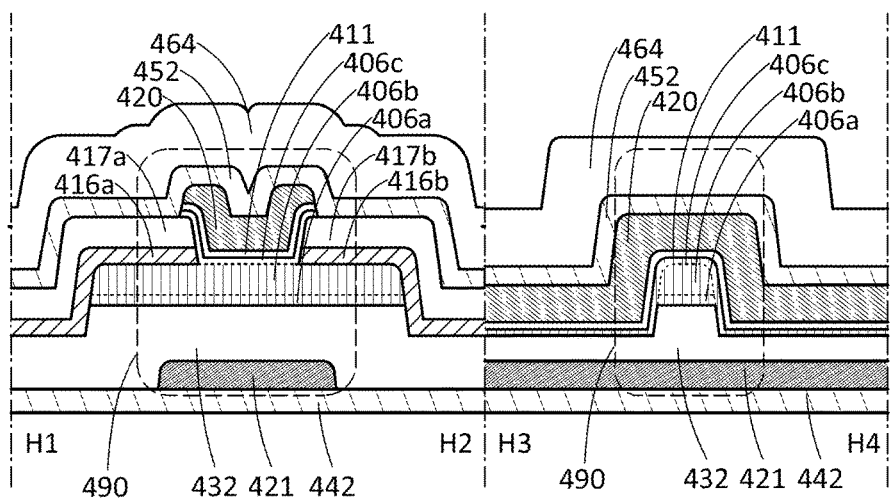

FIG. 24A is a top view illustrating a structure example of the transistor 490. FIG. 24B is an example of a cross-sectional view taken along dashed-dotted line H1-H2 and dashed-dotted line H3-H4 in FIG. 24A. Note that some components such as an insulator are omitted in FIG. 24A for easy understanding.

The structure of the transistor 490 illustrated in FIGS. 24A and 24B is partly different from that of the transistor 490 illustrated in FIGS. 22A and 22B. Specifically, in the transistor 490 in FIGS. 24A and 24B, insulators 417a and 417b are provided over the conductors 416a and 416b, respectively. Thus, in the transistor 490 in FIGS. 24A and 24B, capacitance between a gate (conductor 420) and a source or a drain (conductor 416a or 416b) is reduced compared with that in the transistor 490 illustrated in FIGS. 22A and 22B. Accordingly, the transistor 490 with an increased switching speed or a shortened time required for switching can be obtained.

The other portions of the transistor 490 illustrated in FIGS. 24A and 24B are the same as those of the transistor 490 illustrated in FIGS. 22A and 22B. Thus, for the transistor in FIGS. 24A and 24B, the description of the transistor in FIGS. 22A and 22B can be referred to as appropriate.

This embodiment can be combined with any of the other embodiments in this specification as appropriate.

Embodiment 4

A structure of an oxide semiconductor which can be used as the semiconductor 406a, the semiconductor 406b, the semiconductor 406c, or the like is described below. In this specification, the trigonal and rhombohedral crystal systems are included in the hexagonal crystal system.

Oxide semiconductors are classified roughly into a single-crystal oxide semiconductor and a non-single-crystal oxide semiconductor. The non-single-crystal oxide semiconductor includes any of a c-axis aligned crystalline oxide semiconductor (CAAC-OS), a polycrystalline oxide semiconductor, a microcrystalline oxide semiconductor, an amorphous oxide semiconductor, and the like.

First, a CAAC-OS is described.

The CAAC-OS is one of oxide semiconductors having a plurality of c-axis aligned crystal parts.

With a transmission electron microscope (TEM), a combined analysis image (high-resolution TEM image) of a bright-field image and a diffraction pattern of the CAAC-OS is observed, and a plurality of crystal parts can be clearly observed. However, in the high-resolution TEM image, a boundary between crystal parts, that is, a grain boundary is not clearly observed. Thus, in the CAAC-OS, a reduction in electron mobility due to the grain boundary is less likely to occur.

In the high-resolution cross-sectional TEM image of the CAAC-OS observed in a direction substantially parallel to the sample surface, metal atoms arranged in a layered manner are seen in the crystal parts. Each metal atom layer has a morphology reflecting a surface over which the CAAC-OS is formed (hereinafter, a surface over which the CAAC-OS is formed is referred to as a formation surface) or a top surface of the CAAC-OS, and is arranged parallel to the formation surface or the top surface of the CAAC-OS.

In the high-resolution plan-view TEM image of the CAAC-OS observed in a direction substantially perpendicular to the sample surface, metal atoms arranged in a triangular or hexagonal configuration are seen in the crystal parts. However, there is no regularity of arrangement of metal atoms between different crystal parts.

For example, when a local Fourier transform image of the high-resolution cross-sectional TEM image of a CAAC-OS is observed, the angle of the c-axis continuously and gradually changes from 14.3°, 16.6°, and 26.4° in a plurality of adjacent regions each having a diameter of 4 nm in some cases. In addition, in the other plurality of adjacent regions, the direction of the c-axis is different from that of the c-axis which changes continuously. In that case, the other plurality of adjacent regions have a different grain. For example, in the other plurality of adjacent regions, the angle of the c-axis continuously and gradually changes from −18.3°, −17.6°, and −15.9° in some cases.

Note that in an electron diffraction pattern of the CAAC-OS, spots (luminescent spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS, spots are observed. For example, spots corresponding to the vertices of a hexagon are observed. This is a diffraction pattern indicating c-axis alignment.

From the results of the high-resolution cross-sectional TEM image and the high-resolution plan-view TEM image, alignment is found in the crystal parts in the CAAC-OS.

A CAAC-OS is subjected to structural analysis with an X-ray diffraction (XRD) apparatus. For example, when the CAAC-OS including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that when the CAAC-OS with an $InGaZnO_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS. It is preferable that in the CAAC-OS, a peak appear when 2θ is around 31° and that a peak not appear when 2θ is around 36°.

The CAAC-OS is an oxide semiconductor having low impurity concentration. The impurity is an element other than the main components of the oxide semiconductor, such as hydrogen, carbon, silicon, or a transition metal element. In particular, an element that has higher bonding strength to oxygen than a metal element included in the oxide semiconductor, such as silicon, disturbs the atomic arrangement of the oxide semiconductor by depriving the oxide semiconductor of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor and causes a decrease in crystallinity when it is contained in the oxide semiconductor. Note that the impurity contained in the oxide semiconductor might serve as a carrier trap or a carrier generation source.

The CAAC-OS is an oxide semiconductor having a low density of defect states. In some cases, oxygen vacancies in the oxide semiconductor serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus can have a low carrier density. Therefore, a transistor including the oxide semiconductor rarely has negative threshold voltage (is rarely normally on). The highly purified intrinsic or substantially highly purified intrinsic oxide semiconductor has a low density of defect states, and thus has few carrier traps. Accordingly, the transistor including the oxide semiconductor has little variation in electrical characteristics and high reliability. Electric charge trapped by the carrier traps in the oxide semiconductor takes a long time to be released and might behave like fixed electric charge. Thus, the transistor including the oxide semiconductor having high impurity concentration and a high density of defect states has unstable electrical characteristics in some cases.

With the use of the CAAC-OS in a transistor, variation in the electrical characteristics of the transistor due to irradiation with visible light or ultraviolet light is small.

Next, a microcrystalline oxide semiconductor is described.

A microcrystalline oxide semiconductor has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor including nanocrystal is referred to as an nc-OS (nanocrystalline oxide semiconductor). In a high resolution TEM image of the nc-OS, a grain boundary cannot be found clearly in the nc-OS sometimes for example.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Accordingly, in some cases, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the diameter of a crystal part, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a crystal part (the electron diffraction is also referred to as selected-area electron diffraction). Meanwhile, spots are shown in a nanobeam electron diffraction pattern of the nc-OS obtained by using an electron beam having a probe diameter close to, or smaller than the diameter of a crystal part. Moreover, in a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases.

The nc-OS is an oxide semiconductor that has high regularity as compared to an amorphous oxide semiconductor. Thus, the nc-OS has a lower density of defect states than an amorphous oxide semiconductor. Note that there is no regularity of crystal orientation between different crystal parts in the nc-OS. Hence, the nc-OS has a higher density of defect states than the CAAC-OS.

Next, an amorphous oxide semiconductor is described.

The amorphous oxide semiconductor has disordered atomic arrangement and no crystal part. For example, the amorphous oxide semiconductor does not have a specific state as in quartz.

In the high-resolution TEM image of the amorphous oxide semiconductor, crystal parts cannot be found.

When the amorphous oxide semiconductor is subjected to structural analysis by an out-of-plane method with an XRD apparatus, a peak showing a crystal plane does not appear. A halo pattern is shown in an electron diffraction pattern of the amorphous oxide semiconductor. Furthermore, a halo pattern is shown but a spot is not shown in a nanobeam electron diffraction pattern of the amorphous oxide semiconductor.

Note that an oxide semiconductor may have a structure having physical properties between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be seen. Furthermore, in the high-resolution TEM image, there are a region where a crystal part is clearly observed and a region where a crystal part is not observed. In the a-like OS, crystallization by a slight amount of electron beam used for TEM observation occurs and growth of the crystal part is found sometimes. In contrast, crystallization by a slight amount of electron beam used for TEM observation is less observed in the nc-OS having good quality.

Note that the crystal part size in the a-like OS and the nc-OS can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Thus, the distance between the adjacent layers is equivalent to the lattice spacing on the (009) plane (also referred to as d value). The value is calculated to be 0.29 nm from crystal structural analysis. Thus, each of the lattice fringes having a distance therebetween of from 0.28 nm to 0.30 nm is regarded as corresponding to the a-b plane of the $InGaZnO_4$ crystal, focusing on the lattice fringes in the high-resolution TEM image.

Furthermore, the film density of the oxide semiconductor film varies depending on the structure in some cases. For example, the structure of an oxide semiconductor film can be estimated by comparing the film density of the oxide semiconductor film with the film density of a single crystal oxide semiconductor film having the same composition as the oxide semiconductor film. For example, the film density of the a-like OS film is 78.6% or higher and lower than 92.3% of the film density of the single crystal oxide semiconductor film having the same composition. For example, the film density of each of the nc-OS film and the CAAC-OS film is 92.3% or higher and lower than 100% of the film density of the single crystal oxide semiconductor film having the same composition. Note that it is difficult to form an oxide semiconductor film having a film density of lower than 78% of the film density of the single crystal oxide semiconductor film having the same composition.

Specific examples of the above description are given. For example, in an oxide semiconductor film in which the atomic ratio of In to Ga and Zn is 1:1:1, the film density of a single crystal of $InGaZnO_4$ with a rhombohedral crystal structure is 6.357 $g/cm^3$. Thus, for example, in the oxide semiconductor film in which the atomic ratio of In to Ga and Zn is 1:1:1, the film density of the a-like OS film is higher than or equal to 5.0 $g/cm^3$ and lower than 5.9 $g/cm^3$. For example, in the case of the oxide semiconductor film in which the atomic ratio of In to Ga and Zn is 1:1:1, the film density of each of the nc-OS film and the CAAC-OS film is higher than or equal to 5.9 g/cm$^3$ and lower than 6.3 g/cm$^3$.

However, there might be no single crystal oxide semiconductor film having the same composition as the oxide semiconductor film. In that case, single crystal oxide semiconductor films with different compositions are combined in an adequate ratio to calculate film density equivalent to that of a single crystal oxide semiconductor film with the desired composition. The film density of the single crystal oxide semiconductor film with the desired composition may be obtained by calculating the weighted average of the film densities of the single crystal oxide semiconductor films with the different compositions in consideration of the combination ratio therebetween. The film density of the single crystal oxide having the desired composition can be calculated using a weighted average according to the combination ratio of the single crystal oxides with different compositions. Note that it is preferable to use as few kinds of single crystal oxide semiconductor film as possible to calculate the film density.

Note that an oxide semiconductor may be a stacked film including two or more of an amorphous oxide semiconductor, an a-like OS, a microcrystalline oxide semiconductor, and a CAAC-OS, for example.

The above oxide semiconductor can be used as the semiconductor 406a, the semiconductor 406b, the semiconductor 406c, or the like.

Next, the other components of a semiconductor which can be used as the semiconductor 406a, the semiconductor 406b, the semiconductor 406c, or the like are described.

The oxide semiconductor that can be used as the semiconductor 406b is an oxide semiconductor containing indium, for example. The semiconductor 406b can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

Avalanche breakdown or the like is less likely to occur in some cases in the transistor including an oxide semiconductor than in a general transistor including silicon or the like, because, for example, an oxide semiconductor has a wide bandgap and thus electrons are less likely to be excited, and the effective mass of a hole is large. Therefore, it may be possible to inhibit hot-carrier degradation due to avalanche breakdown, for example. Accordingly, the drain withstand voltage can be increased, so that the transistor can be driven at a higher drain voltage. Thus, in some cases, a higher voltage, that is, more states can be held by a floating node, increasing storage density.

The semiconductor 406a, the semiconductor 406b, and the semiconductor 406c preferably include at least indium. In the case of using an In-M-Zn oxide as the semiconductor 406a, when the summation of In and M is assumed to be 100 atomic %, the proportions of In and M are preferably set to be less than 50 atomic % and greater than or equal to 50 atomic %, respectively, or further preferably less than 25 atomic % and greater than or equal to 75 atomic %, respectively. In the case of using an In-M-Zn oxide as the semiconductor 406b, when the summation of In and M is assumed to be 100 atomic %, the proportions of In and M are preferably set to be greater than or equal to 25 atomic % and less than 75 atomic %, respectively, or further preferably greater than or equal to 34 atomic % and less than 66 atomic %, respectively. In the case of using an In-M-Zn oxide as the semiconductor 406c, when the summation of In and M is assumed to be 100 atomic %, the proportions of In and M are preferably set to be less than 50 atomic % and greater than or equal to 50 atomic %, respectively, or further preferably less than 25 atomic % and greater than or equal to 75 atomic %, respectively. Note that the semiconductor 406c may be an oxide that is a type the same as that of the semiconductor 406a.

As the semiconductor 406b, an oxide having an electron affinity higher than those of the semiconductors 406a and 406c is used. For example, as the semiconductor 406b, an oxide having an electron affinity higher than those of the semiconductors 406a and 406c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the semiconductor 406c preferably includes an indium gallium oxide. The gallium atomic ratio [In/(In+Ga)] is, for example, higher than or equal to 70%, preferably higher than or equal to 80%, more preferably higher than or equal to 90%.

At this time, when an electric field is applied to a gate, a channel is formed in the semiconductor 406b having the highest electron affinity in the semiconductors 406a, 406b, and 406c. Thus, the field effect mobility of the transistor can be increased. Here, the semiconductor 406b and the semiconductor 406c have the common constituent elements and thus interface scattering hardly occurs therebetween.

Figure 25A:
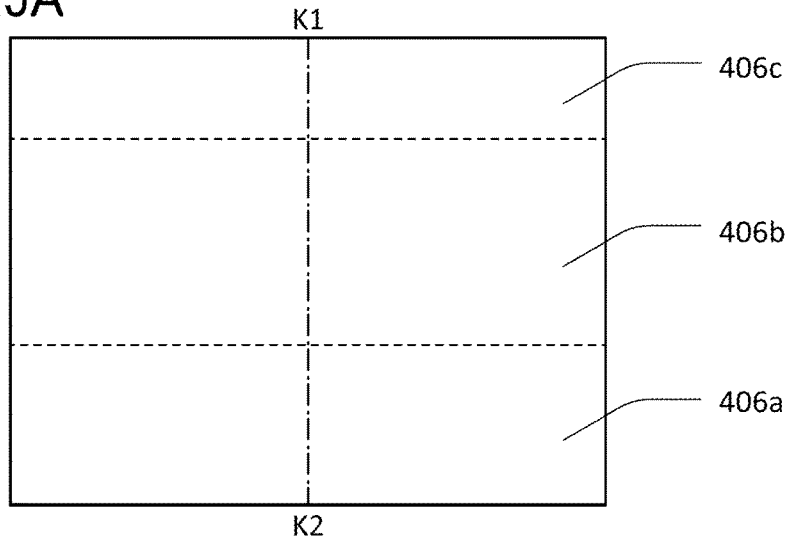
FIGS. 25A to 25C are a cross-sectional view of stacked semiconductor layers and diagrams showing a band structure.
Figure 25B:
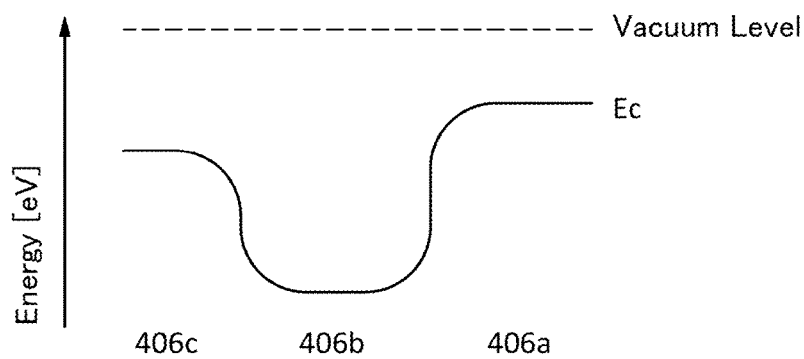
Figure 25C:
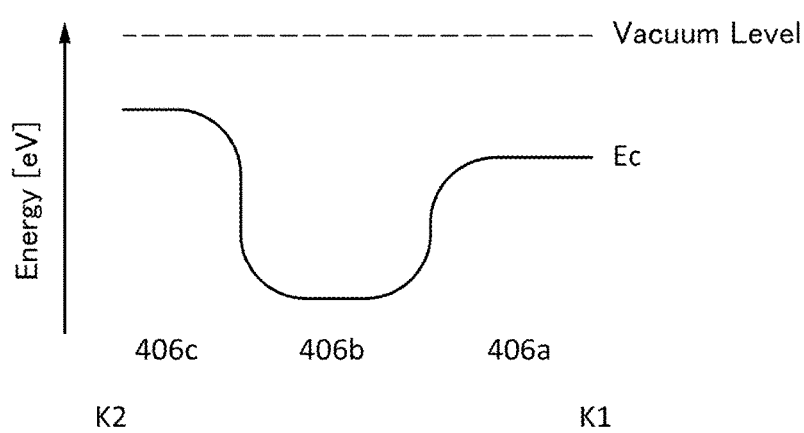

Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low density of interface states. For that reason, the stack of the semiconductor 406a, the semiconductor 406b, and the semiconductor 406c has a band structure where energy at each interface and in the vicinity of the interface is changed continuously (continuous junction). Note that FIG. 25A is a cross-sectional view in which the semiconductor 406a, the semiconductor 406b, and the semiconductor 406c are stacked in this order. FIG. 25B shows energy (Ec) of the bottom of the conduction band corresponding to dashed-dotted line K1-K2 in FIG. 25A when the semiconductor 406c has a higher electron affinity than the semiconductor 406a. FIG. 25C shows the case where the semiconductor 406c has a lower electron affinity than the semiconductor 406a.

At this time, electrons move mainly in the semiconductor 406b, not in the semiconductor 406a and the semiconductor 406c. As described above, when the interface state density at the interface between the semiconductor 406a and the semiconductor 406b and the interface state density at the interface between the semiconductor 406b and the semiconductor 406c are decreased, electron movement in the semiconductor 406b is less likely to be inhibited and the on-state current of the transistor can be increased.

For example, the semiconductor 406a and the semiconductor 406c include one or more elements other than oxygen included in the semiconductor 406b. Since the semiconductor 406a and the semiconductor 406c each include one or more elements other than oxygen included in the semiconductor 406b, an interface state is less likely to be formed at the interface between the semiconductor 406a and the semiconductor 406b and the interface between the semiconductor 406b and the semiconductor 406c.

Furthermore, the semiconductors 406a, 406b, and 406c preferably have no or a small amount of spinel crystal structures. Moreover, the semiconductors 406a, 406b, and 406c are preferably CAAC-OS.

For example, when a CAAC-OS having a plurality of c-axis aligned crystal parts is used as the semiconductor 406a, the semiconductor 406b formed thereover can have a region with favorable c-axis alignment even in the vicinity of the interface with the semiconductor 406a.

The semiconductor 406b is preferably a semiconductor in which oxygen vacancies are reduced.

For example, in the case were the semiconductor 406b contains oxygen vacancies (also denoted by $V_O$), donor levels are formed by entry of hydrogen into oxygen vacancy sites in some cases. A state in which hydrogen enters oxygen vacancy sites is denoted by VoH in the following description in some cases. $V_O$H is a factor of decreasing the on-state current of the transistor because $V_O$H scatters electrons. Note that oxygen vacancy sites become more stable by entry of oxygen than by entry of hydrogen. Thus, by decreasing oxygen vacancies in the semiconductor 406b, the on-state current of the transistor can be increased in some cases.

To decrease oxygen vacancies in the semiconductor 406b, for example, there is a method in which excess oxygen in the insulator 432 is moved to the semiconductor 406b through the semiconductor 406a. In this case, the semiconductor 406a is preferably a layer having an oxygen-transmitting property (a layer through which oxygen passes or is transmitted).

Oxygen is released from the insulator 432 and taken into the semiconductor 406a by heat treatment or the like. In some cases, oxygen exists and is apart from atoms in the semiconductor 406a, or exists and is bonded to oxygen or the like. As the density becomes lower, i.e., the number of spaces between the atoms becomes larger, the semiconductor 406a has a higher oxygen-transmitting property. For example, in the case where the semiconductor 406a has a layered crystal structure and oxygen movement in which oxygen crosses the layer is less likely to occur, the semiconductor 406a is preferably a layer having low crystallinity as appropriate.

Moreover, the thickness of the semiconductor 406c is preferably as small as possible to increase the on-state current of the transistor. The semiconductor 406c has a region with a thickness of less than 10 nm, preferably less than or equal to 5 nm, more preferably less than or equal to 3 nm, for example. Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. The semiconductor 406c has a region with a thickness of greater than or equal to 0.3 nm, preferably greater than or equal to 1 nm, more preferably greater than or equal to 2 nm, for example. The semiconductor 406c preferably has an oxygen blocking property to suppress outward diffusion of oxygen released from the insulator 432 and the like.

To improve reliability, preferably, the thickness of the semiconductor 406a is large and the thickness of the semiconductor 406c is small. For example, the semiconductor 406a has a region with a thickness of, for example, greater than or equal to 10 nm, preferably greater than or equal to 20 nm, more preferably greater than or equal to 40 nm, still more preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device might be decreased, the semiconductor 406a has a region with a thickness of, for example, less than or equal to 200 nm, preferably less than or equal to 120 nm, more preferably less than or equal to 80 nm.

For example, a region in which the concentration of silicon which is measured by secondary ion mass spectrometry (SIMS) is lower than $1\times10^{19}$ atoms/cm$^3$, preferably lower than $5\times10^{18}$ atoms/cm$^3$, or further preferably lower than $2\times10^{18}$ atoms/cm$^3$ is provided between the semiconductor 406b and the semiconductor 406a. A region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor 406b and the semiconductor 406c.

It is preferable to reduce the concentration of hydrogen in the semiconductor 406a and the semiconductor 406c in order to reduce the concentration of hydrogen in the semiconductor 406b. The semiconductor 406a and the semiconductor 406c each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the semiconductor 406a and the semiconductor 406c in order to reduce the concentration of nitrogen in the semiconductor 406b. The semiconductor 406a and the semiconductor 406c each have a region in which the concentration of nitrogen measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In the case where gallium oxide is used for the semiconductor 406c, indium in the semiconductor 406b can be prevented from being diffused into the gate insulator; thus, the leakage current of the transistor can be reduced.

For example, when an In—Ga—Zn oxide film formed by a sputtering method is used as each of the semiconductors 406a and 406c, the semiconductors 406a and 406c can be deposited with the use of an In—Ga—Zn oxide target having an atomic ratio of In:Ga:Zn=1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

In the case where the semiconductor 406*b* is a CAAC-OS, the semiconductor 406*b* is preferably deposited using a polycrystalline target containing an In—Ga—Zn oxide (In:Ga:Zn=1:1:1 [atomic ratio]). The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

The structures and the other elements of the oxide semiconductor that can be used for the semiconductors 406*a*, 406*b*, and 406*c* and the like have been described so far. By using the above-described oxide semiconductor in the semiconductors 406*a*, 406*b*, and 406*c* and the like, the transistor 490 can have favorable electrical characteristics. For example, excellent subthreshold characteristics and an extremely low off-state current can be achieved. Moreover, a high on-state current and favorable switching speed can be achieved. Furthermore, high withstand voltage can be achieved.

This embodiment can be combined with any of the other embodiments in this specification as appropriate.

Embodiment 5

In this embodiment, application examples of the memory device described in the above embodiments to an electronic component and to an electronic device including the electronic component will be described with reference to FIGS. 26A and 26B and FIGS. 27A to 27F.

Figure 26A:
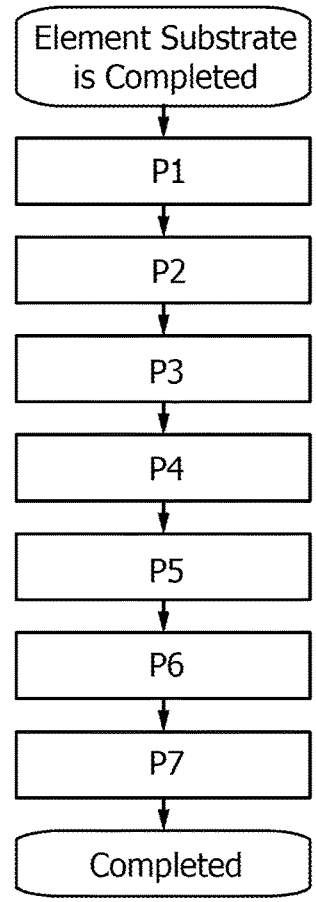
FIG. 26A is a flowchart showing a fabrication process of an electronic component.

FIG. 26A shows an example where the memory device of one embodiment of the present invention is used to make an electronic component. Note that an electronic component is also referred to as a semiconductor package or an IC package. This electronic component has a plurality of standards and names depending on a terminal extraction direction and a terminal shape. Thus, examples of the electronic component are described in this embodiment.

The electronic component can be completed after an assembly process (post-process) by using a plurality of components that can be detached and attached from and to a printed wiring board in combination. An assembly process (post-process) is described with reference to FIG. 26A.

After an element substrate obtained in the preceding process is completed, a back surface of the substrate is ground (Step P1). By thinning the substrate at this stage, the warpage or the like of the substrate in the preceding process is reduced and the component is downsized.

A dicing step of grinding the back surface of the substrate to separate the substrate into a plurality of chips is performed. Then, a die bonding step of individually picking up separate chips to be mounted on and bonded to a lead frame is performed (Step P2). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step P3). As a metal wire, a silver wire or a gold wire can be used. For wire bonding, ball bonding or wedge bonding can be employed.

A wire-bonded chip is subjected to a molding step of sealing the chip with an epoxy resin or the like (Step P4). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step P5). With the plating process, corrosion of the lead can be prevented, and soldering for mounting the electronic component on a printed wiring board in a later step can be performed with higher reliability.

Next, printing (marking) is performed on a surface of the package (Step P6). Then, through a final test step (Step P7), the electronic component is completed.

The above electronic component can include the memory device of one embodiment of the present invention. Thus, an electronic component capable of reducing power consumption, an electronic component capable of increasing the operation speed, or an electronic component capable of being downsized can be provided.

Figure 26B:
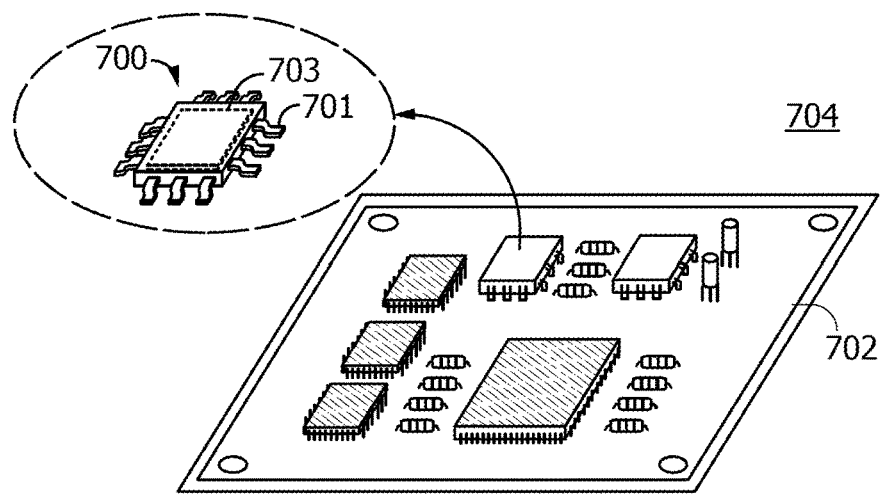
FIG. 26B is a schematic view of the electronic component.

FIG. 26B is a perspective schematic diagram of the completed electronic component. FIG. 26B shows a perspective schematic diagram of a quad flat package (QFP) as an example of the electronic component. An electronic component 700 illustrated in FIG. 26B includes a lead 701 and a memory device 703. The electronic component 700 in FIG. 26B is, for example, mounted on a printed wiring board 702. The plurality of electronic components 700 are used in combination to be electrically connected to each other over the printed wiring board 702; thus, a circuit board on which the electronic components are mounted (a circuit board 704) is completed. The completed circuit board 704 is provided in an electronic device or the like.

The above-described electronic component can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the above-described electronic component are mobile phones, game machines including portable game consoles, portable data terminals, e-book readers, wrist-watch-type information terminals, laptop personal computers, cameras such as video cameras and digital still cameras, goggle-type display devices (head mounted displays), navigation systems, audio reproducing devices (e.g., car audio systems and digital audio players), copiers, facsimiles, printers, multifunction printers, automated teller machines (ATM), vending machines, and automobiles. FIGS. 27A to 27F illustrate specific examples of these electronic devices.

Figure 27A:
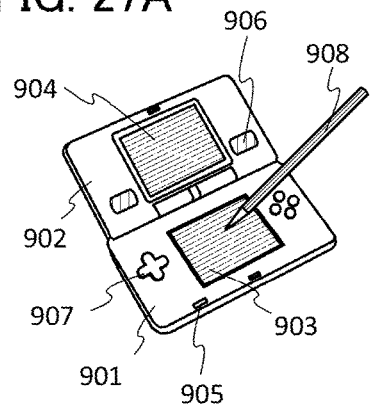
FIGS. 27A to 27F each illustrate an electronic device of one embodiment of the present invention.

FIG. 27A illustrates a portable game console including a housing 901, a housing 902, a display portion 903, a display portion 904, a microphone 905, a speaker 906, an operation key 907, a stylus 908, and the like. Although the portable game console in FIG. 27A has the two display portions 903 and 904, the number of display portions included in a portable game console is not limited to this.

Figure 27B:
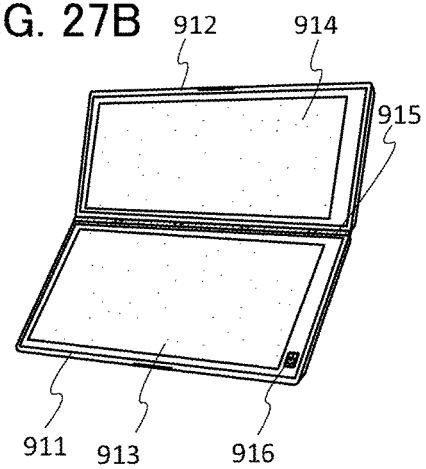

FIG. 27B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel portion of a display device.

Figure 27C:
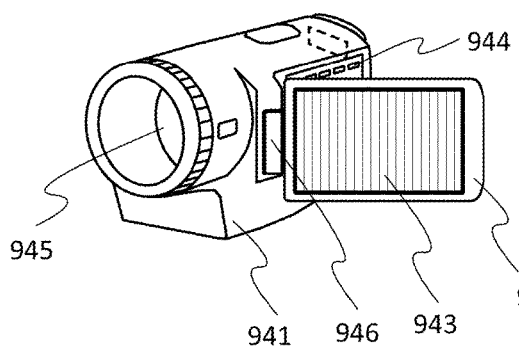

FIG. 27C illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 27D:
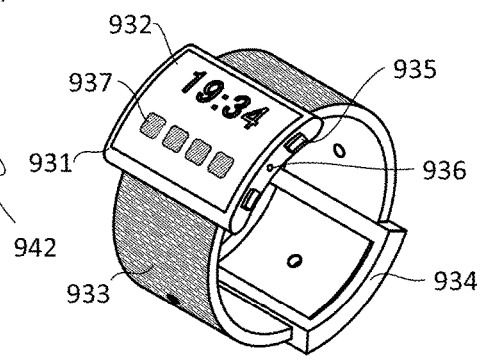

FIG. 27D illustrates an example of a wrist-watch-type information terminal, which includes a housing 931, a display portion 932, a band 933, a buckle 934, operation buttons 935, an input/output terminal 936, and the like. The information terminal is capable of executing a variety of applications such as mobile phone calls, e-mailing, reading and editing texts, music reproduction, Internet communication, and a computer game. The display surface of the display portion 932 is bent, and images can be displayed on the bent display surface. The display portion 932 includes a touch sensor, and operation control can be performed by touching the screen with a finger, a stylus, or the like. The information terminal can employ near field communication, which is a communication method based on an existing communication standard. Moreover, the information terminal includes the input/output terminal 936, and data can be directly transmitted to and received from another information terminal via a connector.

Figure 27E:
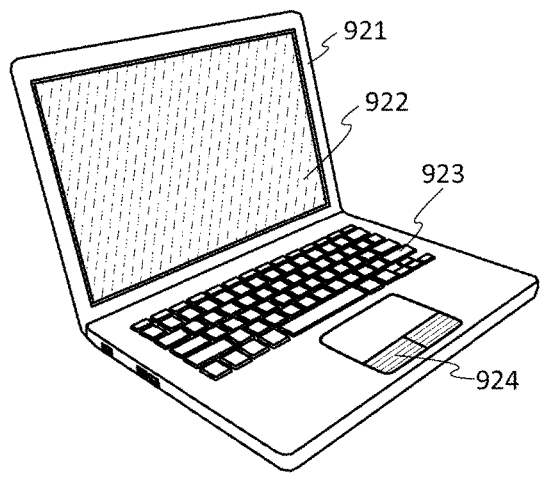

FIG. 27E illustrates a laptop personal computer, which includes a housing 921, a display portion 922, a keyboard 923, a pointing device 924, and the like.

Figure 27F:
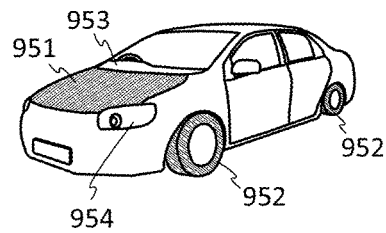

FIG. 27F illustrates an ordinary vehicle including a car body 951, wheels 952, a dashboard 953, lights 954, and the like. The ordinary vehicle includes a variety of in-vehicle sensors, a battery, electronic components for controlling the in-vehicle sensors and the battery, and the like.

By applying an electronic component which enables low power consumption, high-speed operation, or miniaturization including the memory device of one embodiment the present invention to these electronic devices, an electronic device which consumes less power, an electronic device with improved operation speed, or a small-sized electronic device can be provided.

This embodiment can be combined with any of the other embodiments in this specification as appropriate.

In this specification, a "semiconductor" may have characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

In this specification, an impurity in a semiconductor refers to, for example, elements other than the main components of a semiconductor. For example, an element with a concentration of lower than 0.1 atomic % is an impurity. When an impurity is contained, DOS may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Furthermore, in the case where the semiconductor is silicon, examples of an impurity which changes characteristics of the semiconductor include oxygen, Group 1 elements except hydrogen, Group 2 elements, Group 13 elements, and Group 15 elements.

In this specification, an insulator may be formed to have, for example, a single-layer structure or a stacked-layer structure including an insulator containing one or more of boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum unless otherwise specified. A resin may be used as the insulator. For example, a resin containing polyimide, polyamide, acrylic, silicone, or the like may be used. The use of a resin does not need planarization treatment performed on a top surface of the insulator in some cases. By using a resin, a thick film can be formed in a short time; thus, the productivity can be increased. The insulator may be preferably formed to have a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

In this specification, unless otherwise specified, a conductor may be formed to have, for example, a single-layer structure or a stacked-layer structure including a conductor containing one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound film of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

For example, in this specification and the like, when it is explicitly described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X and Y each denote an object (e.g., a device, an element, a circuit, a line, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit description "X and Y are electrically connected" is the same as the explicit description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Here, each of X, Y, Z1, and Z2 denotes an object (e.g., a device, an element, a circuit, a wiring, an electrode, a terminal, a conductive film, a layer, or the like).

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constructed. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the invention can be clear. Furthermore, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the contents taken out from part of the diagram or the text are also disclosed as one embodiment of the invention, and one embodiment of the invention can be constituted. The embodiment of the invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where $M<1V$). As another example, it is possible to constitute one embodiment of the invention by taking out M layers (M is an integer, where $M<1V$) from a cross-sectional view in which N layers (N is an integer) are provided. As another example, it is possible to constitute one embodiment of the invention by taking out M elements (M is an integer, where $M<1V$) from a flow chart in which N elements (N is an integer) are provided. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the invention is clear.

EXPLANATION OF REFERENCE

400: substrate, 402*a*, 402*b*: region, 406*a*, 406*b*, 406*c*: semiconductor, 411, 412: insulator, 416*a*, 416*b*: conductor, 420, 421: conductor, 470a, 470b, 470c, 470d: conductor, 471a, 471b, 471c: conductor, 472a, 472b, 4702, 472d: conductor, 490: transistor, 491a, 491b, 491c, 491d: transistor, 491e, 491f, 491g, 491h, 491i: conductor, 497: capacitor, 500: memory device, 510: memory cell, 520: sense amplifier block, and 530: sense amplifier.

This application is based on Japanese Patent Application serial no. 2014-098130 filed with Japan Patent Office on May 9, 2014, the entire contents of which are hereby incorporated by reference.

The invention claimed is:

1. A semiconductor device comprising:
a plurality of memory devices, each of the plurality of memory devices comprises:
a sense amplifier;
four first transistors;
a first insulating film over the sense amplifier;
four bit lines over the first insulating film;
a second insulating film over the four bit lines; and
a memory cell including a second transistor and a capacitor over the second insulating film,
wherein, in each of the plurality of memory devices:
the four bit lines are arranged in a first layer in two rows and two columns; and
the four bit lines are electrically connected to the sense amplifier through the respective four first transistors.

2. The semiconductor device according to claim 1,
wherein, in each of the plurality of memory devices:
the two columns are adjacent to each other in a first direction and the two rows are adjacent to each other in a second direction perpendicular to the first direction; and
the four bit lines extend in the second direction.

3. The semiconductor device according to claim 2,
wherein the plurality of memory devices are arranged in the first direction at a pitch of a width of two bit lines or more.

4. The semiconductor device according to claim 2,
wherein each of plurality of memory devices further comprises a plurality of sense amplifiers including the sense amplifier, and
wherein the plurality of sense amplifiers are arranged in the second direction at a pitch of a length of one bit line or more.

5. The semiconductor device according to claim 1,
wherein each of the plurality of memory devices further includes:
two data lines over the memory cell; and
two third transistors,
wherein the two data lines are electrically connected to the sense amplifier through the respective two third transistors.

6. The semiconductor device according to claim 1, wherein the second transistor is an oxide semiconductor transistor.

7. The semiconductor device according to claim 1, wherein the four first transistors are silicon transistors.

8. The semiconductor device according to claim 1,
wherein each of the plurality of memory devices further comprises a plurality of memory cells including the memory cell, and
wherein a total number of the plurality of memory cells connected to each of the four bit lines is 3 to 32 in each of the plurality of memory devices.

9. The semiconductor device according to claim 1, wherein capacitance of the capacitor is 0.1 fF to 10 fF.

10. An electronic device comprising:
the semiconductor device according to claim 1; and
a printed wiring board.

11. The semiconductor device according to claim 1, further comprising a substrate on which are formed the sense amplifier and the memory cell,
wherein one of the four bit lines extends in a direction generally parallel to a top surface of the substrate, and
wherein the sense amplifier and the one of the four bit lines overlap, and
wherein the one of the four bit lines and the memory cell overlap.

12. The semiconductor device according to claim 1, wherein a second layer comprising the sense amplifier and the first layer comprising the four bit lines are stacked in a vertical direction.

13. A semiconductor device comprising:
a plurality of sense amplifiers;
a plurality of first transistors;
a first insulating film over the plurality of sense amplifiers;
a plurality of bit lines over the first insulating film;
a second insulating film over the plurality of bit lines; and
a plurality of memory cells each including a second transistor and a capacitor over the second insulating film,
wherein the plurality of sense amplifiers are each electrically connected to four of the plurality of bit lines through respective four of the plurality of first transistors, and
wherein the four of the plurality of bit lines are arranged in a first layer in two rows and two columns.

14. The semiconductor device according to claim 13,
wherein a direction in which the plurality of bit lines extend is referred to as a second direction and a direction perpendicular to the second direction is referred to as a first direction,
wherein the plurality of bit lines are arranged two-dimensionally at a pitch of a first distance in the first direction and at a pitch of a second distance in the second direction, and
wherein the plurality of sense amplifiers are arranged two-dimensionally at a pitch of twice the first distance in the first direction and at a pitch of twice the second distance in the second direction.

15. The semiconductor device according to claim 13,
wherein a direction in which the plurality of bit lines extend is referred to as a second direction and a direction perpendicular to the second direction is referred to as a first direction,
wherein the plurality of bit lines are arranged two-dimensionally at a pitch of a third distance in the first direction and at a pitch of a fourth distance in the second direction, and
wherein the plurality of sense amplifiers are arranged two-dimensionally at a pitch of four times the third distance in the first direction and at a pitch of the fourth distance in the second direction.

16. The semiconductor device according to claim 15,
wherein sense amplifiers adjacent to each other in the second direction of the plurality of sense amplifiers are shifted from each other by a fifth distance in the first direction, and
wherein the fifth distance is shorter than the third distance.

17. The semiconductor device according to claim 13, further comprising:

a plurality of data lines over the plurality of memory cells; and a plurality of third transistors, wherein the plurality of sense amplifiers are each electrically connected to two of the plurality of data lines through respective two of the plurality of third transistors, and wherein the plurality of data lines are each electrically connected to sense amplifiers adjacent to each other of the plurality of sense amplifiers through respective two of the plurality of third transistors.

18. The semiconductor device according to claim 13, wherein the second transistor is an oxide semiconductor transistor.

19. The semiconductor device according to claim 13, wherein the plurality of first transistors are silicon transistors.

20. The semiconductor device according to claim 13, wherein a number of memory cells connected to each of the plurality of bit lines is 3 to 32.

21. The semiconductor device according to claim 13, wherein capacitance of the capacitor is 0.1 fF to 10 fF.

22. An electronic device comprising:
the semiconductor device according to claim 13; and
a printed wiring board.

23. The semiconductor device according to claim 13, further comprising a substrate on which are formed the plurality of sense amplifiers and the plurality of memory cells, wherein one of the plurality of bit lines extends in a direction generally parallel to a top surface of the substrate, and wherein one of the plurality of sense amplifiers and the one of the four bit lines overlap, and wherein the one of the plurality of bit lines and one of the plurality of memory cells overlap.

24. A memory device comprising:
a sense amplifier;
a first transistor;
a second transistor;
a third transistor;
a fourth transistor;
a first insulating film over the sense amplifier;
a first bit line over the first insulating film;
a second bit line over the first insulating film;
a third bit line over the first insulating film;
a fourth bit line over the first insulating film;
a second insulating film over each of the first bit line, the second bit line, the third bit line and the fourth bit line; and
a memory cell including a fifth transistor and a capacitor over the second insulating film, wherein the first bit line, the second bit line, the third bit line, and the fourth bit line are arranged in a first layer in two rows and two columns, wherein the first bit line is electrically connected to the sense amplifier through the first transistor, wherein the second bit line is electrically connected to the sense amplifier through the second transistor, wherein the third bit line is electrically connected to the sense amplifier through the third transistor, and wherein the fourth bit line is electrically connected to the sense amplifier through the fourth transistor.

25. The memory device according to claim 24, the first bit line, the second bit line, the third bit line, and the fourth bit line extend in one direction.

26. A semiconductor device comprising a plurality of memory devices according to claim 24, wherein the plurality of memory devices are arranged at a pitch of a width of the first bit line or more.

27. The memory device according to claim 24, wherein the memory device further comprises a plurality of sense amplifiers including the sense amplifier, and wherein the plurality of sense amplifiers are arranged at a pitch of a length of the first bit line or more.

28. The memory device according to claim 24, wherein the memory device further includes:
a first data line and a second data line over the memory cell; and
a sixth transistor and a seventh transistor, wherein the first data line is electrically connected to the sense amplifier through the sixth transistor, and wherein the second data line is electrically connected to the sense amplifier through the seventh transistor.

29. The memory device according to claim 24, wherein the fifth transistor is an oxide semiconductor transistor.

30. The memory device according to claim 24, wherein each of the first transistor, the second transistor, the third transistor, and the fourth transistor is a silicon transistor.

31. The memory device according to claim 24, wherein the memory device further comprises a plurality of memory cells including the memory cell, and wherein a total number of the plurality of memory cells connected to the first bit line, the second bit line, the third bit line, and the fourth bit line is 3 to 32.

32. The memory device according to claim 24, wherein capacitance of the capacitor is 0.1 fF to 10 fF.

33. An electronic device comprising:
the memory device according to claim 24; and
a printed wiring board.

34. The memory device according to claim 24, further comprising a substrate on which are formed the sense amplifier and the memory cell, wherein the first bit line extends in a direction generally parallel to a top surface of the substrate, and wherein the sense amplifier and the first bit line overlap, and wherein the first bit line and the memory cell overlap.

* * * * *